(12) United States Patent
Alvarez Icaza Rivera et al.

(10) Patent No.: US 7,834,527 B2
(45) Date of Patent: Nov. 16, 2010

(54) DIELECTRIC ELASTOMER FIBER TRANSDUCERS

(75) Inventors: Rodrigo Alvarez Icaza Rivera, Stanford, CA (US); Juan Manuel Alvarez Sanches, Naucalpan (MX); Kevin Chalgren Galloway, Aldan, PA (US); Howard Scott Katzenberg, New York, NY (US); Rahul Kothari, Washington, DC (US); John Vernon Arthur, Mountain View, CA (US)

(73) Assignee: SmartMotion Technologies, Inc., Philadelphia, PA (US)

(*) Notice: Subject to any disclaimer, the term of this patent is extended or adjusted under 35 U.S.C. 154(b) by 0 days.

(21) Appl. No.: 11/919,919

(22) PCT Filed: May 5, 2006

(86) PCT No.: PCT/US2006/017309

§ 371 (c)(1),
(2), (4) Date: Dec. 12, 2008

(87) PCT Pub. No.: WO2006/121818

PCT Pub. Date: Nov. 16, 2006

(65) Prior Publication Data

US 2009/0085444 A1    Apr. 2, 2009

Related U.S. Application Data

(60) Provisional application No. 60/677,632, filed on May 5, 2005, provisional application No. 60/789,418, filed on Apr. 4, 2006.

(51) Int. Cl.
*H01L 41/04* (2006.01)
*H01L 41/047* (2006.01)
(52) U.S. Cl. ...................... 310/800; 310/363

(58) Field of Classification Search ............ 310/344, 310/363, 800
See application file for complete search history.

(56) References Cited

U.S. PATENT DOCUMENTS

| 5,177,187 | A * | 1/1993 | MacDiarmid et al. ....... 528/422 |
|---|---|---|---|
| 6,376,971 | B1 | 4/2002 | Pelrine |
| 6,379,393 | B1 | 4/2002 | Mavroidis |
| 6,543,110 | B1 | 4/2003 | Pelrine |
| 6,545,384 | B1 | 4/2003 | Pelrine |
| 6,583,533 | B2 | 6/2003 | Pelrine |
| 6,586,859 | B2 | 7/2003 | Kornbluh |

(Continued)

FOREIGN PATENT DOCUMENTS

WO    WO 01/06575 A1    1/2001

(Continued)

OTHER PUBLICATIONS

Arora, "Masters Thesis: Development of Dielectric Elastomer Based Prototype Fiber Actuators", North Carolina State University, Jul. 2005, 1-110.

(Continued)

*Primary Examiner*—Thomas M Dougherty
(74) *Attorney, Agent, or Firm*—Woodcock Washburn, LLP

(57) ABSTRACT

Disclosed are electroactive polymer fibers, processes of preparing electroactive polymer fibers, and devices containing electroactive polymer fibers. Devices can be used as actuators and sensors, generators and transducers. Applications include inter alia artificial muscles, prosthetics and robotics.

20 Claims, 17 Drawing Sheets

U.S. PATENT DOCUMENTS

| | | | |
|---|---|---|---|
| 6,628,040 | B2 | 9/2003 | Pelrine |
| 6,664,718 | B2 | 12/2003 | Pelrine |
| 6,707,236 | B2 | 3/2004 | Pelrine |
| 6,768,246 | B2 | 7/2004 | Pelrine |
| 6,781,284 | B1 | 8/2004 | Pelrine |
| 6,806,621 | B2 | 10/2004 | Heim |
| 6,809,462 | B2 | 10/2004 | Pelrine |
| 6,812,624 | B1 | 11/2004 | Pei |
| 6,876,135 | B2 | 4/2005 | Pelrine |
| 6,882,086 | B2 | 4/2005 | Kornbluh |
| 6,891,317 | B2 | 5/2005 | Pei |
| 6,911,764 | B2 | 6/2005 | Pelrine |
| 6,940,211 | B2 | 9/2005 | Pelrine |
| 6,969,365 | B2 | 11/2005 | Scorvo |
| 6,969,941 | B1 | 11/2005 | Kapps |
| 7,034,432 | B1 | 4/2006 | Pelrine |
| 7,038,357 | B2 | 5/2006 | Goldberg |
| 7,117,807 | B2 * | 10/2006 | Bohn et al. .................. 114/222 |
| 2001/0026165 | A1 | 10/2001 | Pelrine |
| 2001/0032663 | A1 | 10/2001 | Pelrine |
| 2001/0035723 | A1 | 11/2001 | Pelrine |
| 2001/0036790 | A1 | 11/2001 | Kornbluh |
| 2002/0008445 | A1 | 1/2002 | Pelrine |
| 2002/0050769 | A1 | 5/2002 | Pelrine |
| 2002/0130673 | A1 | 9/2002 | Pelrine |
| 2002/0175594 | A1 | 11/2002 | Kornbluh |
| 2002/0175598 | A1 | 11/2002 | Heim |
| 2002/0185937 | A1 | 12/2002 | Heim |
| 2003/0006669 | A1 | 1/2003 | Pei |
| 2003/0067245 | A1 | 4/2003 | Pelrine |
| 2003/0141787 | A1 | 7/2003 | Pelrine |
| 2003/0212356 | A1 | 11/2003 | Scorvo |
| 2003/0214199 | A1 | 11/2003 | Heim |
| 2004/0008853 | A1 | 1/2004 | Pelrine |
| 2004/0124738 | A1 | 7/2004 | Pelrine |
| 2004/0217671 | A1 | 11/2004 | Rosenthal |
| 2004/0232807 | A1 | 11/2004 | Pelrine |
| 2004/0263028 | A1 | 12/2004 | Pei |
| 2005/0040733 | A1 | 2/2005 | Goldenberg |
| 2005/0157893 | A1 | 7/2005 | Pelrine |
| 2005/0253482 | A1 | 11/2005 | Kapps |
| 2007/0276461 | A1 * | 11/2007 | Andreas et al. ............ 623/1.11 |
| 2009/0085444 | A1 * | 4/2009 | Alvarez Icaza Rivera et al. 310/365 |

FOREIGN PATENT DOCUMENTS

| | | |
|---|---|---|
| WO | WO 01/06579 A2 | 1/2001 |
| WO | WO 01/58973 A2 | 8/2001 |
| WO | WO 01/59852 A2 | 8/2001 |
| WO | WO 01/63738 A2 | 8/2001 |
| WO | WO 01/65615 A2 | 9/2001 |
| WO | WO 01/80284 A2 | 10/2001 |
| WO | WO 02/071592 A2 | 9/2002 |
| WO | WO 03/081762 A1 | 10/2003 |
| WO | WO 03/088865 A2 | 10/2003 |
| WO | WO 03/107523 A1 | 12/2003 |
| WO | WO 2004/079832 A2 | 9/2004 |
| WO | WO 2005/079187 A2 | 9/2005 |
| WO | WO 2005/081676 A2 | 9/2005 |

OTHER PUBLICATIONS

Ashley, "Artificial Muscles", Scientific American, Oct. 2003, 1-8.

Bao et al., "Wirelessly controllable inflated electroactive polymer (EAP) reflectors", Proceedings of the 2005 SPIE Smart Structures Conference, San Diego, CA, Mar. 7-10, 2005, Paper #5759-52, 8 pages.

Bar-Cohen, "Biologically Inspired Intelligent Robots Using Artificial Muscles", Keynote Presentation at the 2003 ICMENS, Banff, Alberta, Canada, Jul. 2003, 7 pages.

Bar-Cohen, "Biomimetics: mimicking and inspired-by biology", Proceedings of the 2005 SPIE Smart Structures Conference, San Diego, CA, Mar. 2005, Paper #5759-02.

Bar-Cohen, "Characterization of the Electromechanical Properties of EAP materials", SPIE Smart Structures 2001, EAPAD Conference, Mar. 2001, Paper #4329-43.

Bar-Cohen, "Electroactive Polymer (EAP) Actuators as Artificial Muscles - Reality and Potential Challenges", SPIE Press, Mar. 2001, PM98.

Bar-Cohen, "Electro-Active Polymer (EAP) actuators for planetary applications", SPIE Smart Structures, Newport Beach, CA, 1999, Paper #3669-05.

Bar-Cohen, "Electroactive Polymers as Artificial Muscles - Reality and Challenges", $42^{nd}$ AIAA Structures, Seattle, WA, Apr. 2001, Paper #2001-1492, 10 pages.

Bar-Cohen, "Electroactive Polymers as Artificial Muscles Changing Robotics Paradigms", NSMMS Symposium, San Diego, CA, Mar. 2000, 1-4.

Bar-Cohen, "Electro-active polymers: current capabilities and challenges", Proceedings of the SPIE Smart Structures and Materials Symposium, EAPAD Conference, San Diego, CA, Mar. 2002, Paper #4695-02.

Bar-Cohen, "Flexible low-mass devices and mechanisms actuated by Electroactive Polymers", SPIE Smart Structures, Newport Beach, CA, Mar. 1999, Paper #3669-38.

Bar-Cohen, "Nanotechnology Using Electroactive Polymers as Artificial Muscles", International Newsletter on Microsystems and MEMS, Germany, Jun. 2001, 3(01), 45-46.

Bar-Cohen, "Transition of EAP material from novelty to practical applications - are we there yet?", SPIE Smart Structures 2001, EAPAD Conf., Newport Beach, CA, Mar. 2000, Paper #4329-02.

Bar-Cohen, "Virtual reality robotic telesurgery simulations using MEMICA haptic system", SPIE Smart Structures 2001, EAPAD Conference, Mar. 2001, Paper #4329-47.

Baughman, "Playing Nature's Game with Artificial Muscles", Science, Apr. 2005, 308, 63-65.

Brock, "Review of Artificial Muscle based on Contractile Polymers", MIT Artificial Intelligence Labs. Nov. 1991, A.I. Memo No. 1330.

Carpi et al., "Dielectric elastomer cylindrical actuators: electromechanical modeling and experimental evaluation", Materials Science and Engineering, Jun. 2004, C24, 555-562.

Carpi et al., "Theoretical Description and Fabrication Of A New Dielectric Elastomer Actuator Showing Linear Contractions", Proc. of Actuator, Jun. 16, 2004, 344-347.

Ghosh et al., "Development of Layered Functional Fiber-based Microtubes" NTC Project: F02-NS05, Jun. 2003, 1 page.

Ghosh et al., "Development of Layered Functional Fiber-based Microtubes" NTC Project: F02-N505, Jun. 2004, 2 pages.

Ghosh et al., "Development of Layered Functional Fiber-based Micro-tubes" NTC Project: F02-NS05, Nov. 2004, 1-10.

Ghosh et al., "Development of Layered Functional Fiber-based Micro-tubes" NTC Project: F02-NS05, Nov. 2005, 1-9.

Hanson et al., "Androids: application of EAP as artificial muscles to entertainment industry", SPIE Smart Structures 2001, EAPAD Conf. ibid, Mar. 2001, Paper #4329-74.

Jayasuriya et al., "Crystal-Structure Dependence of Electroactive Properties in Differently Prepared Poly(vinylidene fluoride/hexafluoropropylene) Copolymer Films", J. Polym. Sci. Part B Polymer Physics, Nov. 15, 2001, 39(22), 2793.

Kofod et al., "Actuation Response of Polyacrylate Dielectric Elastomers", J. of Intelligent Material Systems and Structures, (no month available) 2003, 14, 787-793.

Kornbluh et al., "Elastomeric Dielectric Artificial Muscle Actuators for Small Robots", Proceedings of the Third IASTED International Conference on Robotics and Manufacturing, Cancun Mexico, Jun. 1995.

Kornbluh et al., "Electrostrictive Polymer Artificial Muscle Actuators for Biologically-Inspired Robots", $1^{st}$ NASA/JPL Workshop on Biomorphic Explores, Aug. 1998, 1-20.

Kornbluh et al., "Ultrahigh Strain Response of Field-actuated elastomeric polymers", Proceedings of SPIE, (no month available) 2000, 3987, 51-64.

Lipscomb, "The Melt Hollow Fiber Spinning Process: Steady-state Behavior Sensitivity and Stability", Polymers and Advanced Technologies, (no month available) 1994, 5, 745-758.

Liu et al. "Scaling Laws of Microactuators and Potential Applications of Electroactive Polymers in MEMS", Proceedings of SPIE's 6th Annual International Symposium on Smart Structures and Materials, Mar. 1999, Paper No. 3669-33.

Ma et al., "An experimental investigation of electromechanical response in a dielectric acrylic elastomer", Appl. Phys. A, May 2004, 78, 1201-1204.

Pei et al., "Multifunctional electroelastomer roll actuators and their application for biomimetic walking robots", Proceedings of SPIE: Smart Structures and Materials 2003: Electroactive Polymer Acuators and Devices (EAPAD), Mar. 2-6, 2003, 5051.

Pei et al., "Recent progress on electroelastomer artificial muscles and their application for biomimetic robots", Proceedings of SPIE: Smart Structures and Materials 2004: Electroactive Polymer Actuators and Devices (EAPAD), Mar. 15, 2004, 5385.

Pelrine et al., "Dielectric Elastomer Artificial Muscle Actuators: Toward Biomimetic Motion", Smart Structures and Materials 2002: Electroactive Polymer Actuators and Devices (EAPAD), Mar. 17, 2002, Proceedings of SPIE, 4695, 126-137.

Pelrine et al., "Dielectric Elastomers: Generator Mode Fundamentals and Applications", Proceedings of SPIE: Smart Structures and Materials 2001: Electroactive Polymer Actuators and Devices, (no month available) 2001, 4329, 148-156.

Pelrine et al., "Electrostriciton of Polymer Films for Microactuators", IEEE, Jan. 1997, 238-243.

Pelrine et al., "Electrostriction of Polymer Dielectrics with Compliant Electrodes as a Means of Actuation", Sensors and Actuators A: Physical, Jan. 1998, 64, 77-85.

Pelrine et al., "High-Speed Electrically Actuated Elastomers with Strain Greater Than 100%", Science, Feb. 2003, 287, 836-839.

Ramaratnam, "Feasibility study of actuators and sensors using electro-active polymers reinforced with carbon nanotubes", Proceedings of SPIE: Smart Structures and Materials 2004: Electroactive Polymer Actuators and Devices, Mar. 2004, 5385.

Su, "High Performance Electroactive Polymers" Advanced Materials and Processing Branch NASA-Langley Research Center, NASA Advanced Materials Symposium (NAMS), 2002, Cleveland, OH, May 29-21, 2002, 1-27.

Taya, "Bio-inspired Design of Intelligent Materials", Smart Structures and Materials 2003, Electroactive Polymer Actuators and Devices (EAPAD), Proceedings of SPIE, Aug. 2003, 5051, 54-65.

Vinogradov et al., "State-of-the-Art Developments in the Field of Electroactive Polymers", Mater. Res. Soc. Symp. Proc., (no month available) 2006, 889, 2-7.

Wingert et al., "Hyper-redundant robot manipulators actuated by optimized binary dielectric polymers", Proc. Of SPIE, Mar. 2002, 9 pages.

Zhang et al., "An All-Organic Composite Actuator Material with a High Dielectric Constant", Nature, Sep. 19, 2002, 419, 284-287.

Zhenyi et al., "High Field Electrostrictive Response of Polymers", Journal of Polymer Science: Part B: Polymer Physics, Dec. 1994, 32, 2721-2731.

Bar-Cohen, "Low Mass Muscle Actuators (LoMMAs)" TeleRobotic Intercenter Working Group (TRIWG), JPL Quarterly Meeting, Pasadena, CA, Oct. 17, 1996, 13 pages.

Bauer et al., "Ferroelectrets: Soft Electroactive Foams for Transducers", Physics Today, Feb. 2004, 57(2), 37-43.

Casalini & Roland, "Electromechanical properties of poly (vinylidene fluoride-trifluoroethylene) networks", Journal of Polymer Science Part B: Polymer Physics, 40(18), Sep. 15, 2002, 1975-1984.

De Rovere et al., "The Influence of Processing Parameters on the Properties of Melt-Spun Polypropylene Hollow Fibers", J. of Applied Polymer Science, Feb. 22, 2002, 83(8), 1759-1772.

http://eap.jpi.nasa.gov/, "WorldWide Electroactive Polymer Actuators* Webhub", WW-EAP and Artificial Muscles, Accessed Apr. 27, 2010, 7 pages.

Kornbluh et al., "Electrostrictive Polymer Artificial Muscle Actuators", Proceedings of the 1998 IEEE International Conference on Robotics and Automation, Leuven, Belgium, May 16-20, 1998, 2147-2154.

Pelrine et al., "High-strain actuator materials based on dielectric elastomers", Advanced Materials, Aug. 2000, 12(16), 1223-1225.

Su et al., "Preparation and characterization of electrostrictive polyurethane films with conductive polymer electrodes", Polymers for Advanced Technologies, 9(6), Jun. 1998, 317-321.

Syang-Peng, "Formation of Hollow Fibers in the Melt-Spinning Process", Journal of Applied Polymer Science, Dec. 13, 2001, 82(12), 2896-2902.

* cited by examiner

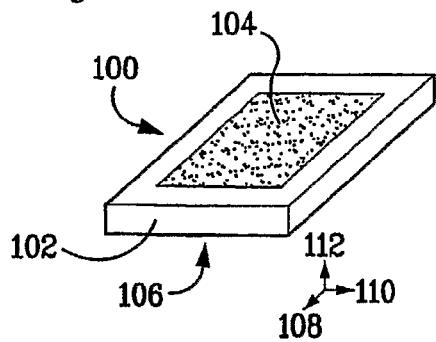
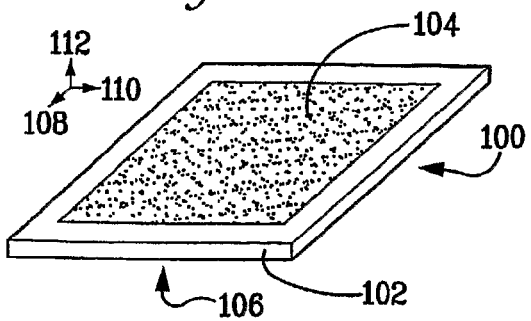
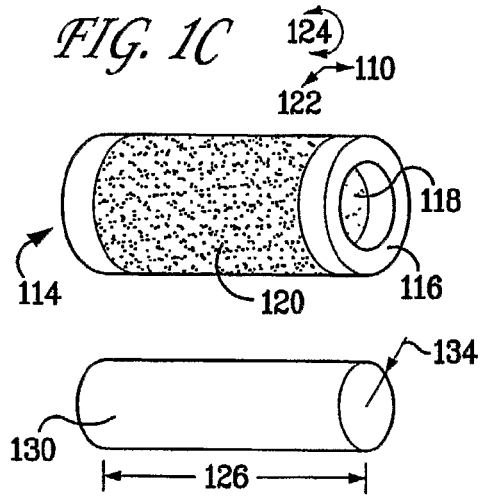
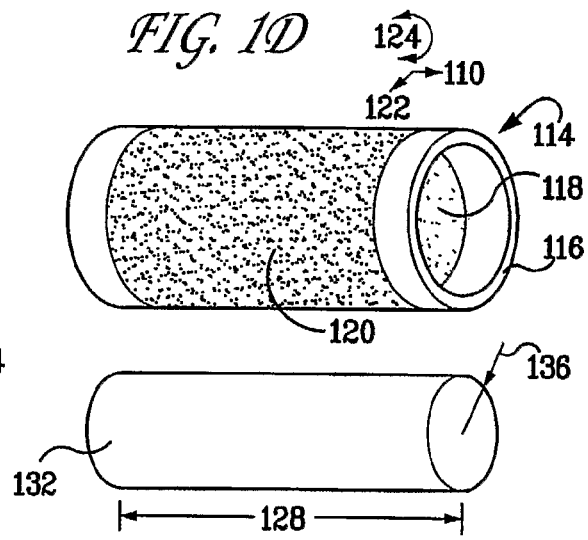
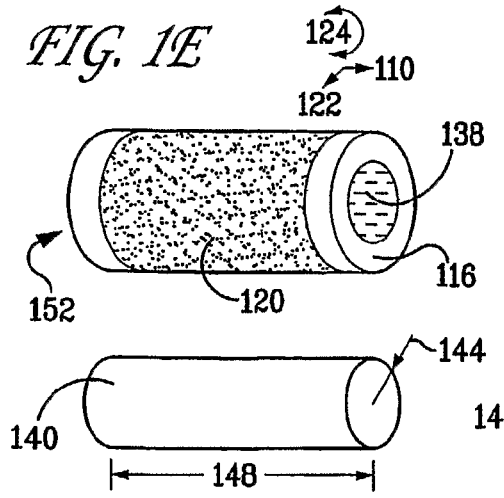
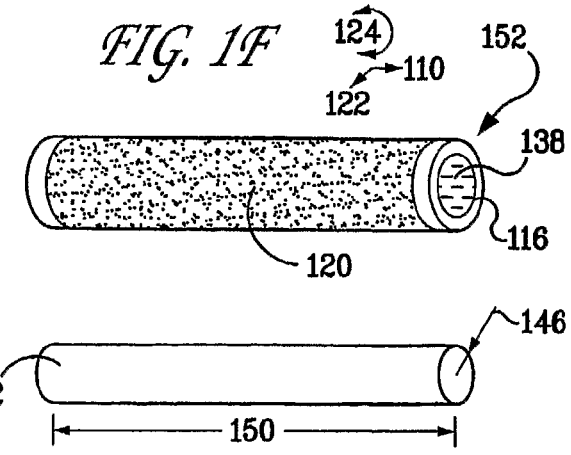

FIG. 1G

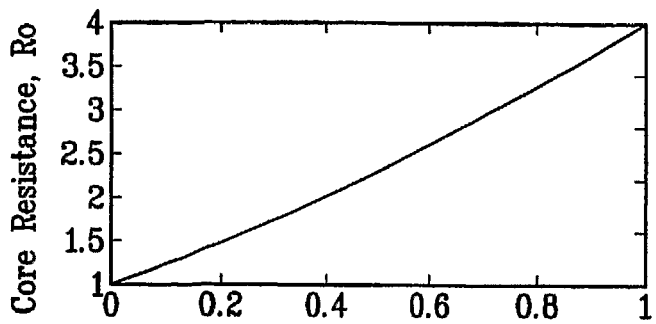

$$R_c = R_0(\epsilon+1)^2$$

$$R_0 = \frac{\rho_c L_0}{\pi a_0^2}$$

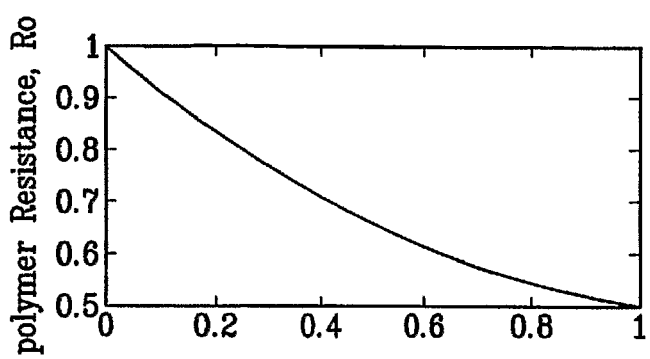

$$R_p = \frac{R_0}{\epsilon+1}$$

$$R_0 = \frac{\rho_p \ln\frac{b_0}{a_0}}{2\pi}$$

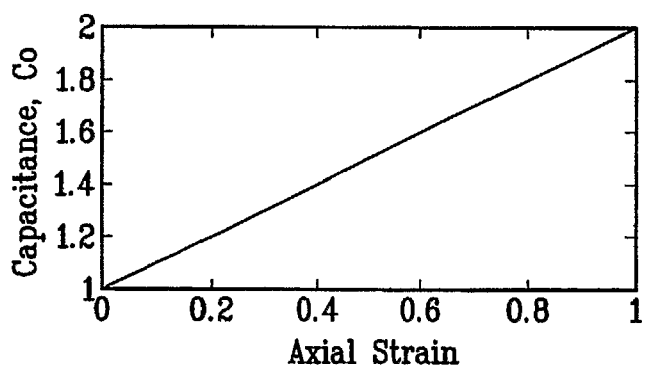

$$C = C_0(\epsilon+1)$$

$$C_0 = \frac{2\pi\varepsilon L_0}{\ln\frac{b_0}{a_0}}$$

Axial Strain

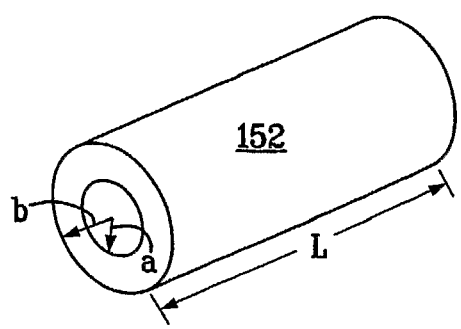

- $R_c$ = Core Resistance
- $R_p$ = Polymer Resistance
- $\rho_c$ = Core Resistivity
- $\rho_p$ = Polymer Resistivity
- $\epsilon$ = Strain = $\frac{L-L_0}{L_0}$
- $\varepsilon$ = Dielectric Constant of Polymer x $\varepsilon_0$
- $\varepsilon_0$ = Permitivity of Free Space
- L = Length
- $L_0$ = Initial Length
- $a_0$ = Initial Inner Radius
- $b_0$ = Initial Outer Radius FIG. 1H
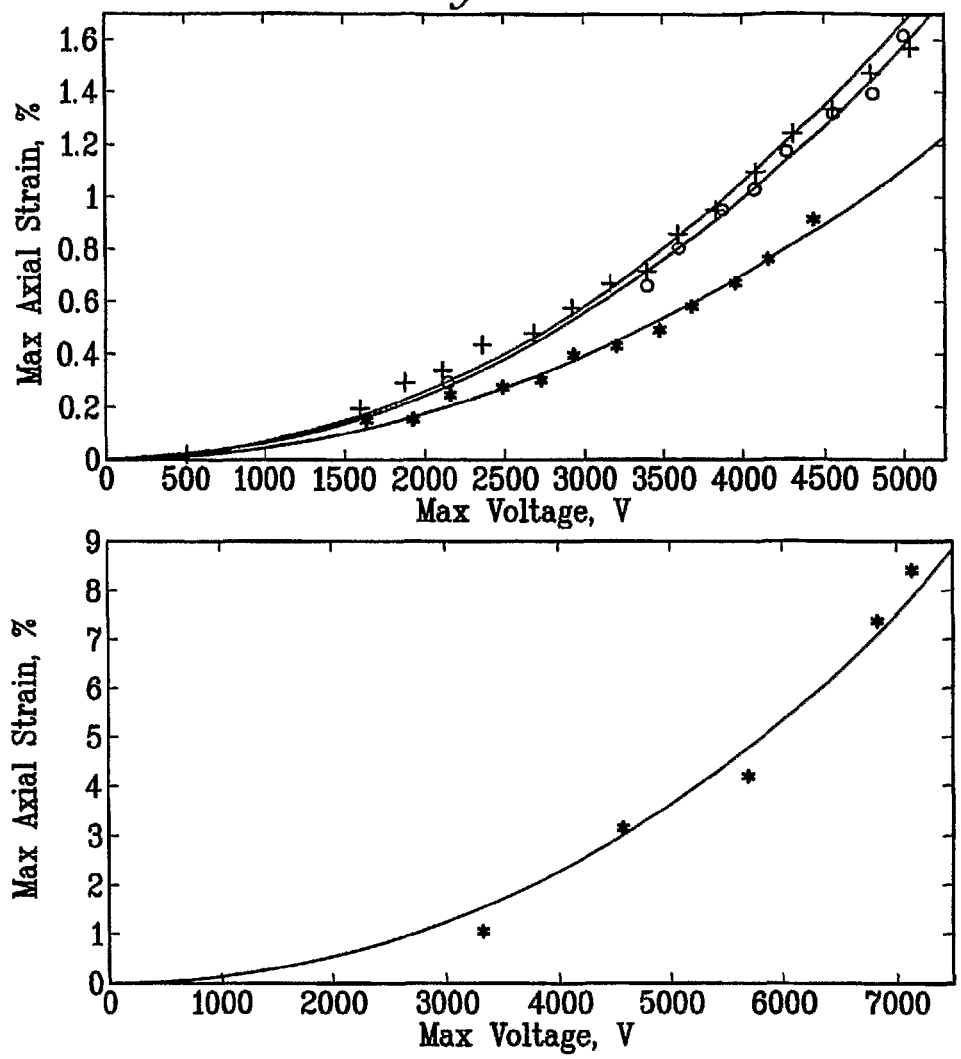
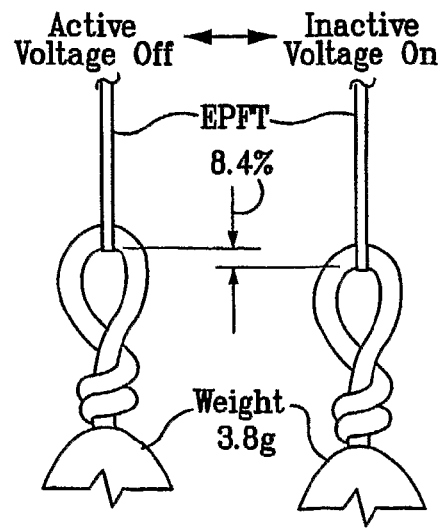

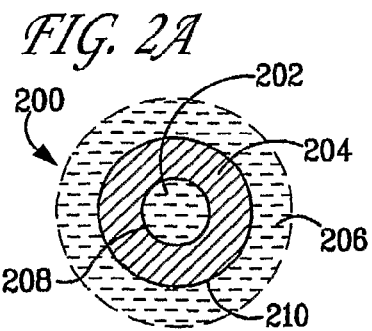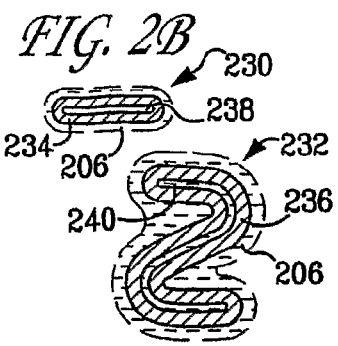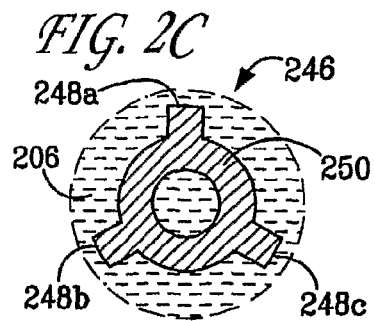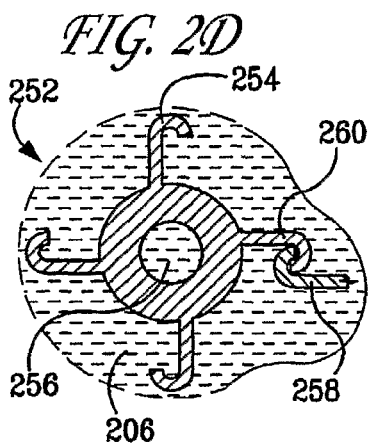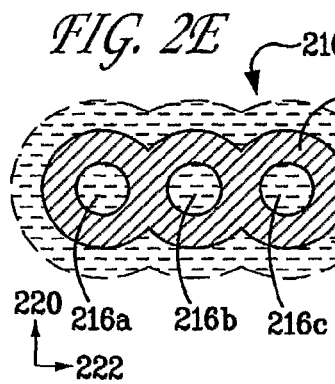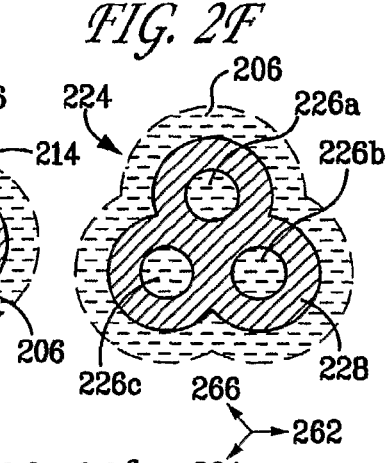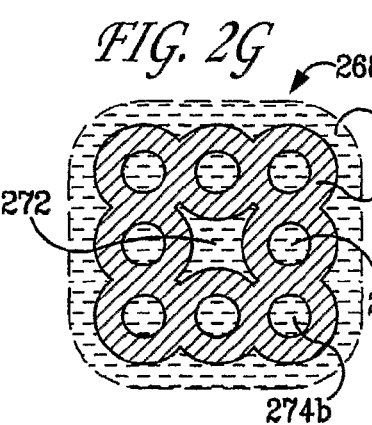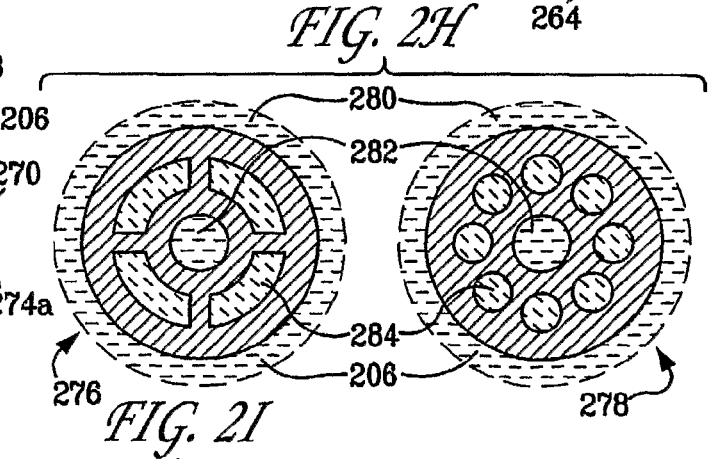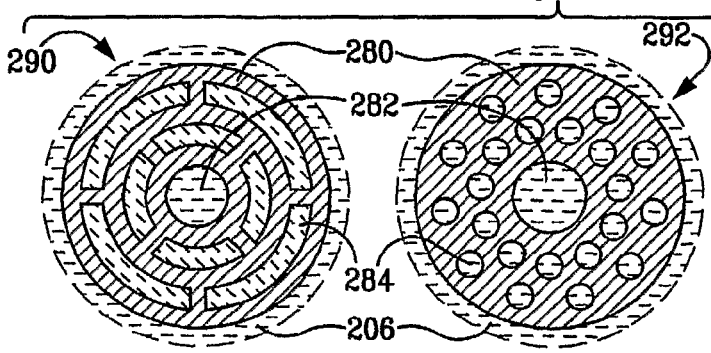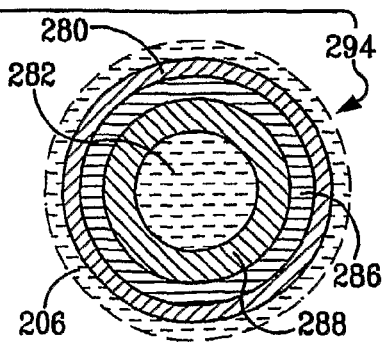

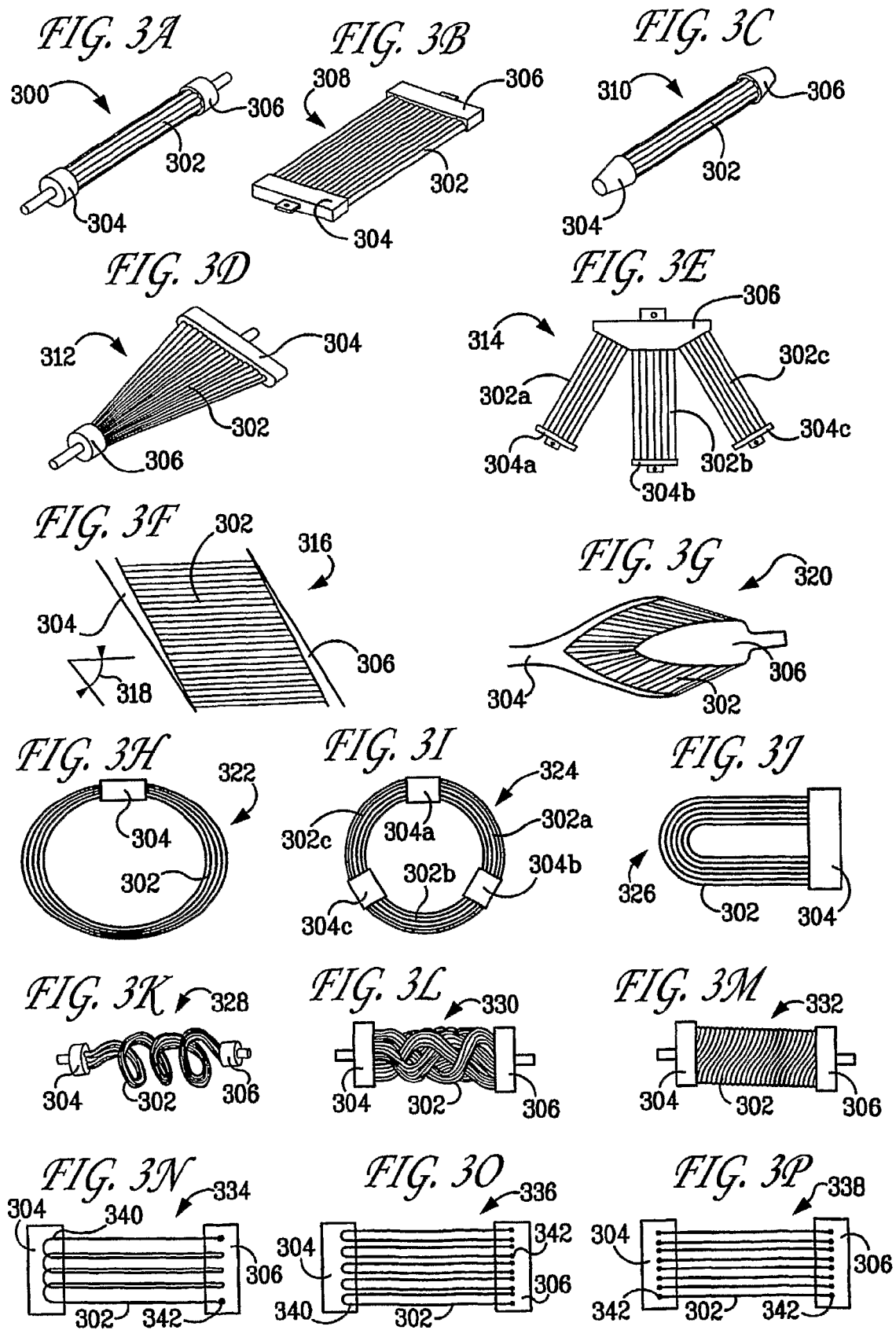

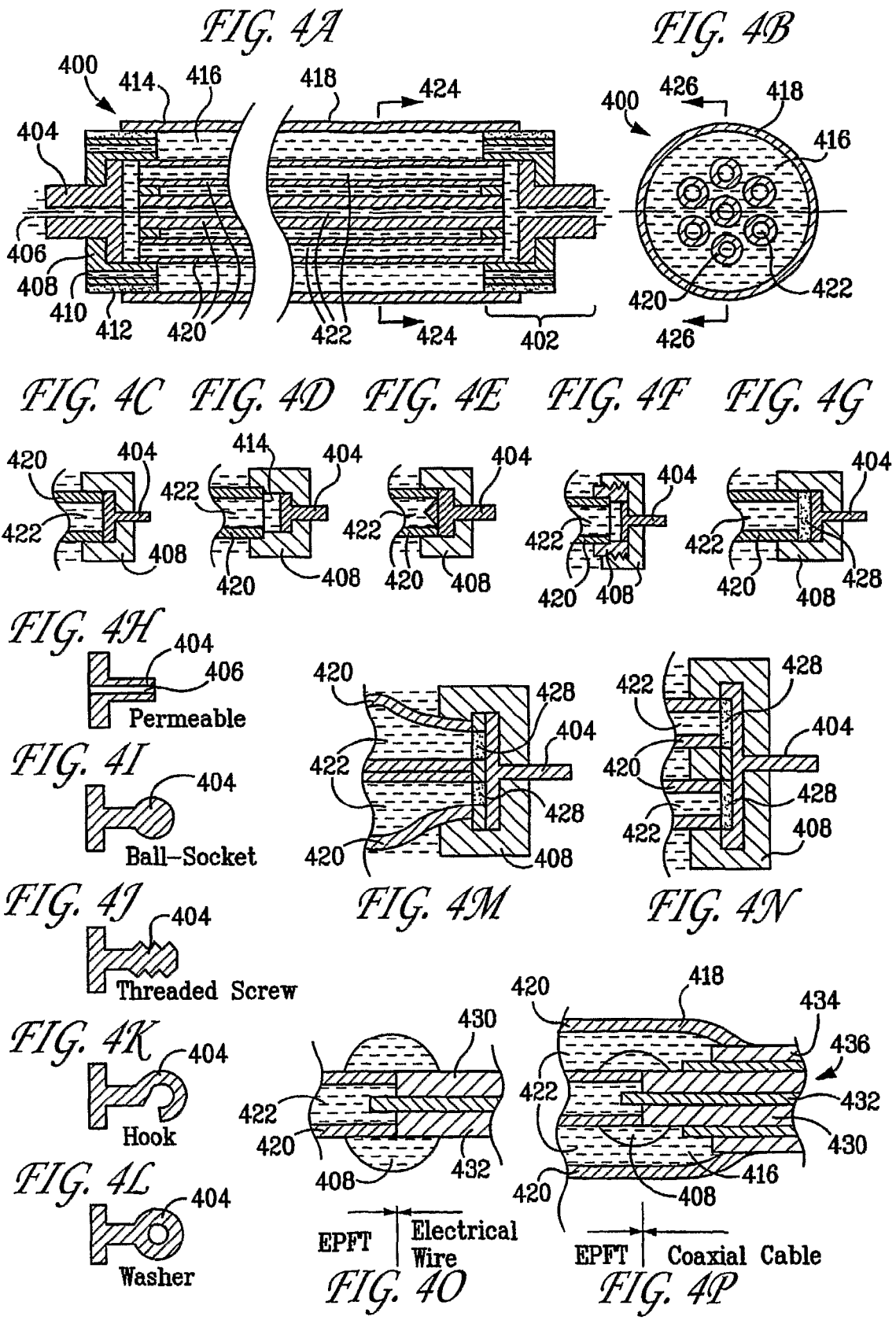

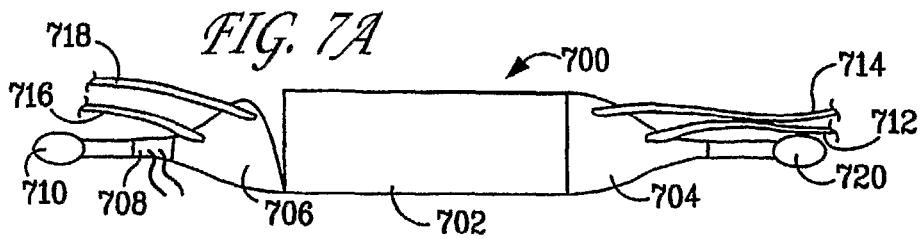
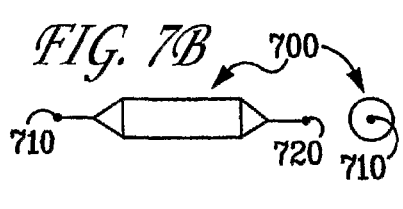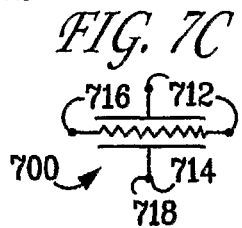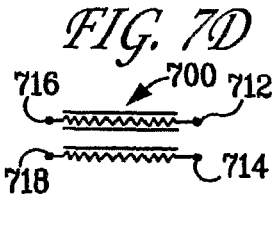
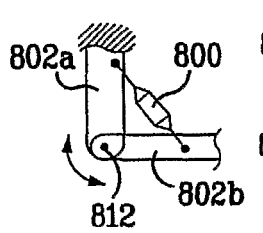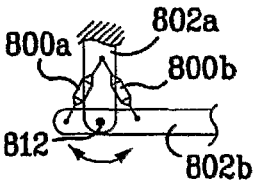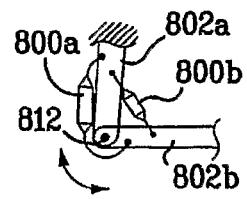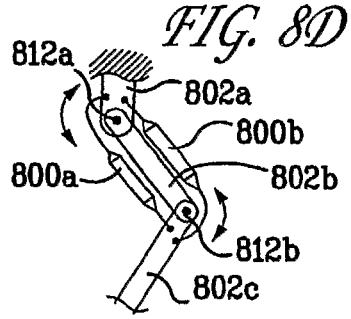
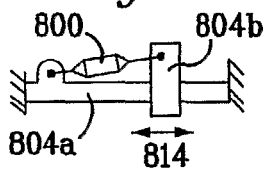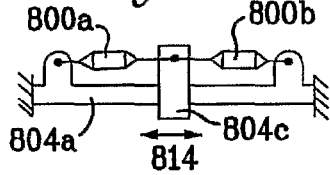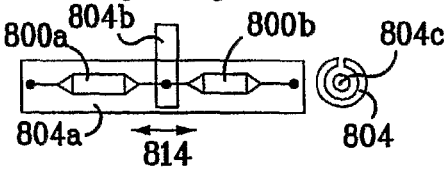
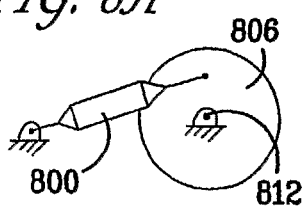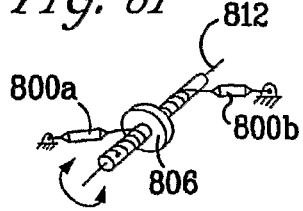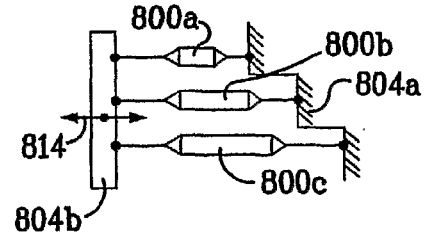
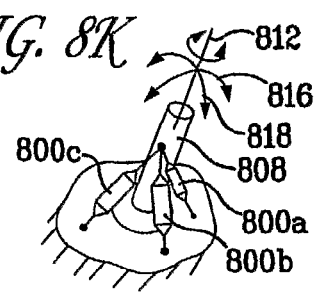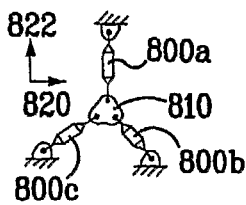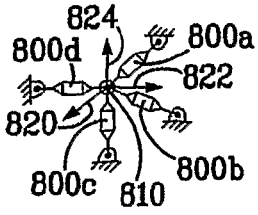

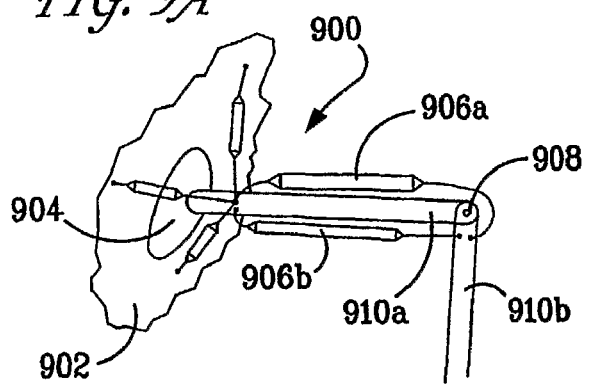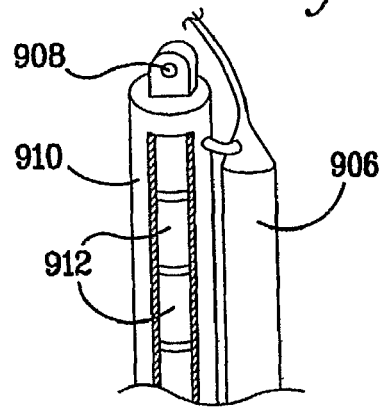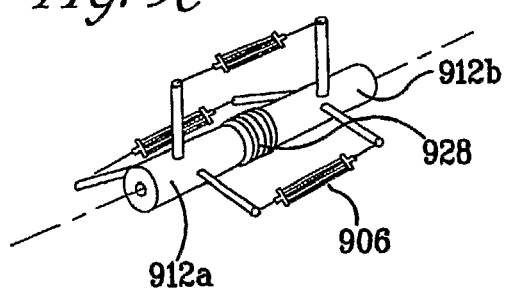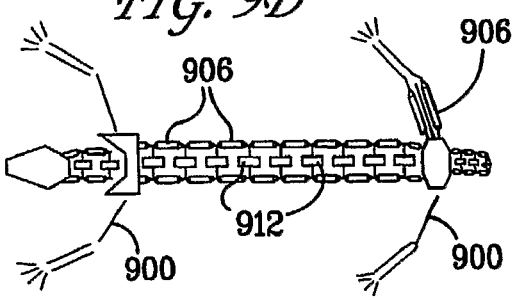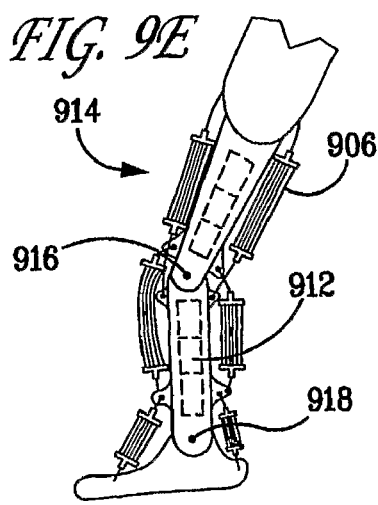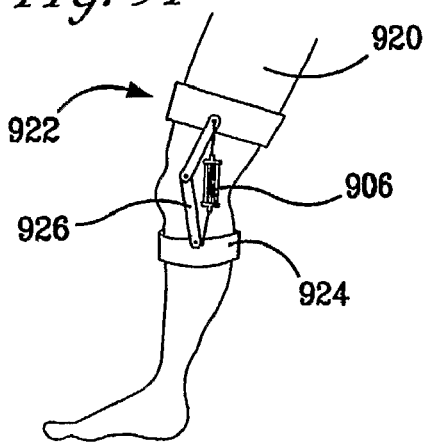

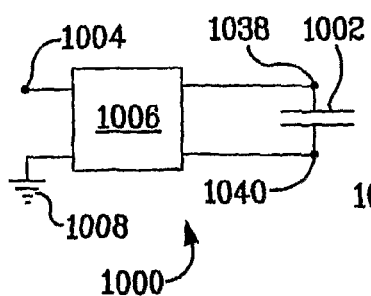
FIG. 10A
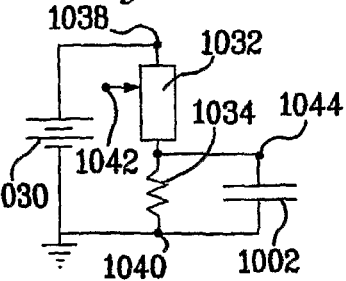
FIG. 10B
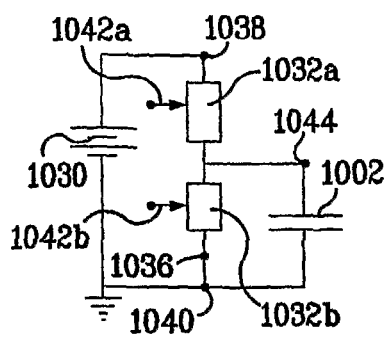
FIG. 10C
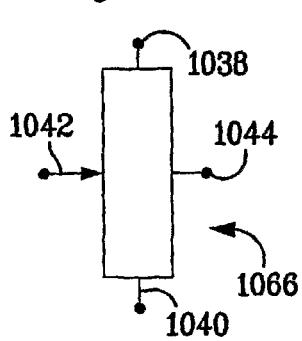
FIG. 10D
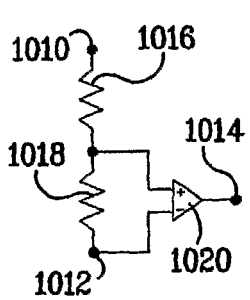
FIG. 10E
FIG. 10F
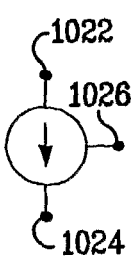
FIG. 10G
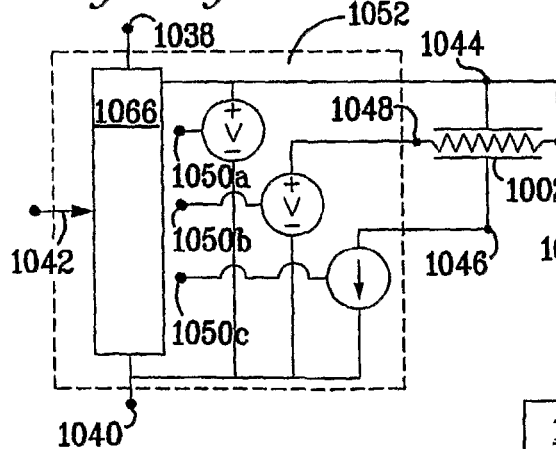
FIG. 10H
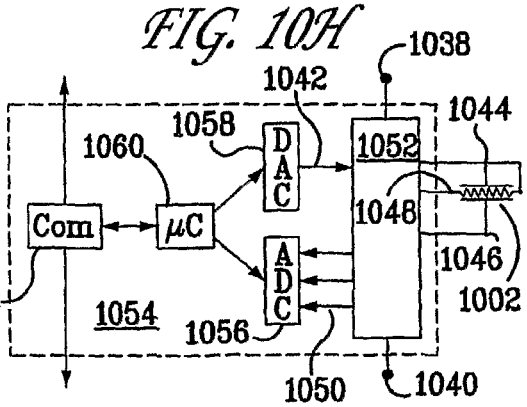
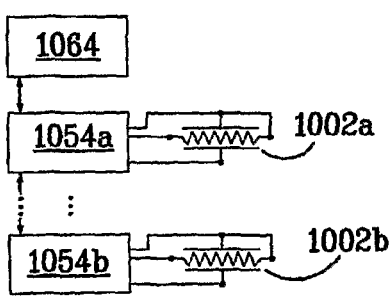
FIG. 10I

DIELECTRIC ELASTOMER FIBER TRANSDUCERS

CROSS-REFERENCE TO RELATED APPLICATIONS

This application claims the benefit of U.S. Provisional Application Ser. No. 60/677,632, filed May 5, 2005. This application also claims the benefit of U.S. Provisional Application Ser. No. 60/789,418, filed Apr. 4, 2006. The entirety of each application is incorporated by reference herein.

FIELD OF THE INVENTION

This disclosed invention is in the field of electrical actuators, sensors, generators and transducers. The disclosed invention is also in the field of electroactive polymers and artificial muscles. The disclosed invention is also in the field of robotics and prosthetic devices. The disclosed invention is also in the field of circuits and electronics. The disclosed invention is also in the field of materials.

BACKGROUND OF THE INVENTION

Actuators, such as motors or muscles, produce forces that are used to move objects. Because they are essential in creating motion for almost every product or device that moves, actuators are ubiquitous and are currently dominated by the traditional electromagnetic motor, a device that has not benefited from a revolutionary innovation within the last 100 years. Though motors and other current actuation technologies are sufficient for some motion needs, they have significant limitations for niche applications such as prosthetics and robotics, which may require a more compact and efficient source of motion production. Specifically, problems with previous actuation methods for such applications include high costs, heavy weight and bulkiness, inefficient battery use, and noisiness.

The quest for efficient, powerful and lightweight actuation technologies has recently focused on the use of dielectric elastomers for creating so-called "artificial muscles" ["Artificial Muscles", *Scientific American*, October 2003]. Although these materials are capable of matching the metrics of biological muscle (Pelrine et al. 2000), previous fabrication techniques and polymer configurations require extremely high voltage and the use of external structures to harness the mechanical power output. Accordingly, there is a continuing need to provide improved actuators that have improved stress, strain and speed characteristics. In addition, there is a need to provide novel actuator configurations that allows direct use of mechanical power output (force/displacement) and that reduces actuation voltage.

SUMMARY OF THE INVENTION

In some aspects, the present invention provides electroactive polymer fibers, comprising: an incompressibly compliant inner electrode; an electroactive polymer disposed exterior to the incompressibly compliant inner electrode; and an outer compliant electrode disposed exterior to the electroactive polymer, wherein the incompressibly compliant inner electrode is fluidically sealed within the electroactive polymer fiber.

In some aspects, the present invention provides methods of preparing an electroactive polymer fiber comprising; forming an electroactive polymer fiber comprising an electroactive polymer and an inner region disposed within the electroactive polymer; and filling the inner region with an incompressibly compliant electrically conductive material, the incompressibly compliant electrically conductive material filling the inner region.

The present invention also provides electroactive polymer fiber transducers, comprising: at least one electroactive polymer fiber, comprising: an incompressibly compliant inner electrode; an electroactive polymer disposed exterior to the incompressibly compliant inner electrode; and an outer compliant electrode disposed exterior to the electroactive polymer, wherein the incompressibly compliant inner electrode is fluidically sealed within the electroactive polymer fiber; and a voltage source, a charging source, or both, connected to the incompressibly compliant inner electrode and the outer compliant electrode.

In other aspects, the present invention provides methods of preparing an electroactive polymer fiber transducer, comprising; extruding an electroactive polymer fiber comprising an electroactive polymer and an inner region disposed within the electroactive polymer; filling the inner region with an incompressibly compliant electrically conductive material, the incompressibly compliant electrically conductive material filling the inner region; applying a compliant electrically conductive material to the exterior surface of the electroactive polymer fiber to provide an outer compliant electrode disposed exterior to the electroactive polymer.

In certain aspects, the present invention provides electroactive polymer fiber sensors, comprising: an electroactive polymer fiber, comprising: an incompressibly compliant inner electrode; an electroactive polymer disposed exterior to the incompressibly compliant inner electrode; and an outer compliant electrode disposed exterior to the electroactive polymer; a first fiber end cap comprising an inner electrical lead in electrical communication with the incompressibly compliant inner electrode; and a second fiber end cap disposed opposite to the first fiber end cap, the second fiber end cap capable of being in electrical communication with the incompressibly compliant inner electrode; wherein the first and second fiber end caps and the electroactive polymer are disposed to fluidically seal the incompressibly compliant inner electrode there between; whereupon changing the physical state or chemical environment of the electroactive polymer fiber gives rise to a detectable electrical signal communicated through the first and second fiber end caps.

In various aspects, the present invention provides methods of actuating an electroactive polymer fiber transducer, comprising: providing an electroactive polymer fiber transducer, comprising: at least one electroactive polymer fiber, comprising: an incompressibly compliant inner electrode; an electroactive polymer disposed exterior to the incompressibly compliant inner electrode; and an outer compliant electrode disposed exterior to the electroactive polymer, wherein the incompressibly compliant inner electrode is fluidically sealed within the electroactive polymer fiber; and a voltage source, a charge source, or both connected to the incompressibly compliant inner electrode and the outer compliant electrode; and applying a voltage to the incompressibly compliant inner electrode and the outer compliant electrode to give rise to an axial strain.

The present invention further provides prosthetic devices, comprising: an artificial limb comprising: one or more joints; two or more jointed limb segments; and one or more electroactive polymer fiber transducers comprising two or more ends mechanically coupled to the jointed limb segments, the one or more electroactive polymer fiber transducers comprising: at least one electroactive polymer fiber, comprising: an incompressibly compliant inner electrode; an electroactive polymer disposed exterior to the incompressibly compliant inner electrode; and an outer compliant electrode disposed exterior to the electroactive polymer, wherein the incompressibly compliant inner electrode is fluidically sealed within the electroactive polymer fiber; and a voltage source, a charge source, or both, connected to the incompressibly compliant inner electrode and the outer compliant electrode; whereby application of a voltage to the electroactive polymer fiber transducer gives rise to motion or tensioning of the prosthetic device.

In other aspects, the present invention provides methods of actuating an electroactive polymer fiber transducer, comprising: providing an electroactive polymer fiber transducer, comprising: at least one electroactive polymer fiber, comprising: an incompressibly compliant inner electrode; an electroactive polymer disposed exterior to the incompressibly compliant inner electrode; and an outer compliant electrode disposed exterior to the electroactive polymer, wherein the incompressibly compliant inner electrode is fluidically sealed within the electroactive polymer fiber; and a voltage source, a charge source, or both connected to the incompressibly compliant inner electrode and the outer compliant electrode; and axially elongating the electroactive polymer fiber transducer to give rise to an electric current between the incompressibly compliant inner electrode and the outer compliant electrode.

The present invention further provides electroactive fibers, comprising: an incompressibly compliant inner electrode; an electroactive elastically compliant material disposed exterior to the incompressibly compliant inner electrode; and an outer compliant electrode disposed exterior to the electroactive compliant material, wherein the incompressibly compliant inner electrode is fluidically sealed within the electroactive fiber.

In various aspects, the present invention provides system for controlling an electroactive actuator, comprising: a driver circuit comprising an input signal and an output voltage, the driver circuit comprising a DC to DC converter capable of raising a voltage level received from the input signal source to the output voltage, the output voltage being capable of actuating the electroactive transducer.

The present invention provides a variety of devices and components that can be powered using one or more of the electroactive fiber transducers of provided herein. For example, there are provided jointed transducers comprising two links united by a joint and transduced by one or more electroactive fiber transducers. Other devices include actuated prosthetic limbs, orthotic devices for amputees or physically disabled people, as well as mechanical arms and the like that are suitable for use in robots.

The general description and the following detailed description are exemplary and explanatory only and are not restrictive of the invention, as defined in the appended claims. Other aspects of the present invention will be apparent to those skilled in the art in view of the detailed description of the invention as provided herein.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings:

FIGS. 1A and 1B illustrates a top perspective view of a prior art planar electroactive polymer transducer, before and after application of a voltage across the electroactive polymeric cylinder, respectively;

FIGS. 1C and 1D illustrate, respectively, a top perspective view of a prior art hollow tube electroactive polymer transducer, before and after application of a voltage across the electroactive polymeric cylinder;

FIGS. 1E and 1F illustrate, respectively, a top perspective view of a portion of an electroactive polymer fiber, before and after application of a voltage, in accordance with one embodiment of the present invention;

FIG. 1G provides mathematical modeling data that illustrates how the electrical properties of an embodiment of an electroactive fiber of the present invention varies with axial strain;

FIG. 1H provides experimental and comparative axial strain versus voltage data for an embodiment of an electroactive fiber transducer of the present invention: top pane—max. axial strain versus max. voltage results of one such transducer when stimulated while lifting three different weights, one of 3.8 g (o), one of 7.4 g (+) and one of 10.6 g (*); middle pane—results obtained on a second electroactive fiber transducer using a 3.8 g (*) weight; bottom pane—two frames of a video recording captured while testing an electroactive fiber transducer;

FIGS. 2A-2I illustrate the cross-sectional geometries of a variety of embodiments of the electroactive fibers of the present invention;

FIGS. 3A-3P illustrate a variety of bundled electroactive fibers of the present invention;

FIG. 4A illustrates an axial cross section of an embodiment of a bundled electroactive polymer transducer of the present invention;

FIG. 4B is a radial cross section of the bundled electroactive polymer transducer illustrated in FIG. 4A, viewed along direction 424;

FIGS. 4C-4G illustrate various capping configurations of electroactive polymer fibers;

FIGS. 4H-4L illustrate various coupling mechanisms for electrically and mechanically coupling electroactive fiber transducers to devices;

FIGS. 4M and 4N illustrate use of a fuse-like material or semiconductor substrate in end caps that can be used in certain embodiments of the present invention;

FIG. 4O illustrates an embodiment in which a single electroactive fiber is connected to a single electrical insulated wire;

FIG. 4P illustrates an embodiment comprised of that illustrated in FIG. 4O, wherein the electrical wire has an additional coaxial conductor;

FIGS. 6A-6H, 6J-6K, and 6M-6N illustrate several approaches for bundling EPFs;

FIG. 7A illustrates an embodiment of an electroactive polymer fiber transducer of the present invention;

FIG. 7B illustrates a schematic diagram of an embodiment of an electroactive polymer fiber transducer of the present invention from the mechanical perspective;

FIGS. 7C and 7D illustrate schematic diagrams of an embodiment of an electroactive polymer fiber transducer of the present invention from the electrical perspective;

FIGS. 8A-8M illustrate various embodiments of joints, actuators and devices of the present invention that incorporate electroactive polymer fiber transducers.

FIG. 9A illustrates an embodiment of a robotic arm or leg of the present invention;

FIG. 9B illustrates a cut-away portion of an embodiment of a robotic or prosthetic leg or other limb depicting components (e.g., power source, sensors, and controllers) incorporated into the structure of the leg;

FIG. 9C illustrates an embodiment of a spherical joint of the present invention, e.g., for use as vertebra;

FIG. 9D illustrates an embodiment of a combination of generic legs and vertebral segments giving, when replicated gives rise to an overall architecture of a tetrapod robot;

FIG. 9E illustrates an embodiment of a BEPFT applied to a powered prosthetic leg actuated both at the knee and at the ankle.

FIG. 9F illustrates an embodiment of an application of a BEPFT for use in an orthopedic brace to aid a leg; and FIGS. 10A through 10I progressively illustrate, in order of increasing complexity, embodiments of modules of electronic components assembled to produce a very scalable, modular, energy efficient, high voltage set of drivers, measurement tools, distributed control loops capable of exploiting the sensing, actuating and energy generation functionalities of BEPFTs.

DETAILED DESCRIPTION AND ILLUSTRATIVE EMBODIMENTS

Figure 3Q:
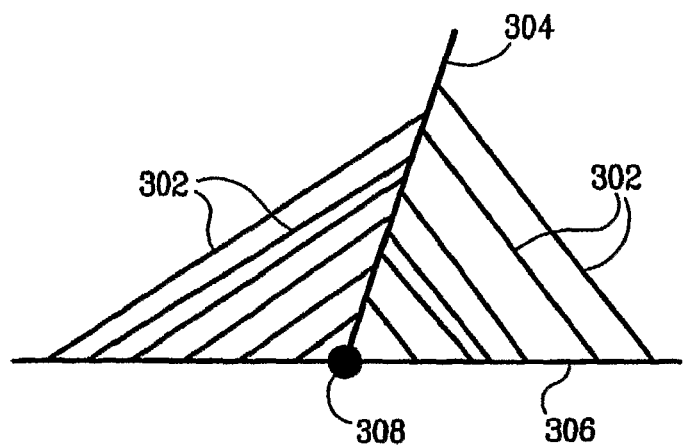
FIGS. 3Q and 3R illustrate embodiments of systems of jointed transducers comprising a plurality of electroactive fiber transducers of the present invention.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

Electroactive Polymer Actuators. Electroactive polymers (EAP) are polymers that respond to electrical stimulation with a significant change of shape or size. Some EAP have been called "artificial muscles" because of a high similarity in their performance. There are three classes of electroactive polymers: dielectric elastomers, ionomeric, and conductive polymers.

Dielectric Elastomer "Artificial Muscles". Dielectric elastomers are one type of EAP. The operation principle of dielectric elastomers is best illustrated as a parallel plate capacitor shown in the figure below, in which the dielectric elastomer is a thin film of polymer sandwiched between two conductive electrodes. As a voltage is applied across the electroactive polymer, positive charges accumulate on one surface and negative charges on the other. Opposites attract, literally, and create what is called a Maxwell stress or pressure, which squeezes the electroactive polymer film in thickness. These polymers are very rubbery and usually incompressible (i.e., their volume is constant even though their shape changes), so to compensate for the change in thickness, they grow in area. When the voltage is removed, the internal elasticity of the electroactive polymer returns it to its original shape. By controlling the applied voltage, the amount of deformation of the electroactive polymer can be precisely controlled.

Suitable dielectric elastomers can be synthesized from polymers with large electroactive response include particular grades of silicone and some acrylic based elastomers. Large actuation strains typically utilize compliant electrodes that can change shape with the dielectric elastomer yet maintain electrical conductivity. Suitable compliant electrodes, which are described further herein, include, for example, conductive greases.

Electroactive Fiber Actuation. Electroactive fiber actuators include bundles of electroactive fibers that can behave like tunable rubber bands that expand and contract in response to an applied voltage. Electroactive fiber actuators produce force when activated by a voltage, and also respond passively like springs to external stresses and strains.

Electroactive fiber actuators use electrostatic forces to produce movement. When compared to any other form of actuation, electroactive fiber actuators can provide scalable, lightweight, efficient, silent, and affordable motion. The geometric configuration of electroactive fiber actuators can overcome the limitations of previous dielectric elastomer actuators.

An electroactive fiber can comprise an electroactive elastically compliant material sandwiched between an incompressibly compliant inner electrode and outer compliant electrode. When a voltage is applied across the electrodes, the walls of the electroactive elastically compliant material compress in thickness causing the fiber to stretch. Due to the elasticity of the electroactive elastically compliant material, when the voltage is removed, the fiber returns to its initial length, producing useful tension and actuation. In this way, by controlling the voltage applied to the fibers, a precise level of contraction and extension is achieved.

The electroactive fibers can sometimes have diameters on the order of a few micrometers, which are easily fabricated and can be used to actuate many devices. Furthermore, because they have small thickness, actuation voltages less than 100 V can be used.

Additionally, electroactive fibers can be made using extrusion technology as described herein to make any lengths necessary for a variety of applications. Any number of electroactive fibers can be bundled together, tens, hundreds, thousands, even millions, in any of a number of ways as described. Each electroactive fiber can contribute a small force, or not, which progressively adds to the whole to produce a very strong actuation force. Even if a fraction of the fibers in a bundle fail, the electroactive fiber actuator will in most cases continue to operate.

FIG. 1A illustrates a top perspective view of a prior art planar electroactive polymer transducer portion 100. The transducer portion 100 comprises an electroactive polymer film 102 for converting between electrical energy and mechanical energy. In this embodiment, an electroactive polymer refers to a polymer that functions as an insulating dielectric between two electrodes and may deflect upon application of a voltage difference between the two electrodes. Typically polymer 102 is incompressible or has very low compressibility. Top and bottom electrodes 104 and 106 (not shown) are attached to the electroactive polymer 102 on its top and bottom surfaces, respectively, to provide a voltage difference across a portion of the electroactive polymer 102. Polymer 102 deflects with a change in electric field provided by the top and bottom electrodes 104 and 106. Deflection of the transducer portion 100 in response to a change in electric field provided by the electrodes 104 and 106 is referred to as actuation. As polymer 102 changes in size, the deflection may be used to produce mechanical work.

FIG. 1B illustrates a top perspective view of the prior art transducer portion 100 including deflection in response to a change in electric field. In general, deflection refers to any displacement, expansion, contraction, torsion, linear or area strain, or any other deformation of a portion of the electroactive polymer 102. The change in electric field corresponding to the voltage difference applied to or by the electrodes 104 and 106 produces mechanical pressure within polymer 102. In this case, the unlike electrical charges produced by electrodes 104 and 106 attract each other and provide a compressive force between electrodes 104 and 106 that compress the electroactive polymer film in a direction 112 and produce an expansion force on polymer 102 in planar directions 108 and 110, causing polymer 102 to compress between electrodes 104 and 106 and stretch in the planar directions 108 and 110.

FIG. 1C illustrates a top perspective view of a prior art hollow tube electroactive polymer transducer equivalent to rolling transducer 100 in such a way that the previous polymer film 102 is now the wall of a tube 116. Similarly the previous top electrode 104 now covers the internal surface 118 of the tube's wall and the bottom electrode 106 now covers the external surface 120 of the tube.

FIG. 1D illustrates the prior art hollow tube transducer 114 when a voltage is applied through electrodes 118 and 120 such that the electroactive polymer tube 116 undergoes the same compression in wall thickness as the electroactive polymer film 102 of prior art transducer 100 in FIG. 1B. Under this condition the same deflection in direction 110 is maintained between FIGS. 1B and 1D, however deflection in direction 108 is now transformed into a deflection in the perimeter 124 of the tube actuator, which results in a change in the external radius of the tube in direction 122. In this case, the geometric volume inside the transducer 114 grows from 130 to 132 when the voltage is applied. The change in volume is due to an increase in radius from 134 to 136 and an increase in length from 126 to 128.

FIG. 1E illustrates a top perspective view of a sealed incompressible fluid inner core transducer 152 in accordance with one embodiment of the present invention. For means of comparison the electroactive polymer tube wall 116 is of equivalent dimensions to that of transducer 114, however the previous internal surface electrode 118 is now replaced with an incompressible fluid inner electrode 138 that completely occupies the entire inner volume of the transducer 152. The inner electrode 138 is sealed at both distal ends of transducer 152 with dual electrode end caps (not shown). An incompressible fluid exterior electrode 120 resides exterior and directly adjacent to the exterior surface of the transducer 152.

FIG. 1F illustrates sealed incompressible fluid inner core transducer 152 when a voltage is applied via sealed dual electrode end caps (not shown) through incompressible fluid electrodes 138 and 120. Upon application of a suitable voltage, the elastomer tube 116 is shown to undergo a similar compression in wall thickness as the electroactive polymer film 102 in transducers 100 and 114. In this case, however, since the inner core of transducer 152 is full and sealed with incompressible fluid inner electrode 138, elastomer tube 116 typically does not grow in perimeter or diameter upon application of a voltage across electrodes 138 and 120. To accommodate the actuated tube wall thickness produced by the application of voltage, the transducer 152 deforms considerably in direction 110, which gives rise to a thinning of the elastomer tube in the radial direction 122. Without being bound by any particular theory of operation, the boundary condition imposed by the inner electrode 138 on the elastomer 116, whose volume remains constant in magnitude between state 140 and 142, causes transducer 152 to undergo a much more significant deformation in direction 110 than the prior art hollow transducer 114. This axial deformation from length 148 to length 150 is harnessed by an external coupling to produce mechanical work.

Furthermore, and without wishing to be bound by theory, regardless of the loads or stress applied to transducer 152, its geometry can be determined by a single variable, its length or diameter, since its overall volume is constant. In contrast, prior art hollow tube transducer 114 may change independently in length and diameter in a less predictable manner depending on the actual external loads that the transducer is subject to. This is particularly important when it is desirable to use a transducer as either an actuator, a sensor, or both. In other words, since the geometry of transducer 152 is fully determined by its length regardless of actuation state or stress applied, the electrical parameters, which directly derive from this unique geometry may be measured by traditional techniques and used to fully and unambiguously determine the state of such transducer. In contrast measurements made from a transducer such as 114 will have a degree of ambiguity due to the relative independence between its radius and its length.

An operation modality in which the transducer 152, in accordance with the present invention, serves as an actuator has been described as the result of applying a voltage or electric field across electrodes 120 and 138 such that the transducer 152 changes its shape by growing and contracting axially in direction 110. Such axial displacement may be harnessed by coupling the device to an external load in order to produce mechanical work on such a load. In particular, applying an electric field across polymer 116 through electrodes 120 and 138 causes transducer 152 to expand axially as illustrated in FIG. 1F. Because of the elastic properties of polymer 116, removing such an electric field causes the electroactive polymer 116 to return to its original configuration, contracting axially as in FIG. 1G. This contraction is analogous to the contraction of natural biological muscle fibers and thus may be harnessed to produce tension and motion. Furthermore, and not wishing to be bound by theory, it should be noted that actuation may not necessarily refer to the actual production of motion but in the case where the ends of transducer 152 are held in position by external means, application of an electric field across polymer 116 through electrodes 120 and 138 will not cause a deformation, but a change in the tension being produced by the transducer 152 can occur. In other words, activating, by application of an electrical field, a transducer 152 whose length is fixed will have the effect of changing the stiffness of the system. This may alternatively be expressed as an effective change to the spring constant of the transducer. Overall, within this context and in a less intuitive manner, actuation may be perceived not necessarily as a means to produce motion but as a mean to change the spring constant, and thus the state of equilibrium of transducer 152 which in turn may or may not result in effective production of motion, but which will inevitably change the mechanical properties, dynamic and/or static, of the system to which transducer 152 is coupled.

In another modality, transducer 152, in accordance with the present invention, may serve as a sensor of length or force/tension, as its electrical properties are unambiguously related to its mechanical configuration. In one embodiment, and as one skilled in the art will appreciate, conventional means for measuring electrical resistance or conductivity may be used to measure the resistance of the core electrode 138 by electrically connecting each end of the device to the measurement circuit. Not wishing to be bound by theory, the resistance of such a cylindrical conductor 138 will be proportionally dependent on its length and inversely proportional to its cross-sectional area, therefore, as transducer 152 grows axially, by internal or external means, the length of the core 138 grows and the cross-sectional area decreases, effectively increasing the electrical resistance of the core 138. Since, as described previously, due to the incompressibility of the sealed core 138 the cross-sectional area of the same will depend on its length, and the length of the core is computed based on the initial dimensions and electrical properties of the material such as its resistivity. Alternatively, an initial calibration measurement may be taken under controlled or known conditions to compensate for such factors as temperature dependent resistivity and later use the relative change in resistance of the core 138 to compute its length. In yet another approach, an empirical relation may be derived for associating the length of transducer 152 to the value of experimentally measured core 138 resistances. Finally, these three methods of determining the length of the device may be used in conjunction with each other.

A very interesting feature of this sensing modality, which comprises the change of resistance of the core electrode 138 as a function of length is that it allows the transducer 152 to be used as a variable resistor. When used within a suitable electronic circuit, the resistance or conductance variance of transducer 152 may be exploited to modulate a current in a similar manner as a modern transistor modulates current through a change in its conductance. In such an embodiment, increasing the length of transducer 152 would result in an increase in resistance and therefore a decrease in the current that can flow through it if it where held at a significantly constant voltage. This feature and implementation will have very desirable applications. For clarity's sake, in this embodiment current flows through the core electrode 138 from one end of transducer 152 to the other. In other words, the change in length and thus resistance of the core 138 may be directly exploited to modulate a current within a circuit.

In another sensing modality, the change of electrical resistance of polymer 116 may be used as a sensing mechanism for transducer 152. In this modality, conventional methods available for someone skilled in the art may be used to measure the electrical resistance of polymer 116 across electrodes 120 and 138. In this case, the geometry of polymer 116 is again, due to the boundary conditions imposed by incompressible core 138 plus the incompressibility of polymer 116, fully and unambiguously determined by a single variable such as the length of the transducer 152. Therefore, as transducer 152 grows axially, by internal or external means, the length of the electroactive polymer tube 116 grows and its perimeter decreases, effectively changing the area and distance through which an electrical current can flow between electrodes 120 and 138 therefore changing the resistance of such path. As before, using the material properties and dimensions of the transducer components, and calibration conditions, an empirical relation between the length and the resistance or a combination of these may be used to determine the length of the transducer based on the resistance measurement of the electroactive polymer 116. In other words, the leakage conductance of the otherwise ideally insulating polymer 116, may be used as a method for sensing.

Another sensing modality exploits the change in capacitance of the transducer as it changes in length. Capacitance measurement may be achieved by conventional techniques available to someone skilled in the art. As before, the length of the transducer 152 may be computed from a measurement of the capacitance based on a well-known theoretical capacitance to geometrical formulation for cylindrical capacitors, based on a pre-calibrated measurement or on empirical results as previously described for the resistive cases but now within the context of capacitance.

Furthermore, it is noted that these methods are not exclusive and some or all may be combined simultaneously or synchronously to provide more accuracy or different sensing ranges as appropriate.

Finally, in relation to sensing it should be noted that since transducer 152 exhibits elastic behavior in such a way that the force required to stretch it a given length obeys a well known relation, transducer 152 may also be used as a force sensor. In other words, by computing the length of the transducer 152 by any of the above-mentioned methods and relating that length, through the elastic properties of the transducer 152, to the force to which the device should be subjected, the transducer effectively becomes a desirable low impedance force sensor.

An other operation modality for transducer 152 is that of an electrical generator. From the electrical perspective, transducer 152 can serve as a charge pump albeit the pumping mechanism is the mechanical work being done on the device. A transducer 152 is initially prestrained by an external force as well as precharged to a given voltage. The prestraining reduces the thickness of the tube 116's walls and increases its length, effectively increasing the overall capacitance of the transducer, around which point it is charged to a given voltage. As the transducer 152 is released from the prestraining condition, and it elastically returns to its original conformation, the capacitance of the device decreases yet the overall charge remains constant. From the relation charge=capacitance*voltage, as the capacitance decreases, the voltage should increase to maintain this relation. From another perspective, as the transducer is released from the prestrained condition, the thickness of the tube 116 walls increases, effectively spreading the charges further apart and thus increasing their potential and the voltage. At this higher voltage state, the charge can be moved to a storage device such as a battery or another capacitor or used to drive other electronic circuits. In other words, by properly charging a transducer 152 during the stretched part of a work cycle to a relatively low voltage, such voltage will be increased (or the charge will be pumped) during the relaxation phase of the work cycle, in this manner effectively raising the voltage and thus the overall electrical energy level of the system.

Finally it is important to note that the functional modalities previously described are not exclusive and transducer 152 may function as one or more of an actuator, a sensor and a generator simultaneously provided suitable electronic driving, harvesting and measuring circuits are connected to it.

For the sake of specificity, yet not wishing to be bound by theory, several engineering principles are described by which the above-mentioned operation modalities may relate electrical parameters to mechanical configurations resulting in practical embodiments.

For the case in which the transducer 152 in accordance with the present invention may be operated as a sensor on the basis of a change in resistance of the internal core electrode 138 the fundamental assumptions are two: 1) the resistance of such electrode is determined by the well know principle that the resistance of a conductor R is proportional to the resistivity ro of the material, the length L 148 and 150 of the conductor and inversely proportional to its cross sectional area A, in this case determined by the area of the circle with radius 144 and 146, depending on the mechanical state; 2) the core electrode 138 and the surrounding polymer 116 are both incompressible. Based on these two principles it may be derived that the resistance of core electrode 138 follows a quadratic relation to the length 150 of the transducer 152. Such that:

$$R = L^2 * ro/(pi * Lo * Ro^2)$$

Where R is the theoretical resistance of core electrode 138 as a function of L, the active length 150 of the transducer. ro is the resistivity of the core material 138, Lo is the initial length 148 of the transducer, and Ro is the initial radius 144 of the core electrode 138. One skilled in the art will not have trouble in generalizing the above relation in terms of linear strain. In short, the resistance of the core electrode 138 behaves quadratically in relation to the length of transducer 152. This is further described and illustrated in the top pane of FIG. 1G.

For the case in which the transducer 152 in accordance with the present invention may be operated as a sensor on the basis of a change in resistance of the electroactive polymer 116 the fundamental assumptions are two: 1) the resistance of the electroactive polymer is determined by the well know principle that the resistance of a conductor R is proportional to the resistivity ro of the material, the distance across which the charge should flow and be inversely proportional to its cross sectional area of such path, in this case determined by the surface area of cylinder, depending on the mechanical state. 2) the core electrode 138 and the surrounding polymer 116 are both incompressible. Based on these two principles it may be derived that the resistance of the surrounding polymer 116 follows an inversely proportional relation to the length 150 of the transducer 152. Such that:

$$Rp = ro * \ln(bo/ao)/(2 * pi * L)$$

Where Rp is the theoretical resistance of polymer 116 measured between electrodes 138 and 120 as a function of L, the active length 150 of the transducer. ro is the resistivity of the electroactive polymer material 116, bo is the initial outer radius of polymer 116 and ao is the initial radius 144 of the core electrode 138. One skilled in the art can generalize the above relation in terms of linear strain. In short, the resistance of the surrounding polymer 116 behaves inversely proportionally to the length of transducer 152. This is further described and illustrated in the second pane of FIG. 1G.

For the case in which the transducer 152 in accordance with the present invention may be operated as a sensor on the basis of a change in capacitance of the device, the fundamental assumptions are two: 1) the capacitance of the transducer is determined by the well know capacitance formula for a cylindrical capacitor. 2) the core electrode 138 and the surrounding polymer 116 are both incompressible. Based on these two principles it may be derived that the capacitance of the device 152 follows a linear relation to the length 150 of the transducer 152. Such that:

$$C = 2 * pi * E * L/\ln(b/a)$$

Where C is the theoretical capacitance of the transducer 152 measured between electrodes 138 and 120 as a function of L, the active length 150 of the transducer. E is the dielectric constant of the electroactive polymer material 116 times the permittivity of free space, b is the outer radius of polymer 116 and a is the internal radius of polymer 116, the ratio of which (b/a) remains constant independent of length L based on the incompressibility assumption. It is of great interest to note that in this modality, the baseline capacitance as well as the gain of capacitance versus the length of the transducer 152 is determined by the ratio b/a such that a transducer 152 may be customized to a desired behavior by setting such ratio during fabrication. One skilled in the art can generalize the above relation in terms of linear strain. In short, the capacitance of transducer 152 behaves linearly in relation to the length of transducer 152. This is further described and illustrated in the third pane of FIG. 1G.

FIG. 1G illustrates the prophetical relations above mentioned, in accordance with the present invention, of the transducer 152 operating in a sensory modality. In particular, the relation between the core resistance, the electroactive polymer resistance and the transducer capacitance are plotted as a function of the linear strain of transducer 152, where in each graph the unity value corresponds to a defined initial condition and the intrinsic electrical properties of the materials used. In conjunction, next to each graph is the equation which corresponds to the behavior of each parameter as a function of linear strain.

For the operation modality in which transducer 152 in accordance with the present invention may be operated as an actuator, a simplified mathematical model may be derived to relate the voltage applied to the strain produced by the device. The simplifications of this model consider mainly geometric aspects of the transducer and do not include details such as the actual stress distribution within the structures of the device, therefore such a model can be applied to conditions in which a marginal load is applied to the transducer 152 and the results remains valid only within a small range of strain. However, as is illustrated herein, the model predicts the experimental data very well. The fundamental assumptions of such model are two: 1) the electroactive behavior of polymer 116 follows the behavior of traditional dielectric elastomers such as described by Pelrine et al 2000 in which the strain in thickness of a film is proportional to the dielectric constant of the material over its modulus of elasticity times the square of the applied electric field. 2) the core electrode 138 and the surrounding polymer 116 of transducer 152 are both incompressible. Based on these two principles it may be derived that the applied voltage across electrodes 138 and 120 necessary to produce a desired strain is given by:

$$V = sqrt(Y/E*(bo-ao)^2*(1-1/sqrt(S+1))*(1/(S+1)))$$

Where Y is the modulus of elasticity of polymer 116 and E is its dielectric constant times the permittivity of free space, bo is the outer radius of polymer 116 in an initial passive state and ao is the internal radius of polymer 116 in the same passive state. S is the axial strain of transducer 152 in direction 110 when activated by a voltage V. One skilled in the art can specify the above relation in terms of specific length. The above relation may be manipulated to obtain a closed form solution of the strain as a function of the voltage by one skilled in the art devoted to solving the cubic form of the equation. However, for simplicity's sake, the above relation may be computed and plotted with the axes inverted to imply the proper causality.

One skilled in the art will appreciate that the specific choice of materials and results are presented here as means of example and that the scope of the present invention is not constrained to these specific materials or to the exact relation and scale of the results presented.

For all the above-mentioned operation modalities and descriptions pi represents the highly irrational and universal constant that relates the diameter to the perimeter of a circle (pi=P/D) and ln(x) represents the natural logarithm of x.

Electroactive Materials. Suitable electroactive materials for use in the various aspects of the present invention include materials that function as an insulating dielectric between two electrodes and may deflect upon application of a voltage difference between the two electrodes. Materials suitable for use as an electroactive material include polymeric materials as well as non-polymeric materials. Non-polymeric materials suitable for use with the present invention can include any substantially insulating composite fiber gel-like or paste-like material that deforms in response to an electrostatic force or whose deformation results in a measurable electric change. Polymeric materials suitable for use with the present invention can include any substantially insulating natural or synthetic polymer that deforms in response to an electrostatic force or whose deformation results in a measurable electric change. Polymeric materials are preferred. As such, reference is made throughout this disclosure concerning the use of electroactive polymers, which by its functional nature can be readily substituted with any of a variety of functionally equivalent materials. Accordingly all references to the term "electroactive polymer" shall include polymeric as well as non-polymeric materials, unless specifically stated otherwise.

Materials—Electroactive Polymers. Suitable electroactive polymers can be formed into electroactive fibers as described herein, wherein upon application of an electric potential between an inner and outer compliant electrode, the electroactive polymer is deformed. Suitable electroactive polymer fibers can be provided wherein the inner and outer compliant electrodes generate substantially no equilibrium elastic force on the electroactive polymer.

Suitable electroactive polymers include a wide variety of polymers, such as dielectric thermoplastic elastomers. Suitable dielectric thermoplastic elastomers include block copolymers comprising at least two covalently bonded polymer blocks. Suitable block copolymers include A-B diblock copolymer, and A-B-A triblock copolymer, A-B-A-B quadblock copolymer, A-B-A-B-A pentablock copolymer, star block copolymers, or any combination thereof. Suitable electroactive polymers can also be provided wherein at least one of the covalently bonded polymer blocks comprises a plurality of repeat units comprising an aromatic group, a saturated hydrocarbon, or any combination thereof. Suitable electroactive polymers can be provided wherein the aromatic group includes styrene. The electroactive polymers can also be provided wherein the saturated hydrocarbon includes ethylene, 1-butene, propylene, hydrogenated butadiene, hydrogenated isoprene, hydrogenated styrene, or any combination thereof.

Many suitable electroactive polymers for use in the electroactive polymer fibers of the present invention are disclosed in U.S. Pat. No. 6,812,624 to Pei et al., the portion of which pertaining to electroactive polymers and additives from col. 13, line 26, to col. 15, line 55, is incorporated by reference herein and is further recited below. In addition, the following U.S. patents disclose suitable electroactive polymers as well as suitable compliant electrode materials, the portion of each pertaining to such materials is incorporated by reference herein: U.S. Pat. Nos. 7,034,432; 6,969,365; 6,940,211; 6,911,764; 6,891,317; 6,882,086; 6,876,135; 6,812,624; 6,809,462; 6,806,621; 6,768,246; 6,707,236; 6,664,718; 6,628,040; 6,586,859; 6,583,533; 6,545,384; 6,543,110; 6,376,971. Various technical aspects concerning electroactive polymer actuators provided in some of these U.S. patents are also recited herein.

Although the discussion so far has focused primarily on one type of electroactive polymer commonly referred to as dielectric elastomers, transducers of the present invention may also incorporate other electroactive polymers. As the term is used herein, an electroactive polymer refers to a polymer that responds to electrical stimulation. Other common classes of electroactive polymer suitable for use with some embodiments of the present invention include electrostrictive polymers, and conductive polymers.

Electrostrictive polymers are conventionally described as polymers with an intrinsic strain response proportional to the square of the electric field. For the sensing applications described here, however, these and other variable dielectric materials can best be described as having variable dielectric "constants". That is, the electric polarization of the material depends in a non-linear way on the electric field. Such materials can be used in the present invention provided the capacitance formula takes into account the fact that the dielectric "constant" itself depends on the electric field, or more simply by measuring an empirical relation between capacitance and polymer deflection.

Other electroactive polymer materials may be used, either alone, or blended with others. These include polymers that exhibit the piezoelectric effect (such as PVDF and various copolymers). In operational modes where the resistance or capacitance of the electroactive polymer is being measured, it is not the piezoelectric effect per se that is not providing the measurement.

Conductive polymers are polymers that can conduct electricity. Conductive polymers include electronically conductive polymers as well as ionically conductive polymers. Numerous examples of each type are known in the literature. Conductive polymers may be used in the present invention using the leakage method described below. They may also be used with variable resistance electrodes, circuits that measure electrical impedance (a combination of capacitance and resistance of the transducer), or capacitance. However, conductive polymers are often designed to have relatively low electrical resistance so that methods and circuits measuring, for example, capacitance, should be appropriate for the electroactive polymer resistance used as described above.

Materials suitable for use as an electroactive polymer fiber with the present invention may include any substantially insulating polymer or rubber (or combination thereof) that deforms in response to an electrostatic force or whose deformation results in a change in electric field. One suitable material is NuSil CF19-2186 as provided by NuSil Technology of Carpenteria, Calif. Other exemplary materials suitable for use as an electroactive polymer fiber include silicone elastomers such as those provided by Dow Corning of Midland, Mich., acrylic elastomers such as VHB 4910 acrylic elastomer as produced by 3M Corporation of St. Paul, Minn., polyurethanes, thermoplastic elastomers, copolymers comprising PVDF, pressure-sensitive adhesives, fluoroelastomers, polymers comprising silicone and acrylic moieties, and the like. Polymers comprising silicone and acrylic moieties may include copolymers comprising silicone and acrylic moieties, polymer blends comprising a silicone elastomer and an acrylic elastomer, for example. Combinations of some of these materials may also be used as the electroactive polymer in transducers of this invention.

Other common classes of electroactive polymers suitable for use with many embodiments of the present invention include electrostrictive polymers, electronic electroactive polymers, and ionic electroactive polymers, and some copolymers. Electrostrictive polymers are characterized by the non-linear reaction of a electroactive polymers (relating strain to $E^2$). Electronic electroactive polymers typically change shape or dimensions due to migration of electrons in response to electric field (usually dry). Ionic electroactive polymers are polymers that change shape or dimensions due to migration of ions in response to electric field (usually wet and contains electrolyte). Irradiated copolymer of polyvinylidene difluoride and trifluoroethelene P(VDF-TrFE) is an electroactive polymer suitable for use with some embodiments of the present invention.

Materials suitable for use as an electroactive polymer with the present invention may include any substantially insulating polymer or rubber that deforms in response to an electrostatic force or whose deformation results in a change in electric field.

Other exemplary materials suitable for use as a electroactive polymer include, any dielectric elastomeric polymer, silicone rubbers, fluoroelastomers, silicones such as Dow Corning HS3 as provided by Dow Corning of Wilmington, Del., fluorosilicones such as Dow Corning 730 as provided by Dow Corning of Wilmington, Del., and the like, and acrylic polymers such as any acrylic in the 4900 VHB acrylic series as provided by 3M Corp.

In many cases, materials used in accordance with the present invention are commercially available polymers.

The commercially available polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may simplify fabrication. In one embodiment, the commercially available polymer is an acrylic elastomer comprising mixtures of aliphatic acrylate that are cross-linked during fabrication.

Suitable electroactive polymers can have an elastic modulus below 100 MPa. Suitable electroactive polymers can also be selected having a maximum actuation pressure between about 0.05 MPa and about 10 MPa, and preferably between about 0.3 MPa and about 3 MPa. In another embodiment, the electroactive polymer is selected such that is has a dielectric constant between about 2 and about 20, and preferably between about 2.5 and about 12.

For some applications, an electroactive polymer is selected based on one or more application demands such as a wide temperature and/or humidity range, repeatability, accuracy, low creep, reliability and endurance.

Suitable actuation voltages for electroactive polymer fibers of the present invention may vary based on the electroactive polymer material and its properties (e.g. the dielectric constant) as well as the dimensions of the electroactive polymer (e.g. the thickness between electrodes).

Performance of an actuator may be described by a performance parameter specific to the actuator. By way of example, performance of an actuator of a certain size and weight may be quantified by parameters such as stroke or displacement, force, actuator response time. Characterizing the performance of a transducer in an application relates to how well the transducer is embodied in a particular application (e.g. in robotics). Performance of a transducer in an application may be described by a performance parameter specific to the application (e.g., force/unit weight in robotic applications). Application specific parameters include stroke or displacement, force, actuator response time, frequency response, efficiency, and the like. These parameters may depend on the size, mass and/or the design of the transducer and the particular application. It should be noted that desirable material properties for an electroactive polymer may vary with an actuator or application. To produce a large actuation pressures and large strain for an application, a pre-strained polymer may be implemented with one of a high dielectric strength, a high dielectric constant, and a low modulus of elasticity. Additionally, a suitable electroactive polymer may include one of a high-volume resistivity and low mechanical damping for maximizing energy efficiency for an application.

Polymers comprising silicone and acrylic moieties may include copolymers comprising silicone and acrylic moieties, polymer blends comprising a silicone elastomer and an acrylic elastomer, for example. Combinations of some of these materials may be used as the electroactive polymer in transducers of this invention. One example of a suitable silicone elastomer is Dow Corning HS3 as provided by Dow Corning of Wilmington, Del. One example of a suitable fluorosilicone is Dow Corning 730 as provided by Dow Corning of Wilmington, Del. One suitable example of a thermoplastic elastomer is styrene butadiene styrene (SBS) block copolymer.

Some acrylics such as any acrylic in the 4900 VHB acrylic series as provided by 3M Corp. of St. Paul, Minn. have properties suitable for use as the transducer polymer for this invention. Thus, in some embodiments, polymers suitable for use with the present invention may be made from any monoethylenically unsaturated monomer (or combination of monomers) homopolymerizable to form a polymer having a glass transition temperature at most about 0 degrees Celsius. Preferred monoethylenically unsaturated monomers include isooctyl acrylate, 2-ethylhexyl acrylate, decyl acrylate, dodecyl acrylate, hexyl acrylate, isononyl acrylate, isooctyl methacrylate, and 2-ethylhexyl methacrylate. Any of the monomers may also include one or more halogens such as fluorine.

One example of a suitable copolymer includes both silicone and acrylic elastomer moieties. In some case, materials suitable for use with the present invention may contain combinations of one or more of the above listed materials. For example, one suitable polymer is a blend including a silicone elastomer and an acrylic elastomer. In many cases, materials used in accordance with the present invention are commercially available polymers. The commercially available polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may also simplify fabrication. In a specific embodiment, the commercially available polymer is a commercially available acrylic elastomer comprising mixtures of aliphatic acrylate that are photocured during fabrication. The elasticity of the acrylic elastomer results from a combination of the branched aliphatic groups and cross-linking between the acrylic polymer chains. Materials used as an electroactive polymer may be selected based on one or more material properties such as a high electrical breakdown strength, a low modulus of elasticity-(for large or small deformations), a high dielectric constant, and the like.

Electroactive polymers may have almost any elastic modulus as long as it is compliant. Suitable electroactive polymers can be selected such that is has a maximum actuation pressure between about 0.05 MPa and about 10 MPa. Suitable electroactive polymer can be selected such that is has a dielectric constant between about 2 and about 20. For some applications, an electroactive polymer is selected based on one or more application demands such as a wide temperature and/or humidity range, repeatability, accuracy, low creep, reliability and endurance. Often, halogenated polymers, such as fluorinated or chlorinated polymers, exhibit a higher dielectric constant than the base polymer. In one example, a high dielectric polyurethane may be made from partially fluorinated urethane monomers.

Electroactive polymers of the present invention may also include one or more additives to improve various properties. Examples of suitable classes of materials include plasticizers, antioxidants, and high dielectric constant particulates. Examples of suitable plasticizers include high molecular-weight hydrocarbon oils, high molecular-weight hydrocarbon greases, Pentalyne H, Piccovar, AP Hydrocarbon Resins, Admex 760, Plastolein 9720, silicone oils, silicone greases, Floral 105, silicone elastomers, nonionic surfactants, and the like, as well as any combination thereof. An antioxidant can be a nonvolatile solid antioxidant. Additives can improve the ability of the electroactive polymer to convert between mechanical energy and electrical energy. Generally, the additive may improve any polymer property or parameter related to the ability of the parameter to convert between mechanical energy and electrical energy. Polymer material properties and parameters related to the ability of the electroactive polymer to convert between mechanical energy and electrical energy include, for example, the dielectric breakdown strength, maximum strain, dielectric constant, elastic modulus, properties associated with the visco-elastic performance, properties associated with creep, response time and actuation voltage. The addition of a plasticizer may, for example, improve the functioning of a transducer of this invention by reducing the elastic modulus of the electroactive polymer and/or increasing the dielectric breakdown strength of the electroactive polymer.

An additive can be included in a polymer to improve the dielectric breakdown strength of the electroactive polymer. Improving the dielectric breakdown strength allows the use of larger electrically actuated strains for the electroactive polymer. By way of example, a plasticizing additive may be added to a polymer to increase the dielectric breakdown strength of the electroactive polymer. Alternatively, a synthetic resin may be added to a styrene-butadiene-styrene block copolymer to improve the dialectric breakdown strength of the copolymer. For example, pentalyn-H as produced by Hercules, Inc. of Wilmington, Del. was added to Kraton D2104 as produced by Shell Chemical of Houston, Tex. to improve the dialectric breakdown strength of the Kraton D2104. Further detail on the fabrication of polymers including addition of one or more additives is provided below. In this case, the ratio of pentalyn-H added may range from about 0 to 2:1 by weight. In another embodiment, an additive is included to increase the dielectric constant of a polymer. For example, high dielectric constant particulates such as fine ceramic powders may be added to increase the dielectric constant of a commercially available polymer. Alternatively, polymers such as polyurethane may be partially fluorinated to increase the dielectric constant.

Alternatively, an additive may be included in a polymer to reduce the elastic modulus of the electroactive polymer. Reducing the elastic modulus enables larger strains for the electroactive polymer. In a specific embodiment, mineral oil was added to a solution of Kraton D to reduce the elastic modulus of the electroactive polymer. In this case, the ratio of mineral oil added may range from about 0 to 2:1 by weight. Specific materials included to reduce the elastic modulus of an acrylic polymer of the present invention include any acrylic acids, acrylic adhesives, acrylics including flexible side groups such as isooctyl groups and 2-ethylhexyl groups, or any copolymer of acrylic acid and isooctyl acrylate.

Multiple additives may be included in a polymer to improve performance of one or more material properties. Mineral oil and pentalyn-H can be added to a solution of Kraton D2104 to increase the dielectric breakdown strength and to reduce the elastic modulus of the electroactive polymer. Alternatively, for a commercially available silicone rubber whose stiffness has been increased by fine carbon particles used to increase the dielectric constant, the stiffness may be reduced by the addition of a carbon or silver filled silicone grease. An additive may also be included in a polymer to provide an additional property for the transducer. The additional property is not necessarily associated with polymer performance in converting between mechanical and electrical energy. By way of example, pentalyn-H may be added to Kraton D2104 to provide an adhesive property to the electroactive polymer. In this case, the additive also aids in conversion between mechanical and electrical energy. In a specific embodiment, polymers comprising Kraton D2104, pentalyn-H, mineral oil and fabricated using butyl acetate provided an adhesive polymer and a maximum linear strain in the range of about 70 to 200 percent.

Suitable actuation voltages for electroactive polymer fibers of the present invention may vary based on the electroactive polymer material and its properties (e.g. the dielectric constant) as well as the dimensions of the electroactive polymer (e.g. the thickness between electrodes). By way of example, actuation electric fields for the electroactive polymer 102 in FIG. 1A may range in magnitude from about 0 V/m to about 440 Mega Volts/meter. Actuation voltages in this range may produce a pressure in the range of about 0 Pa to about 10 MPa.

Preferably, the electroactive polymer's deformation is reversible over a wide range of strains. Many elastomeric polymers may serve this purpose. In designing or choosing an appropriate polymer, one can consider the optimal material, physical, and chemical properties. Such properties can be tailored by judicious selection of monomer (including any side chains), additives, degree of cross-linking, crystallinity, molecular weight, and the like. The transducer polymers of this invention may assume many different physical and chemical states. For example, they may be used with or without additives such as plasticizers. And they may be monolithic polymeric sheets or combinations of polymers such as laminates or patchworks. Further, the electroactive polymers may exist in a single phase or multiple phases. One example of a multiphase material is a polymeric matrix having inorganic filler particles admixed therewith. Regardless of the ultimate chemical and physical state of the transducer polymer, it will include a polymer matrix. That matrix be a homopolymer or copolymer, cross-linked or uncross-linked, linear or branched, and the like. Exemplary classes of polymer suitable for use with transducers of this invention include silicone elastomers, acrylic elastomers, polyurethanes, thermoplastic elastomers, copolymers comprising PVDF, pressure-sensitive adhesives, fluoroelastomers, polymers comprising silicone and acrylic moieties, and the like. Combinations of some of these materials may be used as the electroactive polymer matrix in transducers of this invention. Copolymers and blends fall within the class of suitable polymers. One example is a blend of a silicone elastomer and an acrylic elastomer. The properties of the electroactive polymer are dictated in large measure by the monomers used to produce the electroactive polymer. Each polymer type (e.g., acrylic, styrene, silicone, urethane, and the like.) has its own class of well-known monomers. In some embodiments, polymers suitable for use with the present invention may be made from monoethylenically unsaturated monomers (or combination of monomers) homopolymerizable to form a polymer. Preferred monoethylenically unsaturated monomers include isooctyl acrylate, acrylonitrile, 2-ethylhexyl acrylate, decyl acrylate, dodecyl acrylate, hexyl acrylate, isononyl acrylate, isooctyl methacrylate, and 2-ethylhexyl methacrylate. Any of these monomers may be halogenated with one or more halogens such as fluorine.) Various classes of catalysts that may be employed for polymer fabrication depending upon the desired state of the resulting polymer. Examples include selective early transition metal single site catalysts and late transition metal catalysts that are non-selective with respect to polymer structure. The range of possible polymers greatly increases when copolymers are considered. One widely used copolymer that is suitable for some embodiments of this invention is the thermoplastic elastomer styrene butadiene styrene (SBS) block copolymer. Another suitable copolymer includes both silicone and acrylic elastomer moieties. Yet another may include acrylic moieties, silicone moieties, and styrene/butadiene moieties. One specific preferred copolymer block contains acrylic acid and isooctyl acrylate. Another specific copolymer comprises acrylonitrile, acrylic acid, and isooctyl acrylate. Still another comprises these three acrylic components in one chain cross-linked to a separate silicone chain. Many other possibilities exist. The molar ratio of the copolymer component moieties can be adjusted to obtain desirable results. In a preferred copolymer of isooctyl acrylate and acrylic acid, a predominance of the isooctyl acrylate is generally preferred. In one specific embodiment, the molar ratio is roughly 85/15 isooctyl acrylate to acrylic acid.

Crosslinking can sometimes be used to great advantage. Specifically, by controlling the nature of the cross-links (physical versus chemical) and their density, one can obtain desired elastic and thermal properties. Chemical cross-links are manifest by as covalent bonds. These may be produced by hydrogen abstraction or use of polyfunctional monomers, for example. Physical cross-links are obtained by aggregations of rigid groups such phenyl moieties in styrene. The appropriate choice of a polymer side chain can provide tailored physical and material properties. In specific examples, side groups of a polymer backbone are modified to enable greater charge accumulation in bulk. This can be accomplished by modifying the side groups with lithium ions and/or transition metal organic ligand complexes, for example. Alternatively or in addition, side groups can be added to increase the electroactive polymer's dielectric constant. In one example, cyano groups serve this purpose. Such groups may be provided in the form of various phenyl nitrile groups for example. In another embodiment, conjugated oligomers in side chains or chain segments are added to increase polarizability and dielectric strength. In many cases, materials used in accordance with the present invention are commercially available polymers. Such polymers may include, for example, any commercially available silicone elastomer, polyurethane, PVDF copolymer and adhesive elastomer. Using commercially available materials provides cost-effective alternatives for transducers and associated devices of the present invention. The use of commercially available materials may also simplify fabrication. In a specific embodiment, the commercially available polymer is a commercially available acrylic elastomer comprising a mixture of aliphatic acrylates that are photocured during fabrication. One suitable commercially available polymer is NuSil CF19-2186 as provided by NuSil Technology of Carpenteria, Calif. An example of a suitable silicone elastomer is Dow Corning HS3 as provided by Dow Corning of Wilmington, Del. One example of a suitable fluorosilicone is Dow Corning 730 as provided by Dow Corning of Wilmington, Del. Examples of suitable acrylics include any acrylic in the 4900 VHB acrylic series as provided by 3M Corp. of St. Paul, Minn.

Electroactive polymers of the present invention may also include one or more additives to improve their various physical and chemical properties. Examples of suitable classes of materials include plasticizers, antioxidants, and high dielectric constant particulates. Examples of properties that can be controlled/modified by additives include adhesion and the ability of the electroactive polymer to convert between mechanical energy and electrical energy. Polymer material properties and parameters related to the ability of the electroactive polymer to convert between mechanical energy and electrical energy include, for example, the dielectric breakdown strength, maximum strain, dielectric constant, elastic modulus, properties associated with the visco-elastic performance, properties associated with creep, response time and actuation voltage. Improving the dielectric breakdown strength allows the use of larger electrically actuated strains for the electroactive polymer. By way of example, a plasticizing additive may be added to a polymer to increase the dielectric breakdown strength of the electroactive polymer. Alternatively, certain synthetic resins may be added for this purpose. For example, a styrene-butadiene-styrene block copolymer may be added to improve the dielectric breakdown strength of certain polymers. In one example, pentalyn-H as produced by Hercules, Inc. of Wilmington, Del. was added to Kraton D2104 as produced by Shell Chemical of Houston, Tex. to improve the dielectric breakdown strength of the Kraton D2104. In this specific example, the ratio of pentalyn-H added may range from about 0 to 2:1 by weight. In another approach, dielectric breakdown strength may be increased by adding electron trapping groups such as SF6 to increase breakdown electric field. Additives that increase the dielectric constant of a polymer include, for example, high dielectric constant particulates such as fine ceramic powders (e.g., barium titanate, strontium titanate, and titanium dioxide). Alternatively, polymers such as polyurethane may be partially fluorinated to increase the dielectric constant. Still further, layers of highly polarizable or high modulus materials such as conjugated polymers, graphite, carbon fibers, and carbon nanotubes may be added for this purpose.

An additive may be included in a polymer for the purpose of reducing elastic modulus. Reducing the elastic modulus enables larger strains for the electroactive polymer. In a specific embodiment, mineral oil is added to a solution of Kraton D to reduce the elastic modulus of the electroactive polymer. In this case, the ratio of mineral oil added may range from about 0 to 2:1 by weight, for example. Specific materials included to reduce the elastic modulus of an acrylic polymer of the present invention include any acrylic acids, acrylic adhesives, acrylics including flexible side groups such as isooctyl groups and 2-ethylhexyl groups, or any copolymer of acrylic acid and isooctyl acrylate. As mentioned, plasticizers are often added to polymers. In the context of this invention, the addition of a plasticizer may, for example, improve the functioning of a transducer of this invention by reducing the elastic modulus of the electroactive polymer and/or increasing the dielectric breakdown strength of the electroactive polymer. Examples of suitable plasticizers include high molecular-weight hydrocarbon oils, high molecular-weight hydrocarbon greases, Pentalyne H, Piccovar® AP Hydrocarbon Resins, Admex 760, Plastolein 9720, silicone oils, silicone greases, Floral 105, silicone elastomers, nonionic surfactants, and the like. Of course, combinations of these materials may be used. Finally, multiple additives may be included in a polymer to improve one or more materials properties. In one embodiment, it was found that addition of both mineral oil and pentalyn-H to a solution of Kraton D2104 to increase the dielectric breakdown strength and to reduce the elastic modulus of the electroactive polymer. Note that pentalyn-H may also improve the adhesion of Kraton D2104. A second additive can also be added to overcome a problem introduced by a first additive. For example, for a commercially available silicone rubber whose stiffness has been increased by fine carbon particles added to increase the dielectric constant, the stiffness may be reduced by the addition of a carbon or silver filled silicone grease. In this case, the additive also aids in conversion between mechanical and electrical energy. In a specific embodiment, polymers comprising Kraton D2104, pentalyn-H, mineral oil and fabricated using butyl acetate provided an adhesive polymer and a maximum linear strain in the range of about 70 to 200 percent. An electroactive polymer layer in transducers of the present invention may have a wide range of thicknesses. In one embodiment, polymer thickness may range between about 1 micrometer and 2 millimeters. Polymer thickness may be reduced by stretching the film in one or both planar directions. In many cases, electroactive polymers of the present invention may be fabricated and implemented as thin films. Thicknesses suitable for these thin films may be below 50 micrometers.

While not wishing to be bound by theory, elastomers are typically the to be polymers that exist at a temperature between their glass transition temperature and their liquefaction temperature. Elastomers are typically selected from silicones, urethanes, fluorinated polymers, nitrile rubbers, alkylene rubbers, diene rubbers, mixtures thereof, and copolymers thereof. The present elastic sheet may be readily and preferably fabricated from any silicone polymer, since silicone polymers probably have the greatest structural variety, and may have an enormous number of commercially available formulations. Typically, silicones may be crosslinked through a vinyl-to-(Si—H) reaction (as in the case of RTV 615 from General Electric of Waterford, N.Y.), though other crosslinking methods are known in the field of silicone polymer chemistry. Another suitable silicone material is NuSil CF19-2186 from NuSil Technology of Carpenteria, Calif. Still another suitable silicone material is Dow Corning HS3 from Dow Corning of Wilmington, Del. Dow Corning 730, also from Dow Corning, represents a suitable fluorosilicone. Diene polymers are typically suitable for use in the elastic sheet as well. Polyisoprene, polybutadiene, and polychloroprene are all commercially available polymers polymerized from diene monomers. Thus, all have one double bond per monomer when polymerized. This double bond allows the electroactive polymers to be converted to elastomers by crosslinking. When crosslinking occurs through vulcanization, sulfur can be used to crosslink the double bonds via heating. Alkylene polymers such as polyisobutylene, on the other hand, have no double bonds. However, an alkylene polymer may be crosslinked to form an elastomer by including a small amount (<1%) of isoprene in the electroactive polymerization. The isoprene monomers give pendant double bonds on the polyisobutylene backbone, which may then be vulcanized as above. In some instances, polymers suitable for use with the present invention may be made from any monoethylenically unsaturated monomer (or combination of monomers) homopolymerizable to form a polymer having a glass transition temperature of at most about 0 C. Also known in the art are acrylic elastomers comprising mixtures of aliphatic acrylates that exhibit elasticity due to a combination of branched aliphatic groups and crosslinking between the acrylic polymer chains. Suitable monoethylenically unsaturated monomers include isooctyl acrylate, 2-ethylhexyl acrylate, decyl acrylate, dodecyl acrylate, hexyl acrylate, isononyl acrylate, isooctyl methacrylate, and 2-ethylhexyl methacrylate. Any of the monomers may also include one or more halogens such as fluorine Similarly, polyurethanes may also be employed as elastomers. Polyurethanes may be produced, for example, from diisocyanates and dialcohols or diamines. Since there are a large variety of diisocyanates, dialcohols, and diamines, there are many different types of polyurethanes. Materials used in accordance with the present invention are typically commercially available polymers or are know to those of skill in the art. The commercially available polymers include, for example, silicone elastomers, polyurethanes, polyvinylidene fluoride copolymers and adhesive elastomers. In addition, polymers incorporating materials such as chlorosilanes or methyl-, ethyl-, and phenylsilanes, and polydimethylsiloxane (PDMS), such as Dow Chemical Corporation Sylgard 182, 184 or 186; or aliphatic urethane diacrylates such as (but not limited to) Ebecryl 270 or Irr 245 from UCB Chemical; may also be used. Using commercially available materials provides a cost-effective option and simplifies fabrication. A number of copolymers represent suitable elastomers. Styrene-butadiene-styrene (SBS) block copolymer is a thermoplastic elastomer that is produced by a "living" anionic polymerization process. This process does not involve a natural chain-terminating step, so "live" polymer ends can exist in the cured polymer. Copolymers comprising silicone and acrylic moieties may be employed as well. In such cases, crosslinking agents may be added. In some cases, materials suitable for use with the present invention may contain combinations of one or more of the above listed materials. For example, one suitable polymer is a blend including a silicone elastomer and an acrylic elastomer. Additives such as plasticizers, antioxidants, and high dielectric constant particulates may be incorporated in the elastomeric materials discussed herein above. Examples of suitable plasticizers include high molecular weight hydrocarbon oils, high molecular weight hydrocarbon greases, Pentalyne H, Piccovar, AP Hydrocarbon Resins, Admex 760, Plastolein 9720, silicone oils, silicone greases, Floral 105, silicone elastomers, nonionic surfactants, and the like. For example, RTV 615 may be diluted with GE SF96-50

Silicone Fluid. This serves to reduce the viscosity of the uncured elastomer and reduce the Young's modulus of the cured elastomer. Essentially, the crosslink-capable polymer chains are spread further apart by the addition of "inert" polymer chains. RTV 615 cures at up to 90% dilution, with a dramatic reduction in Young's modulus. It should be noted, however, that additives may be selected according to the desired functionality of the inventive device. In addition, since the inventive device is employed to control fluid flow, fluid flow may result in leaching of additives such as volatile or fluid-soluble solid antioxidant.

Materials—Electrodes. A wide variety of materials previously described by Pelrine et al. in U.S. Pat. No. 6,781,284, the section titled "5. Electrodes" at cols. 19-25 is incorporated by reference herein, may serve as suitable outer compliant electrodes. However, within the scope of the present invention, there exist other material choices that may serve as the inner electrode of the EPFTs. In a preferred embodiment such inner core material can be an incompressible fluid, such as a liquid, gel, paste or may even be a powder. Such material should also carry and hold electrical charge, it should not degrade during the fabrication process, it can be compatible and friendly with the choice of polymer and it can have suitable mechanical and rheological properties. Specifically, liquid materials with a compressibility coefficient less than 0.1/MPa are suitable for the present invention.

In particular, in a preferred embodiment where the electrodes are to be coextruded at high temperature with the molten polymer, such electrode materials can have a boiling point higher than the temperature at which the extrusion die is set. Suitable liquids thus identified have been Ethylene Glycol based compounds such as commercially available antifreeze and break fluid. In particular BMW (Germany) DOT 4 break fluid has a sufficiently high dry and wet boiling point to go through the extruder without evaporating. Nyogel 755 from Nyo Lubricants has also proven a suitable compound capable of withstanding the extrusion process. The oligomers of this compound such diethylene glycol, triethylene glycol and tetraethylene glycol are also suitable liquids to serve as a basis for the internal core electrode as they have even higher boiling points as the monomer. Other suitable liquids with high boiling point are Propylene Glycol, silicone based oils, mineral oils and in some instances vegetable oils.

Alternative to using high boiling point fluids, still within the scope of the present invention, is to coextrude under hyperbaric conditions to therefore shift the boiling point of the fluid so as to always maintain it in its liquid phase or to pre-cool the liquid in such a way as to prevent it from reaching its boiling point as it flows through the extruder and during the cooling of the EPFT polymer or a combination of both.

Essentially any fluid will conduct electricity as long as there are some dispersed or dissolved particles capable of carrying the charge either by ionic diffusion or drift or by actual electronic conduction. In particular, within the scope of the present invention, the above-mentioned basis for electrode materials are already sufficiently conductive in their commercially available purities. However, it is also within the scope of this invention to increase the conductivity of the liquids by addition of conductive particles, such as graphite powder, ions, micro-sized metallic shavings or other available conductors such as carbon nanotubes. In one embodiment where the core electrode is injected into the EPFT in a post-processing step, aqueous based solutions can be suitably materials.

Low conductance liquids can also be used in incompressibly compliant inner electrodes. This is due to the fact that such low conductivity typically increases the charge time or the RC circuit of the EPFT but does not effectively limit the charge accumulation. In other words, low conductivity can slow down charging with minimally affecting the end charged state. Fluids having very high electrical resitivities can be used in a fuse-like fashion.

Geometry—Single Electroactive Fiber Transducers. FIG. 1E illustrates a top perspective view of transducer 152. Transducer 152 will be referred as an Electroactive Polymer Fiber Transducer (EPFT), it is comprised of a non-hollow inner core 138 that functions as the inner electrode of the transducer and which is preferably made out of a conductive incompressible fluid. An electroactive polymer tube 116 surrounds the core. The electroactive polymer tube 116 is in turn surrounded on its circumference by an outer compliant electrode 120. In one embodiment electrode 120 is a surface electrode that mainly covers the surface of the tube 116. In another embodiment electrode 120 is a volume of conductive fluid that surrounds the circumference of tube 116. In such embodiment the fluid for electrode 120 may be incompressible or compressible. In one embodiment the outer compliant electrode 120 may cover the entire length of the tube 116 while in another it may cover one or more parts in length of the EPFT. In this fashion, any region in which polymer 116 lays between electrodes 138 and 120 creates an active transduction volume of electroactive polymer 116 which may serve as means of actuation, sensing or generation. In other words, a single EPFT may have a plurality of active transduction volumes throughout its length. In one embodiment all active transduction volumes may serve the same function (or functions) while in another embodiment active transduction volumes may serve different function (or functions). As way of example, an EPFT may have three active transduction volumes each acting as an actuator, sensor and generator, respectively. In another embodiment an EPFT may have two active transduction volumes, one serving as an actuator and sensor simultaneously while the other functions as a generator. In one embodiment electrodes 138 and 120 may be of the same material while in another embodiment they may be different. In general outer compliant electrode 120 may be comprised of any suitable material, which can applied by any suitable method know in the art, for example, coating.

One suitable EPFT is illustrated on FIG. 2A, which has a cross sectional area 200 composed of a perfectly circular core 202 in perfect concentricity with an electroactive polymer tube 204, which has perfectly smooth inner surface 208 and outer surface 210 as well as a perfectly uniform wall thinness. Electroactive polymer tube 204 is surrounded by outer compliant electrode 206 which may be a surface or fluid electrode that covers part or all of the length of the EPFT to form an active transduction volume as described previously. Suitable dimensions for EPFT range in external diameters of the electroactive polymer tube 204 of a few centimeters for megastructure applications down to a few nanometers for other more conventional applications. Nano-scale and micro-scale hollow fibers can be made using any of a variety of methods know in the art, for example, as described in U.S. Pat. Nos. 6,833,104, 6,811,873, 6,803,102 and 6,767,498. The internal radius of the electroactive polymer tube 204 may be from about $1/100$ to $99/100$ths the size of the external radius, therefore allowing great versatility in the choice of mechanical and electrical characteristics of the EPFT. The ideal choice of internal radius will depend greatly on the electromechanical properties of the electroactive polymer 204, the desired electromechanical behavior of the EPFT and the electrical properties of electrode 202.

Another embodiment similar to EPFT 200 may be such that the core 202 is eccentric in relation to the tube 204. Other suitable cross-sectional embodiments include core 202 and tube 204 geometries different from a circle such as triangles, squares or N sided polygons, ellipses. Flat EPFT 230 and folded EPFT 232 as illustrated in FIG. 2B may also be suitable geometries within the scope of the present invention. For such an embodiment, inner electrodes 238 and 240 define active transduction volumes across polymer 234 and 236 respectively in conjunction with outer electrodes 206.

FIG. 2C illustrates another suitable embodiment of the present invention in which the EPFT 246 main cross sectional profile, regardless of geometry, is complemented by one or a plurality of backbones 248 that form part of or are coupled to the main EPFT polymer wall 250. As with all EPFTs described so far, this embodiment has an inner electrode 252 that defines an active volume in conjunction with the outer compliant electrode 206. Such backbones 248 may provide additional mechanical support and bias the moment of inertia of the cross section so that the EPFT is more likely to flex around a chosen axis. Backbones 248 may assume any cross sectional geometry and be symmetrical or asymmetrical. In one embodiment, as illustrated in FIG. 2C, such the backbones are made of the same material as the enclosing polymer 250, however in another embodiment such the backbones may be of another material and may be coextruded together with the EPFT or coupled or patterned in a later processing step.

FIG. 2D illustrates an EPFT 252 in which the previously described backbones have suitable geometry 260 that allows them to interlock with other EPFT 258. Although the illustration pictures the interlocking profile 260 as hooks one skilled in the art may appreciate that they may take a variety of shapes. Furthermore, an EPFT may have one or a plurality of interlocks which may be designed to interlock with other EPFTs as well as with other external structures such as the load being moved by an actuator or the feature being sensed by a sensor for example. As with all EPFTs described so far, this embodiment has an inner electrode 256 that defines an active volume in conjunction with the outer compliant electrode 206.

One skilled in the art will appreciate that the EPFTs so far described as way of example have a cross sectional profile in which the shape of the electroactive polymer is regular, however the scope of the present invention encompasses EPFTs with any inner or outer polymer surface geometry as suitable embodiments for the present invention.

As in the case of EPFT 200, for all geometries described so far electrode 206 may define a plurality of active transduction volumes across the length of the EPFT. Furthermore, although regardless of the cross section, a lengthwise straight EPFT is preferred, other geometries such as constant pitch helices, variable pitch helices, alternating helices and curled helix with or without rolling cross sections are considered to be suitable embodiments of the present invention.

Multicore EPFTs. Another suitable embodiment of the present invention encompasses a class of cross-sectional geometries that include multiple cores 216, such as the ribbon EPFT 212 illustrated in FIG. 2E in which a single electroactive polymer continuum 214 has a plurality of internal electrode cores 216 aligned so as to produce a high-aspect ratio cross section or ribbon. In one embodiment all internal cores 216 may be electrically connected, by external means, therefore all creating an active transduction volume between 216 and outer compliant electrode 206. In another embodiment cores 216a, 216b and 216c and so forth may be electrically independent and thus used to create additional active transduction volumes between each core and also between each core 216 and outer compliant electrode 206. As way of example applying a voltage to core 216a while maintaining all other cores and outer compliant electrode 206 at ground would allow to control the flexing of the EPFT around vector 220 where as applying high voltage to core 216b while maintaining the rest at ground would cause the EPFT to flex around vector 222. Applying high voltage to all inner electrodes 216 while maintaining 206 at ground would cause the EPFT to actuate in a similar manner to that of 200. As in the case of EPFT 200, electrode 206 may define a plurality of active transduction volumes across the length of the EPFT. It should be noted that for this type of EPFT the preferred cross-sectional embodiment is that of circular inner cores 216 with equal radii, such that a uniform thickness of the electroactive polymer continuum 214 is achieved. However, other suitable embodiments may include any cross sectional geometry that provides the desired functional results. Furthermore, as the case of the 200 EPFT lengthwise straight sections are preferred but also constant pitch helices, variable pitch helices, alternating helices and curled helices may be applicable. Finally, in some embodiments each or a combination of the cores 216 may serve as one or a combination of an actuator, sensor or generator.

FIG. 2F illustrates a multicore EPFT 224 in which a plurality of inner electrode cores 226 are bundled around the centroid of the cross section. In one embodiment all internal cores 226 may be electrically connected, by external means, therefore all creating an active transduction volume between 226 and outer compliant electrode 206. In another embodiment cores 226a, 226b and 226c and so forth may be electrically independent and thus used to create additional active transduction volumes between each core and also between each core 226 and outer compliant electrode 206. As way of example applying a voltage to core 226a while maintaining all other cores and outer compliant electrode 206 at ground would allow control of the flexing of the EPFT around vector 262 where as applying high voltage to core 216b while maintaining the rest at ground would cause the EPFT to flex around vector 264. Applying high voltage to all inner electrodes 226 while maintaining 206 at ground would cause the EPFT to actuate in a similar manner to that of 200. As in the case of EPFT 200, electrode 206 may define a plurality of active transduction volumes across the length of the EPFT. In this manner, an EPFT such as 2F may be controlled to bend in any direction and stretch and contract.

For this type of EPFT the preferred cross-sectional embodiment is that of circular inner cores 226 with equal radii, such that a uniform "thickness" of the electroactive polymer continuum is achieved. However, other suitable embodiments may include any cross sectional geometry that provides the desired functional results, such as cores with different cross sectional geometries and sizes as well as various geometries for the overall polymer outer surface. Inner cores 226 need not be located around the cross sectional centroid and their placement need not be symmetrical. Complex geometries in which the cross section of one or more cores 226 completely or partially surrounds other cores are also suitable embodiments that may provide great control versatility. An extreme example of such embodiment viewed in cross section may be comprised of an inner electrode core, surrounded by electroactive polymer in turn surrounded by another middle electrode core in turn surrounded by another electroactive polymer finally surrounded by an outer compliant electrode. This, in such a way that the middle electrode may simultaneously develop an electrical field between the inner core and outer electrode.

FIG. 2G illustrates a multicore EPFT 268 in which a ribbon-like EPFT now completes a closed polygon. This EPFT comprises polymer 270 with multiple electrode cores 274 and an outer compliant electrode 206. Additionally, electrode 272 may be another electrode core (sealed full of incompressible fluid), or it may be analogous to outer compliant electrode 206 which may be a surface or volumetric electrode. EPTF 268 may be used for building more complex structures in which each transducer has the capacity to pitch, roll, yaw and extend and contract by choosing the right set of voltages to apply to each of the eclectically independent cores. EPFT 268 is shown as means of example as someone skilled in the art will appreciate that many other cross sectional profiles with a plurality of cores arranged around a plurality of central cores may serve as a suitable embodiment of this class of EPFT and may provide great control flexibility as well as desired structural support.

As someone skilled in the art may appreciate, the above-mentioned geometries serve to exemplify the invention but are by no means a complete description of the possibilities. Geometries previously described for single core EPFTs, such as backbones and interlocking are also applicable to multi-core EPFTs. Additionally, combinations of the geometries such as a ribbon EPFT with an end termination as a bundle or closed ribbon may be suitable. Furthermore, in all the above-mentioned multicore embodiments of this invention, the inner cores may be either electrically connected by external means to act as one single core, or they may be independently controlled as units or sets to provide added versatility.

In some embodiments suitable for the present invention, the active transduction volume defined by each of the inner electrode cores, together with other inner electrode cores or the outer compliant electrodes, may serve as one or a combination of an actuator, sensor or generator. Furthermore, for all cross-section geometries possible a lengthwise straight EPFT is preferred, however other lengthwise geometries such as constant pitch helices, variable pitch helices, alternating helices or a curled helix with or without rolling cross section may be also provide suitable embodiments for this invention.

Multicomponent EPFTs. FIG. 2H illustrates the cross sectional view of two exemplary embodiments 276 and 278 in which an EPFT active transduction area, defined between inner electrode 282 and outer compliant electrode 206, is constituted by a plurality of materials such as 280 and 284. In one embodiment material 280 may serve as a structural element to completely encapsulate material 284, therefore allowing the use of fluids, gels, polymers, powders and the like. as suitable constituents for component 284. This is very advantageous as it allows full tailoring of the mechanical and electroactive properties of the active transduction volume. As way of example, a structural elastomer 280 with poor electroactive properties (high modulus of elasticity and low dielectric constant) yet very high dielectric strength may be chosen to encapsulate a low viscosity highly dielectric fluid or electrolyte 284. In doing so the overall cross sectional area of the stiff structure 280 is diluted by the area occupied by the fluid 284 thus resulting in an overall very electroactive material. In other words, the elasticity, viscosity, dielectric constant and dielectric strength of the EPFT may each be varied independently by choosing the appropriate materials and their ratios.

In one embodiment, the material 284 may be composed of an incompressible fluid sealed at the ends to increase axial response of the transducer or not sealed to enhance a radial response. In such embodiment, the actual compression of component 284 may be harnessed as means of pumping such a fluid or gas.

In another embodiment the material 284 may be a compressible fluid or gas whose ends are sealed or opened. In another embodiment material 284 may be a polymer, a gel, or foam.

In another embodiment 294, illustrated in FIG. 2I material 286 may be a solid possibly of elastomeric behavior, or a fluid, layered such that material 286 completes an entire perimeter through the cross section as does material 280. A plurality of layers made out of a plurality of materials may then be a suitable embodiment.

In another embodiment the internal compartments, may each be made of a plurality of materials, or mixtures of materials at different concentration. In another embodiment, geometries of EPFT previously described such as backbones, interlocks, and the like, may be composed of other materials. In yet another embodiment an EPFT may be comprised in such a way that a perimeter around inner electrode 282 is closed by a plurality of materials. This last embodiment may be referred to as an island on a pie.

FIG. 2I (left, middle, right) illustrate others embodiment such as 290 and 292, in which a layered cross section is comprised of interrupted layers so as to form pockets of material 284. As one skilled in the art will appreciate, each pocket may be composed of a different material if such a design would prove advantageous and the choice of material could be any of a solid, gel, elastomer, fluid, and the like.

In one embodiment the compartments made by a second or more materials such as 284 extend throughout the entire length of the fiber. Yet in another embodiment compartments 284 are intermittent and may follow a regular pattern or a random distribution. The intermittancy pattern may be one of alternation or progressive rotation between material compartments, or it may follow a predefined pattern that may even be used to encode, store or display information. Furthermore, for all cross-section geometries and choice of materials possible a lengthwise straight EPFT is preferred, however other lengthwise geometries such as constant pitch helices, variable pitch helices, alternating helices or a curled helix with or without rolling cross section may also provide suitable embodiments for this invention.

In another embodiment, a plurality of inner cores or secondary materials may be arranged in such a way as to twist or form a helix within the main polymer continuum. Such twisting may be done in pairs of islands (or more) and may not necessarily imply the twisting of the entire EPFT cross sectional area but it may be relative. As way of example, in the embodiment illustrated by EPFT 292 in FIG. 2I each pair of secondary material islands 284 may form a helix yet the overall cross section of the EPFT is straight.

Finally, although outer compliant electrode 206 has mostly been described as completely covering the entire cross-sectional perimeter of an EPFT, in another embodiment, a surface electrode 206 may be split around the perimeter of an EPFT into a plurality of electrodes therefore allowing the definition of further customizable active transduction volumes. In other words, another suitable embodiment in line with the present invention is one in which a single outer compliant electrode 206 does not cover the entire perimeter of an EPFT. Such electrode, may cover part of the perimeter or there may be more than one outer compliant electrode covering each a fraction of the perimeter. Such patterned electrodes may be activated simultaneously or independently to achieve bending and twisting effects as described earlier.

As the skilled person may appreciate, the above-mentioned geometries are presented only as means of example and in no way shall be considered to encompass the full scope of the invention. Any combination of one, some or all of the described class of geometries may be considered a suitable embodiment of the present invention.

Geometry—Bundled Electroactive Polymer Fiber Transducers. A plurality of EPFT may be bundled together to gain strength in numbers, focus force production on a region, achieve stronger actuation, provide a constrictive force or pressure and in general allow further customization of the desired electromechanical properties and effects of such a device. Bundling may simplify fabrication as it allows the production of a single standard type EPFT such that all necessary customization may be achieved at the bundling stage; by choosing, the number, configuration and length of such a bundle. A plurality of bundles can also be provided, such as bundles of bundles, as provided herein.

A Bundled EPFT (BEPFT) such as BEPFT 300 illustrated in FIG. 3A is comprised of a set of EPFTs 302 coupled together, mechanically and electrically, by Bundle Caps such as 304 and 306. One skilled in the art will appreciate that EPFT bundle 302, in accordance with the present invention, encompasses any possible combination of type, size, number, length and operation modality of EPFTs. Bundle 302 may also comprise a plurality of any imaginable electroactively passive elements such as wires, monofilaments, coiled springs, cables, and tubes to name some possibilities. These may be added to establish a boundary condition such as limit extension, prevent sagging, bias the overall elastic constant of the bundle, dissipate heat or light, transport fluids and chemicals, provide means to deliver electrical charge or in general alter any desirable feature of the BEPFT. Such a bundle may also include planar electroactive polymer films such as those described in U.S. Pat. No. 6,781,284 by Pelrine, et al. In other words, a BEPFT such as 302 need not be exclusively comprised of EPFTs. Furthermore, individual EPFTs may have different initial conditions within the BEPFT; such a variable initial condition may be that of the prestrain of each individual EPFT.

A bundle such as 302 may contain one or a number of EPFTs that may exceed quadrillions of EPFTs. This, for embodiments in which EPFTs with very small cross-sectional area are bundled to achieve an overall BEPFT with a large cross sectional area. As means of example, a BPFT with a cross sectional area of 10×10 cm^2 comprised of EPFTs each with a cross sectional area of 100×100 nm^2 would have more than 10^14 EPFTs. One skilled in the art will appreciate that the scope of the present invention shall not be restricted to any number of EPFTs or passive elements per BEPFT.

BEPFTs can be parallel, convergent, pennated circular or twisted and braided.

Parallel BEPFTs. In one embodiment illustrated in FIGS. 3A, 3B and 3C, BEPFT 300 is comprised of a plurality of EPFTs 302 bundled together in such a way that all EPFTs run parallel to each other. Both ends of the device comprise a cap 304 and 306 respectively, which may have the function of coupling mechanically or electrically or both, the individual EPFTs in a suitable manner depending on the choice of device. In a parallel BEPFT the transverse cross sectional area within the bundle 302 is constant throughout the length of the device. In one embodiment, in which all similar EPFTs are bundled under the same pre-straining conditions, the overall strain and stress of the device is equal to the strain and stress of each individual EPFT. In another embodiment, in which similar EPFTs are prestressed differently during bundling, the stress of the entire device will be distributed to each individual fiber according to its initial condition. Nevertheless, in this embodiment, the strain of all fibers will be the same in relation to the initial condition.

For parallel BEPFT, the overall cross section of the device maybe any suitable geometry, as means of example, FIG. 3A illustrated a BEPFT 300 with circular cross section, FIG. 3B illustrates a BEPFT 308 with rectangular cross section and FIG. 3C illustrates a BEPFT 310 with an oval cross section. Furthermore, suitable cross sections of the fiber bundle 302 in accordance with the present invention may be a circumference, a triangle, a square or any other regular or non-regular polygon. Cross sectional areas resembling ellipses or other high aspect ratio shapes provide suitable embodiments for flat bundles. Cross sections where the individual EPFT occupy rings or other perimetral shapes are also suitable embodiments and may provide one or more hollow spaces within the BEPFT bundle 302. As means of actuation, such inner spaces may be used to include structural elements to attach the device for actuation, sensing and energy generating or may serve to pass wiring.

Another suitable embodiment, in accordance with the present invention, for parallel BEPFT is a loop such as illustrated in FIGS. 3H, 3I and 3J, where one or a plurality of caps 304 are coupled to a set of EPFT 302 that loop around to themselves. A looped BEPFT is considered parallel to the extent that the cross section formed by the individual EPFT is constant. Suitable cross sections are as described above; however hollow profiles may require the use of separator to maintain the cross section. A looped BEPFT may be wrapped around the perimeter of an object for transduction. Potential uses of this configuration include a tourniquet, form fitting clothes, and valves. In one embodiment a looped BEPFT may have one single cap such as BEPFT 322 yet in another embodiment it may have a plurality of caps along the perimeter of the loop such as BEPFT 324. In a multicap embodiment of a looped BEPFT the exception to the constant cross sectional area may be present as the individual EPFT may first diverge from one cap to the next and then converge again. In such a device a section between caps may be parallel and another section convergent or divergent. For an embodiment where a single cap 304 is present, such cap may be singular in the mechanical sense but dual in the electrical sense as it may provide access to both ends of the individual EPFTs. In another embodiment the single cap 304 may be mechanically and electrically singular. Finally, BEPFT 326, as illustrated in FIG. 3J, may be considered parallel or convergent depending on the ultimate shape that the bundle 302 achieves when its distal end is attached or wrapped around the component to which transduction will affect.

Convergent BEPFTs. In another embodiment, BEPFTs 312 and 314 such as those illustrated in FIGS. 3D and 3E respectively may be bundled with a bundle 302 varying cross sectional area, such that effectively a convergence of EPFTs 302 occurs at a point or region 306. In one embodiment, the overall cross section geometrical shape may be any one of the previously described and it remains constant but is scaled in size throughout the length of the device. In another embodiment, one end has one geometrical shape different from the other. As way of example the pectoral muscles have a flat cross section on the medial side of the body and converge into a more cylindrical shape on the lateral side of the body. It is important to note that for convergent embodiments, the number of EPFTs 302 is consistent throughout the length of the device, thus it is the spacing between individual EPFTs that becomes smaller to allow for the convergence. Finally, although this embodiment has the advantage of being able to pack a great number of EPFTs in a constrained space and focus their stress on a single convergent point, the angle that the individual EPFTs make with the line of action compromises slightly the mechanical advantage of each EPFT. Furthermore, and because of the same angle, the overall strain of the BEPFT device is smaller than that of individual EPFTs. This last point may prove beneficial for sensing and generation applications but disadvantageous for actuation.

Another embodiment in which EPFTs 302 converge may include a plurality of caps 304 on the divergent side such as illustrated in FIG. 3E as BEPFT 314. Such an embodiment may be suitable for BEPFTs that can act across two joints, such as the human biceps, on which one of the points of attachment occurs across the elbow joint yet the other spans the elbow and the shoulder, thus providing greater mechanical advantage throughout the entire rang of motion of the joints. The cross section of each of the individual bundles 302 may be either parallel or convergent.

Pennated BEPFTs. Pennated muscles are ubiquitous in biology and therefore suitable embodiments of the present invention illustrated in FIGS. 3F and 3G. In a pennated BEPFT 316 the individual EPFTs 302 act at an angle 318 from the line of action of the caps 304 and 306. By setting the EPFT bundle at an angle with the line of action of the BEPFT device, a larger cross sectional area may be achieved within a given space and thus a larger number of EPFT 302 employed, which results in greater force production. However, as described earlier for convergent BEPFTs, action across an angle has implication for the mechanical advantage and the strain. Pennated BEPFT may have single pennation as in FIG. 3F or be bipennated as illustrated in FIG. 3G. Pennation may be combined with parallel or convergent geometries when one considers the depth of the device.

Circular BEPFTs. One suitable embodiment in accordance with the present invention that may prove advantageous is that of loops of EPFTs such as illustrated in FIGS. 3H, 3I and 3J. As described earlier, a BEPFT such as 322 or 324 may comprise one or a plurality of caps 304, respectively that are coupled to a set of EPFT 302 that overall form a closed loop. Individual BEPFT segments 302 between caps 304 such as illustrated in FIG. 3I may either be parallel or convergent. Furthermore, although this type of closed loop BEPFTs can form a close loop, the individual segments 302 separated by caps 304 may all be electrically independent of each other or continuous. A looped BEPFT may be wrapped around the perimeter of an object for transduction. Potential uses of this configuration include a tourniquet, form fitting clothes, and valves. In one embodiment a looped BEPFT may have one single cap such as BEPFT 322 yet in another embodiment it may have a plurality of caps along the perimeter of the loop such as BEPFT 324. In a multicap embodiment of a looped BEPFT each cap 304 may serve as an electrical access point or as a mechanical point of coupling to an external feature or both. Finally, BEPFT 326, as illustrated in FIG. 3J, may be considered parallel or convergent depending on the ultimate shape that the bundle 302 achieves when its distal end is attached or wrapped around the component to which transduction will affect. For the case of BEPTF 326, the cap 304 may provide independent electrical access to each end of the bundle 302 or it may provide one single point of attachment.

Braided or Twisted BEPFTs. Another interesting embodiment in accordance with the present invention is that of braided, twisted or wrapped BEPFTs such as illustrated in FIGS. 3K, 3L and 3M. Transducer 328 may be wrapped or rolled around a central mandrel, tube or pipe to sense both growth in diameter as well as axial twist. Such a transducer when operating as an actuator may also provide an active squishing pressure on the tube or an axial torque.

FIG. 3L illustrates a braided BEPFT 330. Such braiding may prove to be a very beneficial embodiment in applications where the overall length of the device is very large as it serves to keep the individual EPFT strands 302 together across a very long distance. Furthermore, if one EPFT were to break due to whatever cause, the lose ends would be contained and not run free to tangle. Braided BEPFTs are also one example of bundles of BEPFTs that can be made.

FIG. 3M illustrates a twisted BEPFT 332. In this embodiment, the EPFT bundle 302 may be twisted around itself or around another central core such as a mandrel, rod or torsional or compression spring to name a few possibilities. This embodiment may serve to sense or supply torque as well as linear motion when operating either as a sensor or as an actuator.

FIGS. 3N, 3O and 3P illustrate more specific aspects of BEPFT. In one embodiment, such as illustrated in FIG. 3N, the BEPFT is comprised of one single EPFT wrapped around many times. In this specific embodiment BEPFT cap 304 within BEPFT 334 serves as a point of mechanical coupling between each loop 340 of EPFT 302 and does not serve as an electrical contact to inner electrode 138. Still within this embodiment, cap 306 mostly serves as mechanical coupling but in this case it does provide access to the internal electrode 138 at the ends of the EPFT 342. In this embodiment, external electrical access to each end of EPFT 302 may be independent or coupled.

In yet another embodiment illustrated in FIG. 3O, BEPFT 336 is comprised of cap 304 which serves the same purpose as in BEPFT 334, however, in this bundle 302 is comprised of a plurality of EPFTs, where each may wrap around one or more times. In this embodiment, external electrical access to each end of each EPFT 302 may be independent or coupled; furthermore, sets or combinations of EFPT ends 342 may be electrically connected together.

In yet another embodiment illustrated in FIG. 3P, BEPFT 338 is comprised of caps 304 and 306 in which case both caps serve the same purpose as both provide mechanical coupling between EPFT fibers 302 as well as electrical access to the EFPT ends 342. In this embodiment, external electrical access to each individual end of each individual EPFT 302 may be independent or coupled; furthermore, sets or combinations of EFPT ends 342 may be electrically connected together.

The embodiments described and illustrated through 3N, 3O and 3P are provided only for purposes of example and the scope of the present invention includes any possible combination of these features. These, apply to any possible combination of bundle types and geometries described through FIGS. 3A to 3M Finally, another suitable embodiment for a BEPFT is a woven or non-woven textile such that a relatively large surface may be covered by a sheath of EPFT cloth for sensible or conforming clothes, just to name one application. In such embodiment the fixing and or electrical caps may be at the edges of the textile but they may also be embedded within it. A plurality of caps embedded at regular or irregular intervals throughout the surface of the textile would provide means of mechanical fixation and electrical control to specific regions of the cloth. This in turn, may be a very practical embodiment to control the gestures of an animatronics face, conforming clothes that continuously massage the wearer and all sorts of imaginable sex toys. Such a textile may also be useful in application where it is desirable to change the surface texture or pattern on command. Such a change of texture may change the aerodynamic of hydrodynamic drag coefficient of an airfoil and thus be used to control direction of an aircraft or vessel. Such a change in texture may also change other optical property such as color or translucence thus making it an enabling technology for camouflage on demand. The textile may further be covered by a tiling of small radar shields in such a way that the direction to which the incoming radar beam is deflected may be controlled on command. One skilled in the art may appreciate that this is similar to biology's ability to raise hairs and feathers.

Within the scope of BEPFTs it should be noted that specially designed EPFTs may be comprised of materials (be it the electroactive polymer 116 or the core electrode 138) that undergo a predictable physical change in shape (i.e. expand or contract) or a change in its electrical properties under different conditions such as changes in pressure, temperature, PH, and the like. This feature may be exploited to include additional sensitivity characteristics to a BEPFT. For example, an EPFT in which polymer 116 changes its resistivity in response to a change in temperature could be bundled with non-temperature sensing EPFT fibers and thus provide feedback about the temperature state of the bundled fibers 300. Expanding on this idea, a bundle could incorporate multiple sensing modality EPFT that sense different environmental conditions that the bundle experiences such as changes in temperature, pressure and chemical environment, and the like. Taken to the extreme, and as way of example, a set of EPFT fabricated out of specific polymers known in the prior art that change resistivity in response to specific olfactants may be bundled together to produce a very compact and versatile transducer capable of 'smelling' or chemical detection. In one embodiment each sensing EPFTs would have independent electrical connections, yet in other embodiment, connection to individual fibers may not be practical and thus a statistical approach may be used to determine the environmental state to which a BEPFT is subject.

Those skilled in the art of biology and anatomy will appreciate that the scope of the present invention encompasses any such configuration or embodiment of BEPFTs such that they mimic the morphology and functionality of biological muscles throughout their entire range of shapes and applications. Some of these will be described ahead and may include, for purposes of example, sphincters, tongues, trunks, hearts, digestive tracts, and the like.

End caps can be used to serve as the point of electrical and mechanical connection between EPFTs and external components. Caps are the point at which a plurality of individual EPFTs are coupled to produce a bundled EPFT (BEPFT).

FIG. 4A illustrates a cross section cut, along the axial direction at 426, of the specifics of a BEPFT 400. FIG. 4B illustrates same BEPFT 400 cut in a radial direction at 424. These two figures together will serve as means of example to illustrate the components that comprise a most generic end cap 402 and its roll as a component of BEPFT 400. BEPFT 400, as illustrated in this example is composed of a plurality of individual EPFTs 420, each with an inner incompressible compliant electrically conductive core 422. In this example cap 402 serves several purposes: 1) to mechanically couple the individual EPFTs 420 together such that they behave as a coherent bundle. 2) To mechanically couple the whole coherent bundle to a feature external to the BEPFT such that motion of the external feature moves together with the bundle and thus may be actuated or may actuate on the BEPFT 400. 3) To electrically connect all individual EPFT cores 422 together. 4) To provide a region of electrical connection 404 between all internal cores 422 and an external electrical circuit. 5) To provide a region of electrical connection 412 between one outer compliant electrode 416 common to all individual EPFTs 420 and an external electrical circuit. 6) To provide a mechanical coupling of a common sheath 418 to enclose the common outer compliant electrode 416. 7) To provide access for fluid transfer to the common outer compliant electrode 416 through port 410. 8) To provide access for fluid transfer to the internal core electrodes 422 through port 406. Additionally, a cap 402 may also serve to exchange heat, light or electromagnetic radiation with the individual EPFTs and it may itself be used as a part or tool during the manufacturing process.

In particular, the electroactive polymer sheath of each individual EPFT 420 is coupled mechanically to the main body 408 of cap 402. This coupling may be achieved by adhesion, welding, chemical or thermal bond during a curing process or simply mechanical pressure. The cap's main body 408 is preferably made out of an electrically insulating material such that it poses a very high resistance path between electrical contacts 404 and 412. The main body 408 may have permeable ports such as 410 that allow access to the common outer compliant electrode 416 and may also have ports (not shown) that allow direct access to internal core electrodes 422. Such ports may serve to transfer fluid during fabrication, as means of heat exchange or to change the chemical environment of the EPFTs. Port 410 may be sealed by an external plug or valve once the desired fluid transfer has occurred or it may be connected to a source of new or recalculating fluid.

Some materials suitable for main body 408 include, but are not limited to, pourable urethanes, silicones, acrylics, epoxies, fiberglass, ABS, and the like. Any number of electrically insulating materials known in the art are suitable for use in the main body. Other examples of suitable main body materials include injection moldable compositions, such as PVDF and PVC, which are useful in electrical applications.

Main body 408 of cap 402 is also coupled mechanically to electrical contacts 406 and 412. This coupling may again be achieved by adhesion, welding, chemical or thermal bond during a curing process or simply mechanical pressure. Main body 408 of cap 402 is also coupled mechanically directly (not shown) or through electrical contact 412 (as shown) to enclosing sheath 418. Once more, this coupling may be achieved by adhesion, welding, chemical or thermal bond during a curing process or simply mechanical pressure. The main body 408 is essentially the glue that holds all other components of the cap 402 together and binds them mechanically while maintaining suitable electrical insulation between the inner electrodes of EPFTs 420 and their outer compliant electrodes. One skilled in the art will appreciate that some of the described attachments are provided just as means of example and that within the scope of this invention they may be made indirectly through other components such as the indirect coupling shown between main body 408 and enclosing sheath 418 through outer compliant electrode electrical contact 412.

Electrical contact 404 provides an electrical current path to access the internal core electrodes 422 of all EPFTs 420 and thus means of electrically connecting these to an external electrical circuit. In a preferred embodiment, electrical contact 404 is made out of a material with low electrical resistivity. Such a material may be one of a metal, a carbon, a conductive polymer or a combination of these, including a non-conductive polymer with high concentration of carbon or other conductive particles to achieve conductivity.

In one embodiment, electrical contact 404 may have access port 406 as shown in FIG. 4A to allow for access and fluid transfer to internal core electrodes 422. The purpose of the port may be to transfer fluid during fabrication or operation, as means of heat exchange or to change the chemical environment of the EPFTs. In such an embodiment, overall incompressibility can be achieved by external means, which could in one embodiment be external valves or plugs. Such a valve may be open to allow fluid transfer and then closed again. In other words, even though the inner electrodes 422 may be comprised of a flowing fluid, the overall amount of fluid and thus the volume may be maintained constant by external means the ensure that the amount of fluid delivered on one end is equal to the amount of fluid removed at the other end. In yet another embodiment, electrical contact 404 is non permeable and serves to completely seal in the enclosed inner electrodes 422.

Electrical contact 404 may have a dual functionality, as it may also be, in one embodiment, the point of mechanical attachment to the desired feature or load to be transduced. In this way, contact 404 serves as an electrical and mechanical connection.

The specific geometry of cap 402 may be such that there is an inner compartment 414 through which electrical contact 404 transfers electrical charge to inner electrodes 422. Such compartment is necessary and serves as a manifold for the embodiment in which contact 404 is permeable. In yet another embodiment in which contact 404 completely seals the inner electrode fluid 422, compartment 414 may serve as an equalizing cavity to ensure that the individual inner cores 422 of each EPFT form one single volume. In this way, compartment 414 serves as an equalizing chamber by which the pressure of the entire fluid volume 414 and 422 is maintained. In yet another embodiment where compartment 414 is non-existent, individual EPFTs can be in electrical contact with each other, through electrical connection 404, but each will have its own independent fluid core 422.

In one embodiment outer compliant electrode 416 is common to the entire plurality of EPFTs 420 and can be made out of compliant material such as those described by Pelrine et al. in U.S. Pat. No. 6,781,284, the section titled "5. Electrodes" at cols. 19-25 is incorporated by reference herein. In yet another embodiment, electrode 416 may be composed of a conductive fluid (it need not be incompressible). Such fluid may be enclosed by outer sheath 418 or may be part of a greater pool of fluid shared across a plurality of BEPFT. In one embodiment, where fluid 416 is enclosed by sheath 418, access ports 410 may be used to fill the cavity during fabrication, to transfer fluid for purpose of heat exchange or to change the chemical environment of the EPFTs. For such embodiment, sheath 418 may be made out of a large set of materials as long as the desired mechanical behavior is achieved. Sheath 418 need not be made of an elastomeric, or electroactive material as it does not form part of the electric circuit and does not need to impose a constant boundary condition. However, sheath 418 can be a thin film capable of successfully containing fluid 416. In one embodiment in which sheath 418 is not of an elastic nature, it may further serve as an extension limiter and may allow contraction by curling into itself analogous to an accordion.

In one embodiment sheath 418 is made of, or coated, with a biocompatible material that allows implantation of the entire BEPFT 400 into a living organism. In such embodiment, sheath 418 may be extended to fully enclose the entire BEPFT 400 or otherwise all external surfaces of the BEPFT be made or coated with suitable biocompatible materials.

In another embodiment sheath 418 may be made of a temperature sensitive material (or a material capable of indicating the actuator's internal or environmental conditions such as pressure, PH, temperature, and the like) that may change color to indicate that operating temperature of the actuator.

In one embodiment, fluidic access ports such as 416 and 410 may be selectively permeable, through a membrane or compound to a specific class of ion such as Na, K, Ca, Cl, Ba, and the like, or to other chemical compounds. Furthermore, these ports and sheath 418 may also be impregnated with biomorphic ion channels and pumps so as to naturally help establish a chemical concentration gradient across themselves.

Finally, one skilled in the art will appreciate that cap 402 illustrated and described through FIGS. 4A and 4B is presented here only as means of example in its most general embodiment and that significant variations in the choice of materials and geometries are to be considered within the scope of the present invention. In particular, the generalities of caps 402 described here apply to any suitable BEPFT embodiment previously described, and is not limited by the number, size or scale of EPFTs that comprise a BEPFT.

For simplicity FIG. 4C illustrates a single capped EPFT, but the same principal applies for a BEPFT. In this embodiment the coupling mechanism 404, which can be used for electrical and mechanical connections does not have an access port to the EPFT conductive core 422. Instead connection 404 is in direct contact with 422.

FIG. 4D is an extension of FIG. 4C. In this embodiment the compartment 414 of electrically conductive fluidic material has been added to illustrate that there are several ways to achieve an electrical connection to the EPFT conductive core 422.

FIG. 4E is another extension of FIG. 4C. In this embodiment, the coupling mechanism 404 achieves a better electrical connection with the EPFT conductive core by using a pointed surface geometry to penetrate into the core 422 of the EPFT 420, thus exposing a larger surface area.

FIG. 4F highlights another method in which the cap and coupling mechanism can be applied. In this embodiment, the cap 408 is made of two threaded parts that screw together. It should be noted, a threaded screw connection is shown here by means of example only but it is not the only suitable method to join the two parts. Glue, friction fit, heated bond, tape, clip-ons, hooks, and the like, are other methods for joining these components. The advantage of the capping method illustrated in FIG. 4F is that the coupling mechanism 404 can be applied, capped and sealed after the EPFT core 422 or the compartment has been filled with conductive material.

FIG. 4G highlights a method in which the electrical connection between the coupling mechanism and the EPFT conductive core 422 can be controlled by incorporation of an additional substrate 428. There may be situations where one or a plurality of EPFTs in a BEPFT undergo electrical breakdown and allow charge provided by the coupling mechanism 404 to flow directly to the outer compliant electrode 416 in a short circuit. In which case the entire BEPFT would be disabled. To resolve this problem a substrate with fuse like properties 428 can be place between the EPFT conductive core 422 and the coupling mechanism 404. It is important to note that in such an embodiment there should not be an equalizing compartment 414 as independent electrical access to each fiber is desired. To expand on this idea, the fuse can be a fuse-like polymer, ceramic membrane, and a MEMS fuse block, to name a few. The fuse would have the property that when there was a short circuit between the inner and outer electrode in one or a set of EPFTs, as evidenced by exceeding a current threshold, the electrical connection leading to the short would be broken. In one embodiment the connection would permanently be broken while yet in another embodiment the discontinuity can be present after a brief period of over-current and would return to its initial condition once the over-current is removed. In this way, by electrically isolating the short-circuit, the rest of the EPFTs within the BEPFT would still be capable of holding an electrical field and thus serve as actuators. This technique endows a BEPFT with great reliability as an embodiment with a large number of EPFTs would maintain its overall performance even as a few EPFTs undergo dielectric breakdown, providing for a much more gracious form of failure and removing a lot of strain from the voltage supply.

It should be noted that another method for eliminating a short between the inner and outer electrode would be to use conductive materials 422 that solidify when an electrical current of a certain magnitude is passed through, and in such process reduce their conductivity. In this way, a dielectrically broken fiber would plug up immediately and allow the BEPFT to continue working as an actuator.

In yet another embodiment also illustrated in FIG. 4G, substrate 428 may be one of a Silicon chip connected through a MEMS contact array or through a BGA packaging to both the electrical contact 404 and the inner cores 420 of the individual EPFTs. Such a chip 428 may receive one bulk source of power from 404 and 412 and contain internal circuitry, laid on it through standard chip manufacturing processes, as well as a control port, such that the internal circuitry was capable of directing charge and sensing the state of each individual EPFT. Such circuits may include passive elements, PN junctions, FET or BJT transistors. Such chip may include higher level processing elements, such as a microcontroller or processor as well as the internal driving components.

FIG. 4H illustrates apart from the cap one possible geometry for the coupling mechanism. As has already been discussed, the coupling mechanism 404 could have a through port 406 to provide direct access to the inner conductive core.

FIG. 4I illustrates another possible geometry for the coupling mechanism that takes on the form of a ball socket. In this case, contact 404 serves as a mechanical and electrical connector such that the BEPFT could be snapped or locked into position. FIG. 4J illustrates another possible geometry for the coupling mechanism where the threaded end of connector 404 can be used to screw or anchor the BEPFT in place, also serving as a mechanical connector. FIG. 4K illustrates another possible geometry for the coupling mechanism where connector 404 is shaped as a hook and could be used to latch the BEPFT in place. FIG. 4L illustrates another possible geometry for the coupling mechanism where an eye-hole in connector 404 may be used to tie, pin, or anchor the BEPFT in place. It should be noted that one skilled in the art will appreciate that coupling mechanism illustrated and described in FIGS. 4H through 4L are only as means of example in its most general embodiment and that significant variations in the choice of materials and geometries are to be considered within the scope of the present invention.

FIG. 4M illustrates that the fuse-like material or semiconductor substrate 428 discussed in FIG. 4G can be a patterned or homogenous membrane. Individual or groups of EPFTs can be in contact with different fuses that are patterned on the membrane 428. In this way, if one or more fibers shorts the circuit between the inner and outer electrode, the patterned fuse pertaining to that fiber or group would stop the electrical connection.

FIG. 4N illustrates the same idea as FIG. 4M, but in this case it should be highlighted that the EPFT can take on different bundling configurations as they may be coupled in a prestrained state such that they contact each other directly and show a slight swelling when released.

FIG. 4O illustrates an embodiment in which a single EPFT is connected to a single electrical insulated wire. In this case, the internal core 422 of the EPFT is in direct contact with the metallic conductor 432 of the wire. The electroactive polymer sheath 420 of the EPFT is in direct contact with the wire insulator 430 and together they are bonded by what in this case functions as a cap 408. In this particular embodiment, such cap 408 may be made out of all the above-mentioned materials plus glues, adhesives, varnishes and paints to exemplify a few. In practicality any material is suitable as long as it is capable of withstanding the mechanical bond and providing suitable sealing and electrical insulation. In this particular embodiment the wire 430,432 is intended to serve as both the electrical and the mechanical coupling between the load or feature to be sensed and the EPFT. This is a particularly interesting embodiment as it may be scaled down to the micro and nano scale. In this embodiment the outer compliant electrode 416 is intended to be a common contact between several other independent EPFTs and is therefore not illustrated in FIG. 4O.

FIG. 4P illustrates an embodiment comprised of that illustrated in FIG. 4O, however; in this case the electrical wire has an additional coaxial conductor. In this embodiment the second pole or coaxial conductor 436 is in direct contact with outer compliant electrode 416 which is in turn encapsulated by an external sheath 418, which is in turn in contact with the outermost insulator of the wire 434 and may be bonded by any suitable adhesive as described before. In another embodiment, the outer compliant electrode 416 may be non-fluidic and thus may require no enclosing sheath 418 but may be left as is. The present embodiment illustrated in FIG. 4P, with its variations included, is of particular importance as it is the preferred embodiment where application of a single self contained EPFT is required.

Figure 4Q:
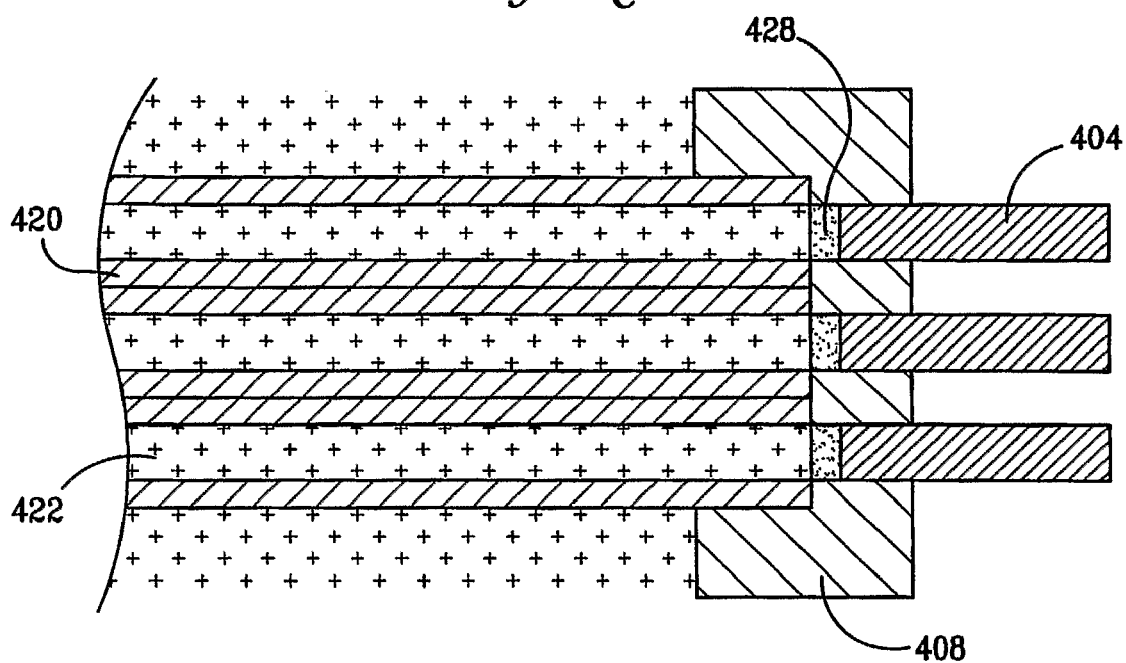
FIG. 4Q illustrates another cap configuration in which there are a plurality of electrical connections, where each connection is independent to one or a reduced set of electroactive polymer fiber transducers (EPFTs)

FIG. 4Q illustrates another cap configuration in which there are more than one electrical connections, where each connection is independent to one or a reduced set of EPFTs. There are many variations on this embodiment and FIG. 4Q merely represents one possible configuration. There may be situations where a bundle of EPFT fibers may have segmented groups that have different functions. For example one group may detect temperature changes, while another may detect pressure or PH changes. In this situation, it would be advantageous if each group had its one electrical connection so that the changes in resistance, capacitance and so forth could be monitored independently of the other EPFTs. In FIG. 4Q, the separate electrical connections 404 are illustrated by adding an electrode to an individual or set of EPFTs. It should be noted that the electrode 404 can also act as a coupling mechanism too and whose specifics may be of one or a combination of the previously described embodiments.

In yet another embodiment, the caps 402 may include other sensing modalities and mechanical properties. These may be analogous to biological tendons, which are the structures through which muscles attach to bones and have compliant properties as well as the capability of sensing force. In particular caps 402 may include built in compliance through the use of elastomeric or elastic materials in their composition, and within these segments strain gauges may be embedded and properly connected to provide an indirect measure of the force or tension to which the device is being subjected. These tendon like structures comprising part of the cap may be of any suitable geometry or length as to allow the BEPFT to be embedded into an application in a manner analogous to the way a biological muscle is attached to a bone across one or more joints. That being the, tendon-like caps may be long enough to be wrapped around a joint.

One skilled in the art will appreciate that the embodiments described here in accordance with the present invention are provided by means of example only and that the scope of such invention may encompass any suitable geometry, combination of materials and configuration such as to provide the desired functionality for the caps. Furthermore, as means of example, in BEPFTs that comprise a plurality of caps not all caps need to be of the same type, size or choice of materials and any possible combination is allowed. Specific examples in which caps had access ports to the fluidic electrodes 416 and 422 have been described but there may also be suitable embodiments in which ports provide access to the direct polymeric substrates such as 420 and 418. In one embodiment, such ports may even be used as an extrusion die or spinneret during the manufacturing of the BEPFT such that the device is capped insitu during its fabrication.

One aspect of the present invention is the method of manufacturing electroactive fibers. In the broadest sense possible, the method for manufacturing EPFTs comprises extruding an electroactive fiber and filling it, separately or simultaneously, with an incompressibly compliant conductive material. In certain preferred embodiments the electroactive fiber and incompressibly compliant material are coextruded. The methods described herein can be used in applications far beyond the scope of EPFTs such as fibers with a heat retaining core to produce thermal textiles, fiber optics or Rhaman fibers, dissolvable fibers full of medicament, fiber bundles to serve as compliant electrophysiological electrodes for massive neurological recordings and stimulation; even fibers whose walls act as the membranes for fuel cells, therefore enabling enormously large surface areas, are feasible through this manufacturing method and should be considered within the scope of coextrusion of fluid filled fibers.

Figure 5A:
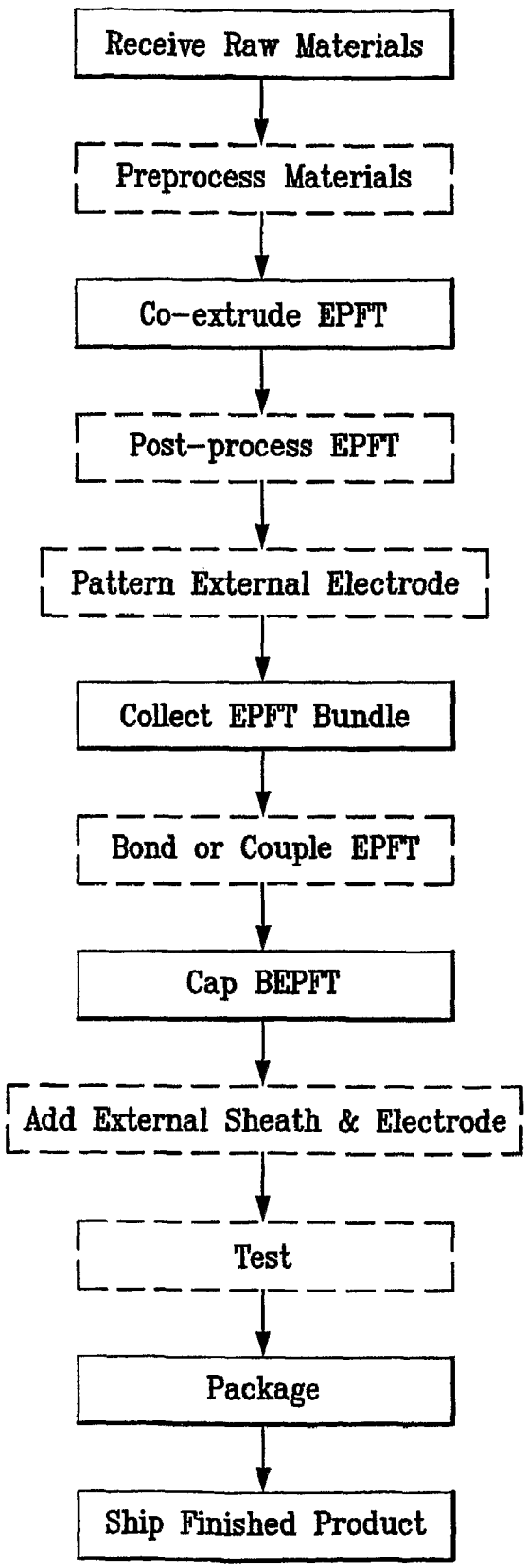
FIG. 5A illustrates a high-level process flow diagram for producing bundles of EPFT, in accordance with the present invention, illustrating a manufacturing process embodiment that incorporates co-extruding electroactive fibers with an incompressibly compliant inner electrode.

FIG. 5A illustrates a high-level process flow diagram for producing Bundles of EPFT, in accordance with the present invention, with the specific manufacturing process of co-extruding fluid filled fibers at its core. As illustrated in the figure the steps enclosed in dashed lines may be bypassed or its end result substituted by another operation at a later stage. Within such process flow, and for the purpose of manufacturing EPFTs, the first step is to receive the material or materials that will comprise the electroactive volume of the EPFT, the inner and outer compliant electrodes and all hardware, consumables and materials necessary for adding suitable caps. These materials are to be preprocessed in preparation for the coextrusion process in one or a series of steps that may include purifying, centrifuging, filtering, dissolving, grinding, mixing, tempering, reacting, and the like, to make sure the desired physical properties are met and the desired degree of consistency and purity is achieved. These processes may or may not be conducted in a clean room environment to guarantee consistency, depending on the size and reliability requirements of the end product EPFTs.

In accordance with the present invention, the coextrusion of fluid filled fibers comprises a source of each of the necessary components of the coextrudate. In the preferred embodiment one of such material sources, the source that supplies the electroactive polymeric material, is a polymer extruder. Such extruder may be a single screw, a double screw or a ram extruder, depending on the requirement of the electroactive polymer to process. Furthermore, such extruder may include any methods for polymer devolatilization, available to one with skill in the art, to assure that the supplied polymer is fully devoid of bubbles or other volatiles that may produce a porous extrudate. Such devolatilization methods may include one of an airlock at the feeding stage of the extruder to maintain a vacuum thought the entirety of the barrel, a vent at some stage of the barrel to aspirate volatiles or a secondary extruding stage coupled through a vacuum chamber to remove volatiles. In another embodiment, the opposite of devolatilization may be desired and special additives may be added to the electroactive polymer and raw materials to produce a foaming effect such that the extrudate is porous in a homogenous manner.

In the preferred embodiment the extruder is such as to process a thermoplastic polymer and thus deliver a uniform melt. In yet another embodiment the extruder is such as to mix and prepare a thermoset polymer solution. Such extruder should comprise a plurality of temperature zones (for heating and cooling) preferably controlled under closed loop to achieve a consistent temperature profile through the process. Such extruder should preferably comprise a closed loop drive system to ensure a consistent screw speed or torque. The output melt or solution may then be driven through a combination of one or more passive mixers, melt pump and mesh station, to fully homogenize the extrudate, remove pressure pulsations and precisely meter the extrudate and trap any impurities left in the material or metallic shavings from the barrel and screw of the extruder. In the preferred embodiment the extrudate output pressure and temperature are constantly monitored and preferably used to close a control loop with the screw and melt pump drive mechanism as well as with the overall temperature profile of the extruder.

In one embodiment, such as to produce EPFTs with multiple components, as described earlier, each component may be delivered by such an extruder. Furthermore, in an embodiment in which secondary component do not span the entire length of the EPFT, servo controlled drive systems for the extruder screw and melt pump may be used to intermittently meter the appropriate amount of secondary extrudate.

Suitable material dosifiers for the fluidic components include traditional pumps, and gravity drips. The fluid being delivered may also pass through one or more temperature zones to either preheat or cool before reaching the next stage of the process. In a preferred embodiment, fluidic metering is done under closed loop control to assure consistent results.

Once all the constituent materials of an EPFT have been properly prepared and processed, the different components come together at the multicomponent coextrusion die or spinneret. This piece of equipment is partially responsible for determining the ultimate shape of the EPFT, in particular it determines the shape of its cross-section. An exemplary bicomponent spinneret is illustrated in FIG. 5B.

Figure 5B:
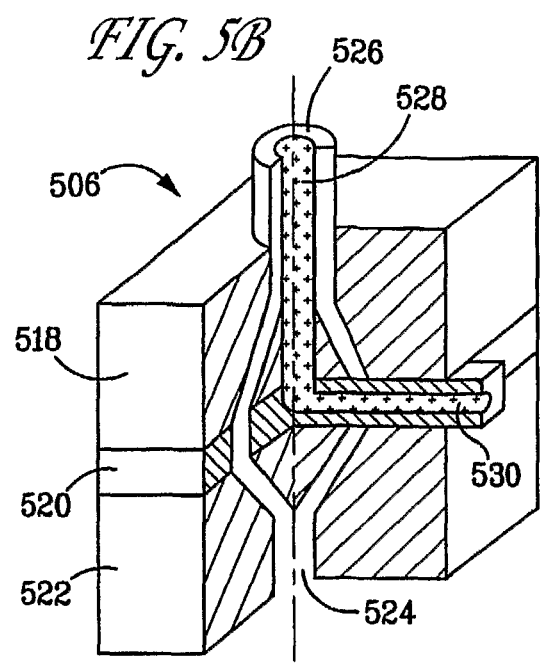
FIGS. 5B and 5C illustrate a top view isometric of several embodiments of coextrusion dies or spinnerets suitable for manufacturing electroactive polymer fibers of the present invention; a cut through section reveals the interior.

FIG. 5B illustrates a top view isometric of a coextrusion die or spinneret 506 with a cut through section to reveal its interior. The function of the spinneret is to deliver both materials with appropriate cross sectional area in such a way that both remain in laminar or near-laminar flow and thus do not get mixed by turbulence, thus enabling the fabrication of polymer fibers with smooth inner and outer walls. Spinneret 506 contains an access port 524 that receives the output melt or solution from the electroactive polymer extruder. This material 526 is to be called the primary material and in this exemplary embodiment will form the sheath of the EPFT. Spinneret 506 has another access port 530 that receives the secondary material 528 to become the inner component of the EPFT. In one embodiment spinneret 506 is comprised of three sections: 522 which is the main input port and is to be coupled to the extruder, section 520 or spider as one skilled in the art appreciates, delivers the secondary material to the EPFT and allows the primary material to flow around it. Section 518 is provides the output of the spinneret and thus may be called the nozzle.

Figure 5C:
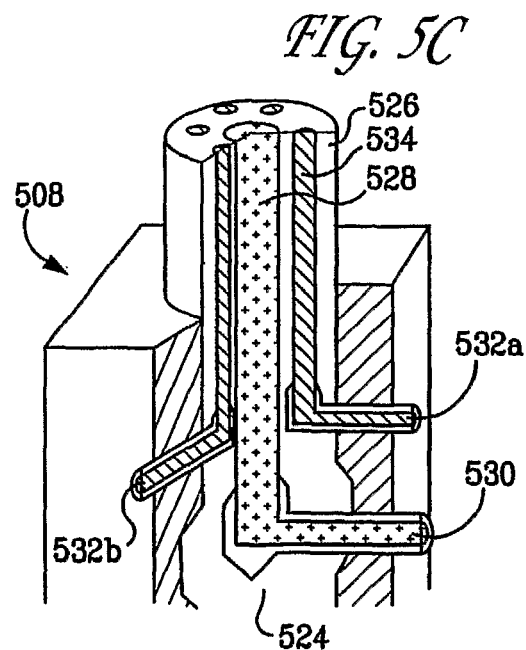

FIG. 5C illustrates a more complex spinneret 508 comprised in essentially the same way as spinneret 506 plus the addition of access ports 532 and a secondary spider (not shown) to deliver a third material 534 to the EPFT such as to produce the illustrated cross sectional geometry.

One skilled in the art will appreciate that the spinnerets illustrated in FIGS. 5B and 5C are provided as examples only, and that one with knowledge in the art may design a specific spinneret suitable for production of any cross section previously described, including EPFTs comprised of a wide diversity of materials in solid or liquid phases.

Figure 5D:
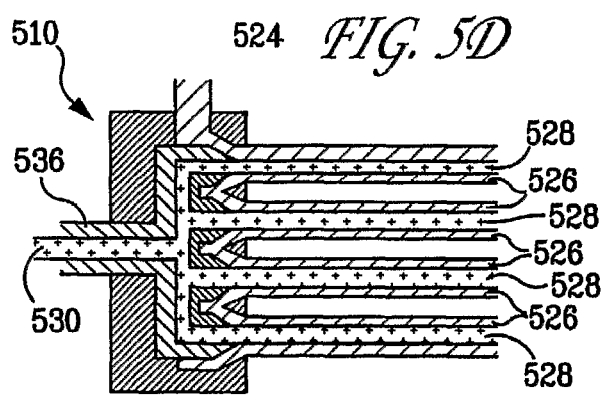
FIG. 5D illustrates an embodiment of a spinneret that can be used as a cap.
Figure 5E:
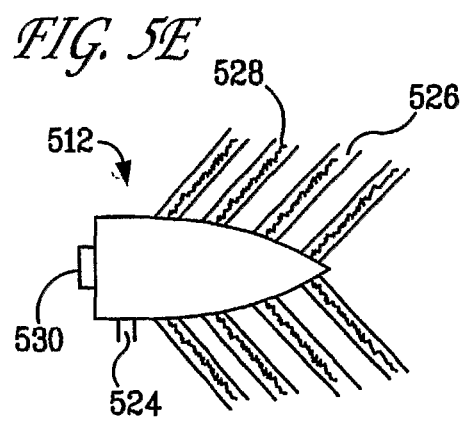
FIG. 5E illustrates an embodiment of a spinneret that can serve as a cap for a convergent or bipennated BEPFT configurations.

FIG. 5D illustrates a Spinneret 510 that can be used as a cap, as previously described. Such cap or spinneret 510 is intended to be mounted at the output of an extruder and then, once the EPFTs are pulled, removed to remain functioning as a cap, as previously described. Specifically, contact 536 serves as an electrical port to provide access to the inner electrode 528, which is supplied through port 530 during fabrication. Port 524 delivers the electroactive polymer during fabrication. FIG. 5E is provided to illustrate an extension of such spinnerets as 510 in which not all EPFTs are parallel and thus serves as a cap for a convergent or bipennated BEPFT configuration.

Figure 5F:
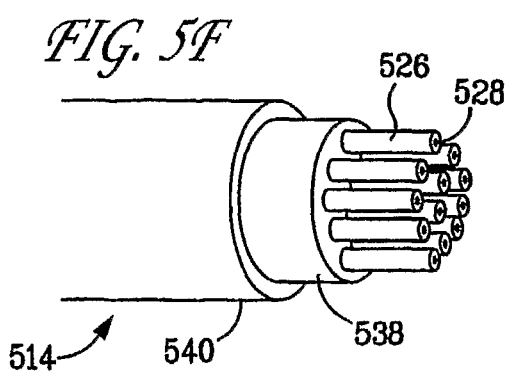
FIG. 5F illustrates an embodiment of a coextruded electroactive polymer fiber comprising a microscale coextruded support sheath surrounding a nanostructured electroactive polymer.
Figure 5G:
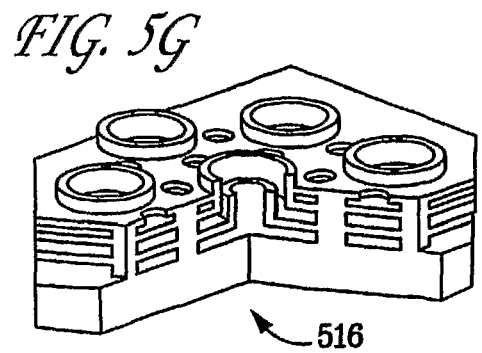
FIG. 5G illustrates a spinneret specifically designed to be manufactured at the micrometer scale that is suitable for creating micron-scale electroactive polymer fibers.

FIG. 5G illustrates one specific example of a spinneret specifically designed to be manufactured at the micrometer scale, through a layering process such as the MEMS process from Microfabrica of Van Nuys, Calif. This figure illustrates a cut through a top perspective view of a multicomponent fiber extrusion die capable of producing a plurality of EPFT strains simultaneously. Additionally, an external support structure material 538 which may later be dissolved, or an outer compliant electrode material may be extruded through the top openings. Through the perimeter of the die, not illustrated here, each of the extrudates would be connected to the appropriate layer. Furthermore, a global sheath 540 may be extruded through the same process, achieving in this way a very small scale BEPFT in one single process.

One skilled in the art will appreciate that the exact geometry of the spinneret does not fully specify the cross section of the EPFT but rather that there is room for further customization. In particular, by varying the pressure and thus the flow rate at which each of the materials arrives at the spinneret, the proportion each material occupies within the cross section may be varied within a range. In other words, for the simplest case of EPFT with a circular inner electrode 528 surrounded by a polymer 526, the specific ratio of the radii may be adjusted by varying the relative pressures between both materials. This may range from a very small relative pressure in the inner core material so as to possess a radius of about/1;100the radius of the sheath 526 to the extreme where the inner electrode has such as surplus of pressure that it may effectively inflate the electroactive polymer sheath 526 as it exits the spinneret nozzle 518. Furthermore, for more complex geometries, such as illustrated in FIG. 5C, in one embodiment spinneret 508 may be rotating around the longitudinal axis of the EPFT such as to produce an EPFT with a helical profile. This is true and possible for all embodiments in which the cross section of the EPFT is not radially symmetrical or homogeneous. One with skill in the art may also appreciate that the spinnerets described within the scope of this invention may contain one or more temperature control zones and may comprise internal melt or solution pressure sensors to aid in achieving a very consistent product.

As mentioned previously, within the scope of this invention is one embodiment in which the extruders or material sources that supply the spinneret may be controlled so as to supply variable or intermittent doses of materials, thus enabling the production of EPFTs with variable cross sectional area throughout their length. Taken to the extreme, a plurality of extruders may be connected through a manifold to a single input port of a spinneret such as 532. In this manner the extruders may alternate in supplying material thus enabling the production of EPFTs with changing material composition throughout its length. This may also be a suitable way of changing the concentration or blends of materials. Finally, within the scope of the present invention is considered the possibility of utilizing special spinnerets such as to enable the application of an electric of magnetic field to the components of the EPFT as they travel through the spinneret. This may provide a way to align the internal dipoles of the electroactive polymer or electrode molecules such as to achieve better electroactive performance.

In one embodiment, EPFTs with very small feature sizes and overall scale on the order of nanometers may be achieved by coextruding the entire EPFT within another material that functions as a support structure such as 538 illustrated in FIG. 5F. This material may be another blend of polymer which may in a later process be dissolved to reveal the nanoscale EPFT. For example, the material may include a microphase separated, i.e., "self-assembled" or "ordered", block copolymer with shear-oriented morphological structures on the nanoscale. Suitable block copolymers are commercially available under the Kraton™ trademark by the Kraton Company (www.kraton.com) or under the Dynaron™ trademark by the Japan Synthetic Rubber company (www.jsr.co.jp).

The output of the spinneret is then pulled by a godet, through the pulling process and as the electroactive polymer constituents cool down or the solutions evaporate the EPFTs typically undergo a constriction in cross sectional area. This constriction and its amount is a function of the speed at which EPFTs are pulled as well as dependent on the specifics of the materials and the processing parameters. This constriction may be on the order of 2 or about 100 times reduction in cross sectional area and is a core property of the process within the scope of this invention as it allows the fabrication of EPFTs on the micrometer scale without the necessity to build microscale spinnerets. Furthermore it allows the production of nanoscale EPFTs starting with a microscale spinneret. Overall, this constriction is very useful as it allows the manufacturer to scale down the size of the EPFT without much added complexity to the process.

Standard techniques known to one in the art may be used as a post processing of the extrusion process to cool, pull, draw, anneal, photocure, orient, treat post-draw and coat EPFTs before being collected on a spool for later in situ bundling.

The outer compliant electrode of the individual EPFT may be patterned by spraying it or through a process similar to lithographic printing.

Although, in accordance with the present invention, the preferred embodiment is to coextrude the entire EPFT, core and polymer in one single operation it remains within the scope of the present invention to extrude hollow fibers and in a later processing step fill the cores with suitable incompressible conductive liquid.

Applications of EPFT and BEPFT. From the applications perspective a BEPFT may be considered a muscle-like device 700 such as illustrated in FIG. 7A. BEPFT 700 comprises a plurality of EPFTs 702 properly enclosed or prepared and attachment caps 704 and 706, which in one embodiment may include a force sensing transducer 708 such as a strain gauge or another BEPFT. This is analogous to Golgi Tendon Organs present in biological tendons to provide feedback in relation to the force that a muscle-tendon unit is exerting; points of mechanical attachment 710 and 720 and electrical access to the each end of the inner electrodes 716 and 712 and external electrode 714 and 718 for purposes of actuation, sensing and energy harvesting. In this respect the muscle-like 700 device performs just like a natural muscle, capable of actuating when it receives an activation signal and at the same time providing feedback of its tension, length and speed of contraction. Furthermore, transducer 700 outperforms natural muscles in the sense that it may also be used to generate electricity. BEPFT 700 may also comprise an access port to circuitry within the caps or to individual specialty EPFTs such as to allow other sensing modalities such as temperature, humidity, and the like. From this application perspective, as illustrated in FIG. 7A, the inner complexities of the BEPFT device are hidden and BEPFT 700 may be considered a component within a system.

FIG. 7B illustrates a schematic diagram intended to represent a BEPFT 700 from the mechanical perspective and FIGS. 7C and 7D illustrate a schematic diagram intended to represent the same transducer 700 from the electrical perspective. In particular, in FIG. 7C BEPFT is illustrated as a plate capacitor with a resistive element through out its center. This is to attempt to capture the electrical nature and behavior of the device as both a capacitor and a resistor. The resistor represents the core electrodes and its ends 716 and 712 are the ends of the resistor as well. This resistor, or core electrode is in turn one of the plates of the capacitor and thus this node of the circuit is labeled as both 712 and 716 while the external electrode is the other plate of the capacitor labeled 714 and 718. FIG. 7D does a more accurate job of representing the electrical nature of the device, as each plate of the capacitor is itself represented by a resistor. However, FIG. 7C is the preferred electrical representation that will be used as it is simpler to draw.

FIG. 8A illustrates two links 802 united by a revolute joint 812 and transduced by BEPFT 800. In this embodiment operating BEPFT 800 as an actuator would cause the joint to flex further, rotating around axis 812. As described earlier, in the application, BEPFT 800 may simultaneously serve as an actuator and as a sensor of the position of the joint. FIG. 8B illustrates a similar revolute joint, which is now transduced by an antagonistic pair of devices. In this embodiment operating BEPFT 800a as an actuator would cause the joint to extend while actuating BEPFT 800b would cause it to flex. Furthermore, coactivation of both BEPFTs 800 can effectively produce a change in the rotational compliance or stiffness of joint 812; a very desirable feature difficult to achieve with other actuation technologies. FIG. 8C illustrates a similar revolute joint except that in this embodiment BEPFT 800a operates through a longer and flexible attachment capable of wrapping around the joint and serving as a kind of pulley. Finally, FIG. 8D illustrates BEPFTs 800 in a configuration in which they exert their actuation efforts across two joints. This is a very biomimetic embodiment and has the desired feature that once an activation level is set for both BEPFTs 800, the joints 812 may rotate with the transducers serving as struts and therefore not consuming energy. In this respect the set of joints becomes a very tunable linkage, or open kinematic chain. As one skilled in the art will appreciate, these types of rotational joints are provided as examples only and joints encompassed within the scope of this invention include any possible combination of the described embodiments, including the use of redundant BEPFTs.

FIGS. 8E through 8G illustrate prismatic joints 814 transduced by BEPFTs 800. That is joints that move or translate in a straight line 814 or over a curbed path instead of rotating around an axis. FIG. 8E illustrates one such joint transduced by a single BEPFT 800 while FIG. 8F illustrates one being transduced by an antagonistic pair, thus presenting similar features as the rotational analogues illustrated in FIGS. 8B and 8C. FIG. 8G illustrates one such prismatic joint in which case transducers 800 may be enclosed within a tube or cylinder so as to simulate an embodiment similar to that of a pneumatic or hydraulic cylinder. It is worth noting that due to the very flexible and compliant nature of the BEPFTs, the path that across which this type of joints translate does not need to be a straight line.

FIG. 8H illustrates an embodiment in which one or a plurality of BEPFTs functions through a crankshaft as a means of transforming the linear motion of the BEPFT to a rotational motion for applications that use it. FIG. 8I illustrates another embodiment to transform the linear motion of the BEPFT 800 into rotational motion around an axis 812. In this case, antagonistic BEPFTS provide bidirectional motion but as mentioned earlier one may be substituted by a passive spring or external load.

FIG. 8J illustrates one embodiment in which similar BEPFTs are mounted under different prestraining conditions so as to extend the overall range of actuation or motion of a single BEPFT. A principle behind this embodiment is that throughout the length of travel of link 814 there will be at least one BEPFT that is at its prestrained sweet-spot, and thus can provide optimal actuation even though the rest of the BEPFTs may or may not be active. As one skilled in the art will appreciate, such sweet spot refers to an optimal prestraining at which a BEPFT can produce the maximal actuation pressure. In other words, BEPFTs being elastic may be strained by external means to great extents, in some cases over 1000% of their initial length, however optimal actuation performance, or the sweet-spot, is achieved within a significantly narrower range. Such sweet-spot range is dependent on the specific choice of materials and the EPFT dimensions and configurations. This same variable prestraining may also be achieved within the BEPFT itself by including individual EPFTs prestrained to different amounts.

FIG. 8K illustrates a ball and socket or spherical joint actuated by a plurality of BEPFTs 800 such that it may move in any of its degrees of freedom (one, two or three). FIG. 8L illustrates a planar joint in which by a combination of BEPFTs 800 activation, feature 810 may move throughout a plane. Finally, FIG. 8M illustrates a spatial joint in which by a combination of BEPFTs over a three-dimensional region, feature 810 may move through space.

Regardless of the type of joint, a single BEPFT or a plurality of them may be acting against antagonistic passive springs or external loads, and in such the case, the spring or elastic element may replace eliminate the need for an antagonistic BEPFT to provide the return motion.

As one with skill in the art will appreciate, by combining the above mentioned primary motion primitives, any desirable combination of rotational and translational motion may be achieved. Furthermore, these basic joint and linkage types exemplified here may be combined to form open or closed kinematic chains, as known in the prior art, to produce any desired motion, trajectory and orientation of an end effector, such as a hand in a robotic arm, in three-dimensional space.

As the scope of the present invention is that of an enabling transduction at the systems level, it is worth noting that although the joints herein described may be of traditional embodiments such as those comprised of bearings and rigid rails. The compliance and flexibility of the BEPFTs allows for less constrained joints to be produced. Such joints may be comprised of composite materials such that the joint's articulation is achieved by an elastic or flexible material coupled to the more rigid links.

FIG. 9A illustrates a generic leg 900 for use mainly in robotic applications comprised of a spherical joint 904 and a revolute joint 908 as previously described. Within such a leg and in accordance with the present invention, the power source, batteries, driver electronics and controllers may be incorporated in the rigid linkages 910 that comprise the leg. This is illustrated though a cut section in FIG. 9B. In other words, the hardware necessary to drive the BEPFTs may be used as a structural element or linkages, in this way minimizing weight and space and thus allowing the whole perimeter around the link to be enclosed by BEPFTs therefore enabling very strong actuation. This design is highly inspired by biology. As one skilled in the art will appreciate, the provided examples, although functional are only a pale simplification of the complexity and robustness seen in biology, yet due to the biomimetic resemblance of BEPFTs to natural muscles, it is accordance with the present invention to duplicate the structural and biomechanical details and control strategies found in living organisms whenever this is practical.

FIG. 9C illustrates a spherical joint 920 as one configuration for a vertebra. In this figure, the BEPFTs 906 can be actuated to bend the stiff structure 912 about the flexible section 928. Depending on the configuration, the vertebra can be designed to flex with multiple degrees of freedom. Furthermore, if multiple vertebra are chained together a flexible spine structure can be created that can articulate with many degrees of freedom.

FIG. 9D illustrates how through a combination of generic legs 900 and vertebral segments 912, the overall architecture of any tetrapod may be replicated. These robotic quadrupeds may serve as toys or utilitarian robots for exploration, rescue and defense. A similar architecture may also be employed to build bipeds.

FIG. 9E illustrates the BEPFT 906 applied to a powered prosthetic leg actuated both at the knee 916 and at the ankle 918. It should be noted that components 912 (e.g., power source, sensors, and controllers) may be incorporated into the structure of the leg, as illustrated in FIG. 9B to reduce the volume and weight of the prosthesis.

In this embodiment, the BEPFTs 906 may serve as actuators during the stance phase of the gait and serve as generators during the swing phase. This occurs while simultaneously acting as sensors. In this manner, the transducer releases energy to the environment to provide support but later absorbs energy from the natural swing to recharge its power source's batteries.

FIG. 9F illustrates an application of the BEPFT 906 where it may be used in an orthopedic brace 922 to aid a leg 924 in walking or rehabilitation or as an exoskeleton to increase the strength of the user. It should be noted that this same idea can be extended to the ankle, elbow, wrist, fingers, and so forth. In this figure, linkage 926 can be used to help control the rotation of the joint but in another embodiment it is not necessary and brace 924 with BEPFT 906 suffice to produce the desired motion. Depending on the exact nature of this orthotic, power and electronics may be hidden in the brace, linkages, a backpack or hand bag or may be stationary for rehabilitation purposes.

The user of prosthetic leg 914 or orthotic device 922 may control them through an EMG based interface, a neural interface, a mechanical interface in which by partially moving a muscle in the remaining limb stump or limb under rehabilitation activates the BEPFT.

In accordance with the present invention it should be appreciated that the above mentioned embodiments are provided as examples only and that the scope of the present invention is much broader and may encompass all sorts of arms, legs, fingers, male and female sex organs, wings, tongues, invertebrate appendages, antennas, snakes, tails, fish, fins, and the like.

Furthermore, the above mention embodiments may also be thoroughly applied to the medical devices field. In particular, applications such as animating simulation robots or mannequins for medical training during CPR, labor or any other procedure in which the medical student is to be working on a semiconscious patient will enjoy added realism. Furthermore, endoscopes will benefit from the scalability and versatility of BEPFTs, and bodily fluid pumps will also benefit from the silent and smooth actuation that these provide.

A variety of additional applications and functions are envisioned using the electroactive fibers as described herein. For example, self healing electroactive fibers are envisioned wherein a hole that develops in the electroactive polymer between the inner and outer electrodes is healed. For example, suitable self healing polymers can be incorporated into the electroactive polymer fibers, the inner electrode, the outer electrode, or any combination thereof. For example, when the inner electrode and external electrode come in contact, the self-healing materials contact each other and polymerize or otherwise chemically react to form a new material that is capable of plugging the hole in the electroactive polymer. This embodiment is not constrained to EPFTs and is also applicable to prior art electroactive polymer actuators and other planar actuators.

Figure 6A:
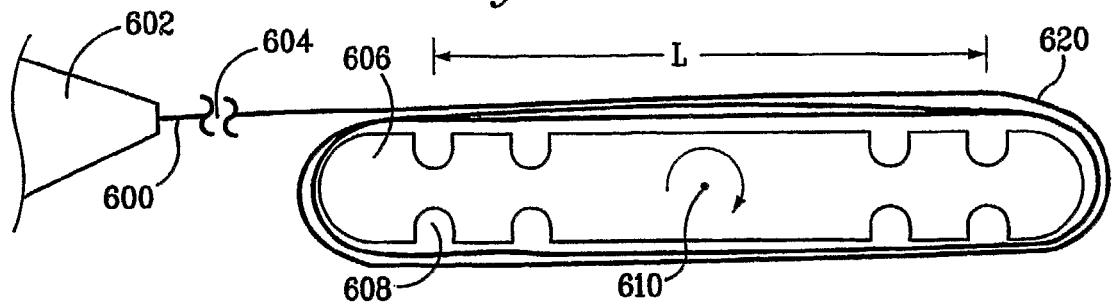
FIGS. 6A and 6B illustrate a side view and an isometric view for one method of collecting an electroactive polymer fiber (EPF) that exits an extruder.
Figure 6B:
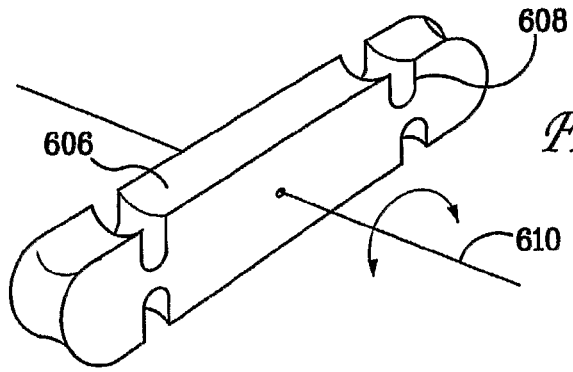

Bundling. FIGS. 6A and 6B illustrate a side view and an isometric view for one method of collecting the EPF, 600, that exits the extruder, 602. It should be noted that as the EPF exits the extruder is does not immediately need to be collected. It can go through a whole network of devices, 604, to control the tension of the fiber and the speed of the output. It can also go through a cleaning process or an application process where by photo curable resin, polymer stiffener, or glue may be applied to help in the bundling process. After 604, one method for collecting the fiber is to make a collecting device, 606, that rotates at a controlled rate about an axis, 610, to collect the EPF, 620. It should be noted that the length of the collecting device is scalable. Also, one feature worth noting about the collecting device are the slots, 608, which can be used for bundling and cutting the EPF's.

Figure 6C:
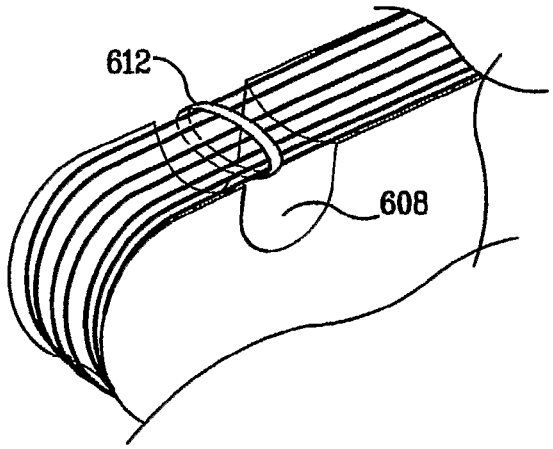
Figure 6D:
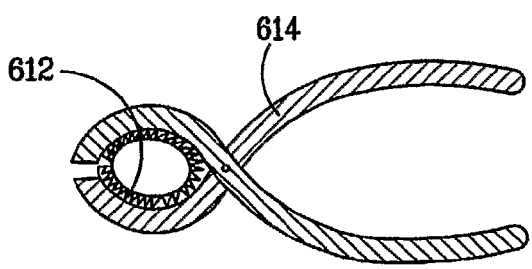

FIG. 6C illustrates one approach to bundling the EPF's by using a bundling band, 612. By the using the slot, 608, a bundling band can be wrapped around the collection of fibers, 600. The band can have several properties such as adhesive properties, glue like properties, and/or elastomeric properties. One method for applying the bundling band, 612, is to use a bundling wrench, 614, described in FIG. 6D, which can slide into the slot, 608, and to apply the band.

Figure 6E:
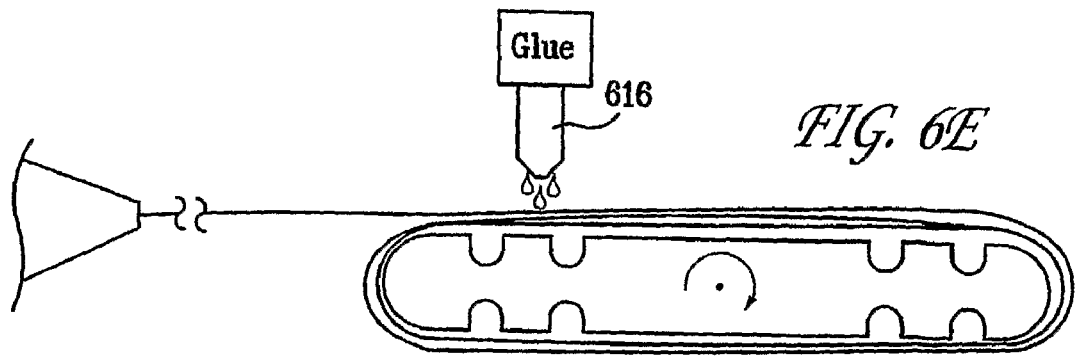

FIG. 6E illustrates another method for bundling the EPF's. In this method glue, 616, is applied at specific points and is timed with the frequency of rotation of the collecting device.

Figure 6F:
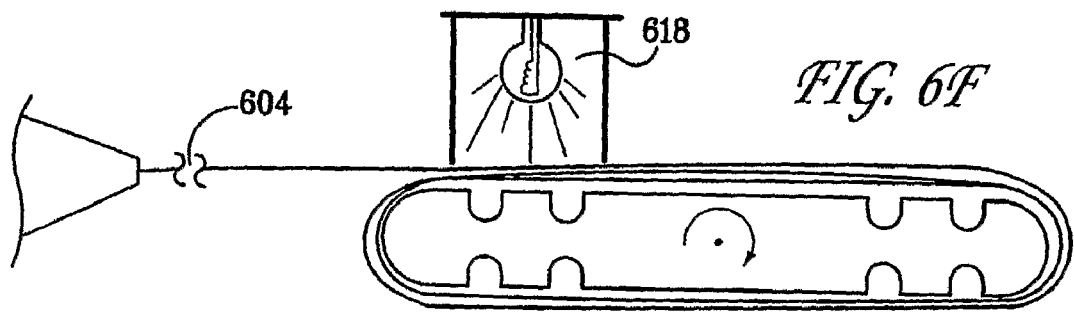

FIG. 6F illustrates another method for bundling the EPF's. In this method, the EPF's are bundled together using a photo curable resin/glue. At some point in the EPF extrusion and collection, a photo curable resin is applied to the EPF (i.e. spraying, dipping, pouring and the like). At timed intervals a light source, 618, will cure selected areas on the collecting device to cure the resin. Once cured the resin will provide a stiff structure to permit cutting and easy handling of the EPF bundles.

Figure 6G:
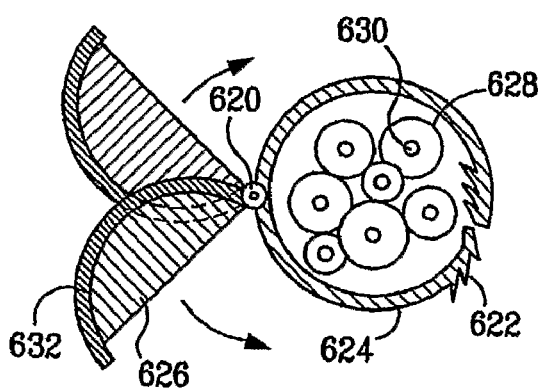

Bundling Method—Clasp and Cut. FIGS. 6G-6H, 6J-6K, and 6M-6N describe another technique of bundling the EPF's. FIG. 6G illustrates a clasping mechanism 624 that can wrap around a bundle of EFPs (where the electroactive polymer is given by 628 and the compliant electrode is given by 630). The clasping mechanism has some way of locking the device around the bundle of EFPs. On embodiment of this idea are the opposing teeth 622. Other methods could be tape, wire, and/or glue. Attached to the clasping mechanism is cutter made of a cutting support piece 632 with a material on the inside 626 with razor-blade-like properties. These razor blades can rotate about a hinge 620. It should be noted that the cutter does not necessarily have to rotate about a hinge. Another configuration may include using a compliant joint. It should also be noted that the cutter can be made of electrically conductive material, and be used as a contact point to carry charge to the EPF's.

Figure 6H:
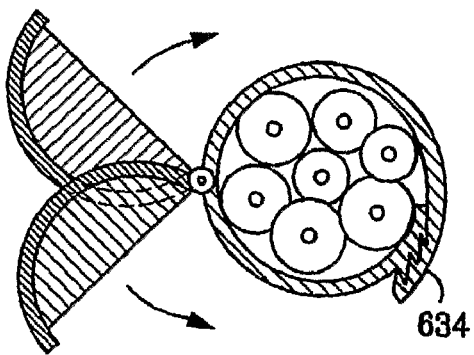
Figure 6J:
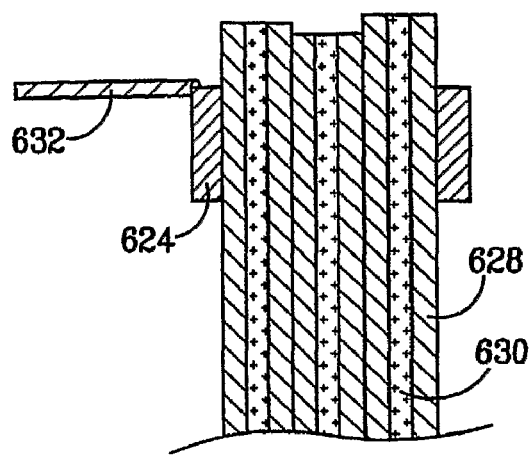

FIG. 6H illustrates the clasping mechanism being locked in around the EPF bundle, and the cutter's rotating. FIG. 6J shows a side cross-sectional view of the EPF bundle (where the electroactive polymer is given by 628 and the compliant electrode is given by 630). The objective of this illustration is to show that the fiber ends do not have to line up. This is because the cutters will cut off the excess and enclose the freshly cut fiber ends.

Figure 6K:
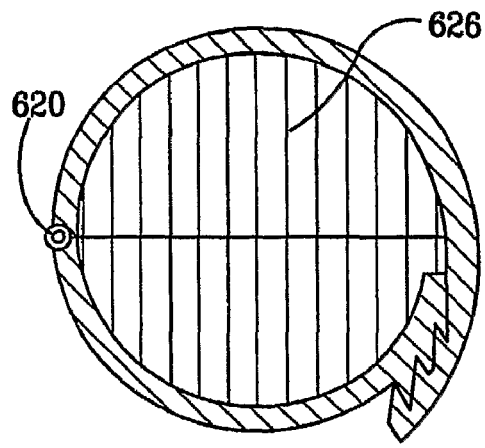

FIG. 6K shows a closed view of the cutting device. The cutters seal off the fiber ends from the environment, and the excess fiber ends have been removed. Furthermore, the cutters (which are made of electrically conductive material) and in close contact with the fiber ends, and thus can act as an electrical connection point.

Figure 6M:
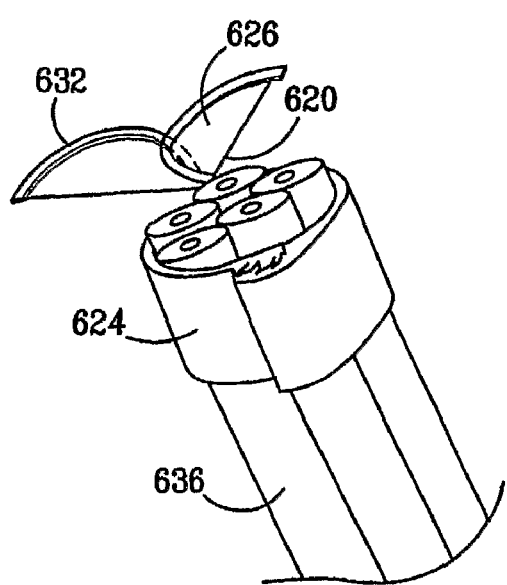

FIG. 6M illustrates an isometric view of the clasp and cutters with the clasp in the closed position wrapped around the EPF's 636 and the cutters in the open position 632 & 626).

Figure 6N:
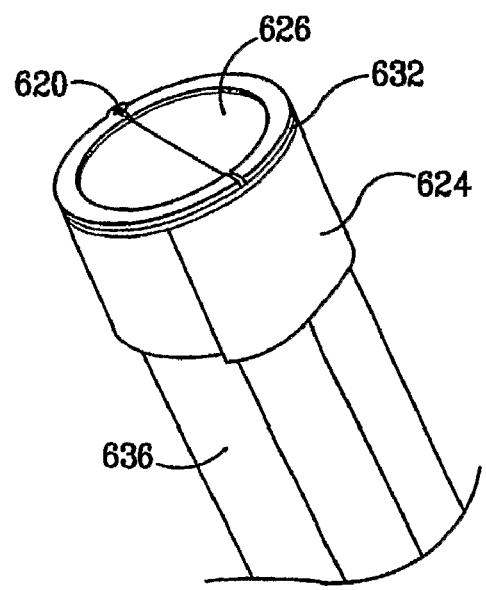

FIG. 6N illustrates an isometric view of the clasp and cutters in the closed position, and the excess EPF ends have been removed.

Once the clasp and cutters are in position, the entire unit can go through the capping process.

Actuation. An actuator is a device that creates motion. Most actuators work by transforming electric, magnetic, chemical or thermal energy into mechanical energy (force×displacement), producing a force that is used to move something (i.e. lift a load, pull, push, or rotate it). Some common actuators include combustion engines in cars, vibrating pager motors in cell phones, turbine engines on planes, and electric motors in remote control cars to name a few.

In any design process that involves an actuator, careful consideration should be given to the actuator's properties. For example, all actuators have mass (weight), volume, and finite performance capabilities in strength, speed, range of motion, and efficiency. In nature, as well as for prosthetic and autonomous robotic applications, where an actuator can provide the necessary energy to move itself plus its power source plus an external load, its performance necessarily becomes relative to its mass, size and efficiency—the ultimate goal being a device that efficiently produces a high mechanical energy output relative to a light and compact embodiment. This requires a precise balance of strength, speed, range of motion, and efficiency so as to minimize weight and volume. Human muscles are extraordinary actuators.

Electronic Systems for Controlling Electroactive Transducers. The present invention also provides electronic systems for controlling electroactive transducers. The electronic systems can provide, for example, a modular, scalable, high-voltage, energy efficient, distributed control architecture for driving (sensing, actuating and generating) BEPFTs as well as other electroactive devices.

Within the scope of the present invention, driving electronics are described to fully exploit all the features and capabilities of BEPFTs. FIGS. 10A through 10I progressively illustrate, in order of increasing complexity, how modules of electronic components can be assembled to produce a very scalable, modular, energy efficient, high voltage set of drivers, measurement tools, distributed control loops capable of exploiting the sensing, actuating and energy generation functionalities of BEPFTs.

As described earlier, within the context of this section, one with skill in the art will appreciate that a BEPFT may comprise one or a plurality of EPFTs. FIG. 10A illustrates a minimal embodiment for driving a BEPFT as an actuator. This driver circuit comprises one DC to DC converter 1006 used to step up, or raise the voltage from a low level to a high level. Such a converter 1006 may be one of a self contained step-up transformer such as commercially available from EMCO (Sutter Creek, Calif.) or any other form of rectified transformer of charge pump as long as it is capable of raising the voltage level of the primary source 1004 to that required by BEPFT 1002 (illustrated here as a capacitor), as well as the matching the power requirements. In this particular embodiment, exemplified by using a Q Series transformer from EMCO as the step-up transformer 1006, control of the voltage 1038 applied to BEPFT 1002 is achieved by varying the input voltage 1004 to the transformer 1006 by techniques known in the art.

FIG. 10B illustrates the next level of performance in circuits for driving BEPFT 1002 as an actuator. This circuit comprises a similar step up transformer as 1006 whose output is now illustrated as a constant high voltage source 1030 connected directly to a series of a high-voltage switching component 1032 and a high voltage resistor 1034. The high voltage switching component may be any of a such like a series OC-100 or OC-250 optocoupler from Voltage Multipliers (Visalia, Calif.), a high voltage FET of BJT transistor, a relay or any other suitable high-voltage switching component. Such switch 1032 is controlled by an activation signal 1042. Switching on the high-voltage side as opposed to switching on the low voltage side as in FIG. 10A will allow sharing the same step-up transformer between many BEPFT driving circuits as well as enable faster switching times, eliminate hysteresis or high switch on voltage of 1006 to name a few complications. In one embodiment, control signal 1042, which may be a voltage or a current, controls the conductivity of 1032, this in turn controls a steady current that flows through resistor 1034 thus producing a voltage drop (1044-1040) across it and across BEPFT 1002. To maintain a voltage across BEPFT, a current should be flowing through 1034 and thus electrical power is being consumed. It should be appreciated that the order of components 1034 and 1032 may be altered and the circuit would still allow control of voltage 1044.

The circuit illustrated in FIG. 10C is comprised of two high-voltage switching components 1032a and 1032b, such as those described earlier, in series so as to allow to selectively control the conductivity between nodes 1038 and 1044 and between nodes 1044 and 1040. Through this, electrical charge may be deposited on node 1044, to establish a voltage across BEPFT 1002, and such charge kept there virtually indefinitely without the need a constantly circulating current thus remarkably reducing the amount of electrical power required. This enables BEPFT 1002 to become a very beneficial zero power-holding force actuator, as once it is charged and actuated it may remain in that state without further consuming electrical energy. Furthermore, in this embodiment, node 1036 illustrates a possible bridge that may be connected directly to ground 1040 or may be routed to the primary source of energy in such a way that when switch 1032b is activated to discharge BEPFT 1002, such charge is recuperated. This is also the way by which electrical energy is harvested while operating BEPFT 1002 as a generator.

For purposes of simplicity going forward, FIG. 10D illustrates a schematic of a high-voltage switch 1066, which may be comprised as illustrated in FIG. 10B or 10C, such that it receives a source of high voltage through node 1038 and a control signal through node 1042 and delivers a controllable voltage or charge through node 1044 in reference to node 1040. FIG. 10E illustrates a voltage divider, as one skilled in the art will appreciate, comprised by two resistors 1016 and 1018 of significantly different resistance, to be used as means of measuring high-voltages through operational amplifier 1020. As power efficiency is an important concern in the design of these circuits, the overall impedance of this voltmeter should range in the order of GOhms and therefore opamp 1020 becomes important for achieving a clean and reliable signal. FIG. 10F illustrates a current meter comprised of a resistor 1028 and an opamp 1020. Similar to the voltmeter, the resistor in this circuit can be chosen to produce a voltage drop of a few volts (5-10V) in response to currents on the order of a few nA. The right hand side of both FIGS. 10E and 10F illustrate schematic diagrams for the high-voltage voltmeter and current meter respectively.

FIG. 10G illustrates a driver and sensing circuit 1052 comprised of the generic high voltage switch 1066 in addition to two voltage meters and one current meter. This circuit enables the control of applied voltage or charge 1048 to BEPFT 1002 (illustrated here as a capacitor with a resistive core) while measuring the resistance across its core, by computing the difference in voltage 1050a and 1050b as well as the resistance of the polymer by computing the ratio of voltage 1044 to current 1050c and the capacitance of the transducer by measuring a change in phase between an oscillating (may be low amplitude) voltage 1044 and its associated current 1050c. Furthermore, current 1050c may provide indication as to the health of the device, in particular the amount of dielectric breakdown which it has suffered. Through these measurements, the length, speed of contraction, even force and state of the BEPFTs may be determined as previously described in section 1.

FIG. 10H illustrates one driver and sensing circuit 1052 connected so that its control signals and measured outputs form a closed loop through a microcontroller 1060. These through appropriate digital to analog and analog to digital converters 1058 and 1056 respectively. One skilled in the art will appreciate that the microcontroller is provided for exemplary purposes only and that the control loop may be closed by other logic or even analog components, which in general will be referred to as a controller. Furthermore, in one embodiment such controller is connected, or comprises a communication module that enables common protocols such as USB, PCI, wifi, RS232, RS485, and the like, just to name a few, and through which the control module 1054 (*a, b*) may communicate with other control modules or with higher level controller 1064 as illustrated in FIG. 10I. High level controller 1064 may be any of a personal computer, a custom high level robotic controller capable of processing and integrating visual, auditory somatosensory inputs, or a prosthetic interface such as an electromiographic recorder, or a direct neural interface capable of bidirectional communication. That is, 1064 may comprise an interface that allows a living organism to directly control signals sent to each of the individual control modules 1054 an in turn allow such patient to sense, through direct neural stimulation the signals produced by BEPFTs 1002 transmitted through modules 1054.

It shall be appreciated by one skilled in the art that for purposes of clarity, several components and connections have been omitted from these exemplary circuits, and that such components like filtering capacitors, limiting resistors, fuses, and the like, that improve the noise response, efficiency and overall performance of the circuits are well within the scope of the present invention. Furthermore, it shall be appreciated that the circuits and architecture presented are intended as means of example and that complex feedback networks comprised of modules 1054 as well as variations to the driving and sensing circuits are to be considered under the scope of the present invention.

It is foreseeable that as the BEPFT technology is advanced and the operational voltage of such actuators is reduced, step up transformers such as 1006 can be scaled down or completely eliminated without the invention losing its scope or generality of architecture.

Finally, one with skill will appreciate that the present architecture may be suitable for any application such as prosthetics, rehabilitation orthoses, robotics, consumer electronics, medical devices, and the like, wherever it is desirable to control one or a plurality of BEPFTs.

Overall one skilled in the art will appreciate that the scope of the present invention encompasses a systems level implementation of the transduction technology described herein, and as such it comprises, a set of transducer geometries, materials, manufacturing methodologies, driving electronics and specific applications.

A variety of additional applications and functions are envisioned using the electroactive fibers as described herein. For example, self healing electroactive fibers are envisioned wherein a hole that develops in the electroactive polymer between the inner and outer electrodes is healed. For example, suitable self healing polymers can be incorporates in the electroactive polymer fibers, the inner electrode, the outer electrode, or any combination thereof. For example, when the inner electrode and external electrode come in contact, the self-healing materials contact each other and polymerize or otherwise chemically react to form a new material that is capable of plugging the hole in the electroactive polymer. This embodiment is not constrained to EPFTs and is also applicable to prior art electroactive polymer actuators and other planar actuators.

Multisensory fiber bundles can also be prepared using BEPFTs. For example, a plurality of electroactive fibers sensitive to different olfactans can be combined so as to make electroactive bundles that can "smell", i.e., function as an "electronic nose" for chemical detections.

Figure 3R:
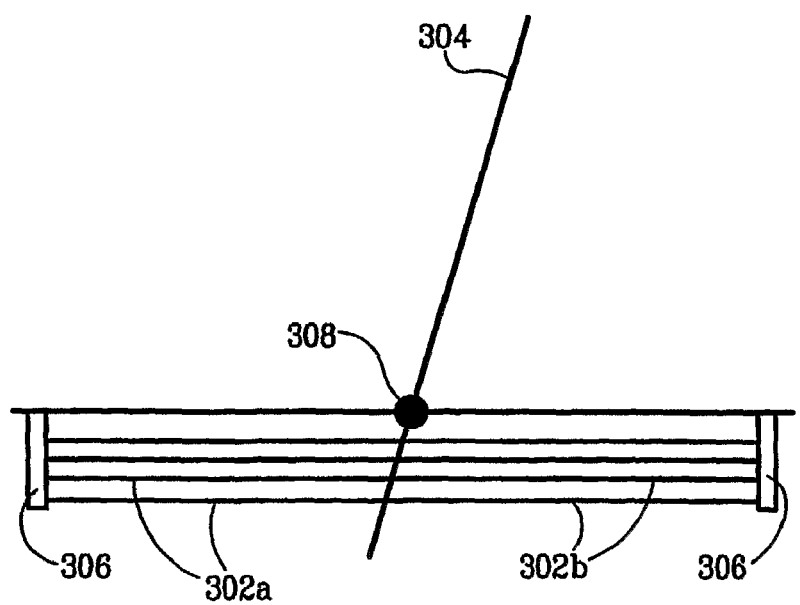

The BEPFTs can also be provided wherein at least a portion of the electroactive polymer fibers is prestrained differently, so as to achieve a prestraining gradient and thus a greater range of sweet-spots. This is further illustrated in FIG. 8J. In addition, FIGS. 3Q and 3R illustrate systems of jointed transducers comprising a plurality of electroactive fiber transducers 302 (*a, b*) mechanically coupled on opposite side of a first mechanical link 304, which is pivotally or flexibly connected to a second mechanical link 306 at joint 308. In FIG. 3Q, for example, electroactive fibers 302a can have a voltage applied to it sequentially, e.g., starting with the outermost/longest electroactive fiber, causing each to expand sequentially. Each subsequent electroactive fiber can initially have a slack (i.e., less than zero strain or stress) initially which becomes taut upon actuation of a prior muscle. Voltage can then be sequentially applied to the previously tightened electroactive fiber to create additional motion. Continuing to do this in series allows the range of motion to increase beyond the strain actuation limit for any one fiber at maximum voltage. For example, under a maximum applied voltage of 7000 V that gives rise to a maximum 10% strain elongation due to electrostatic potential, but such a fiber can be readily stretched further to strains of 20%, 30%, 40%, 50%, or more under mechanical stress, which can be applied by other electroactive fibers or other stressing means. In concert with actuation of electroactive fibers 302a, electroactive fibers 302b can have the voltage removed in a sequentially opposite manner to give rise to a corresponding motion of mechanical linkage 304 contracting and causing additional motion.

Figure 3S:
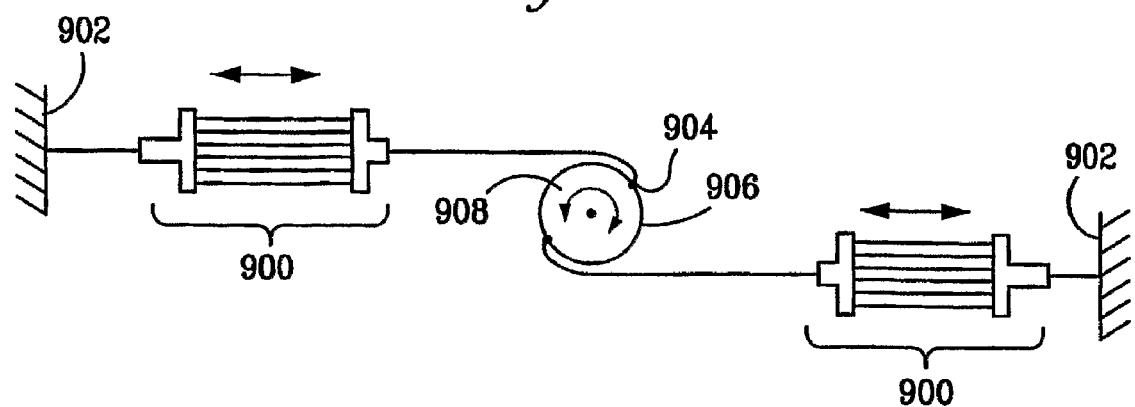
FIGS. 3S and 3T illustrate embodiments of systems of the present invention that can achieve rotary motion.

FIG. 3S illustrates one method for achieving rotary motion. In this figure, two BEPFTs 900 are arranged in an antagonistic configuration where each BEPFT has one end 902 anchored and one end 904 attached to the perimeter 906 of a rotary device or shaft 908. The amount of rotation depends on the amount of expansion and contraction of the BEPFTs.

Figure 3T:
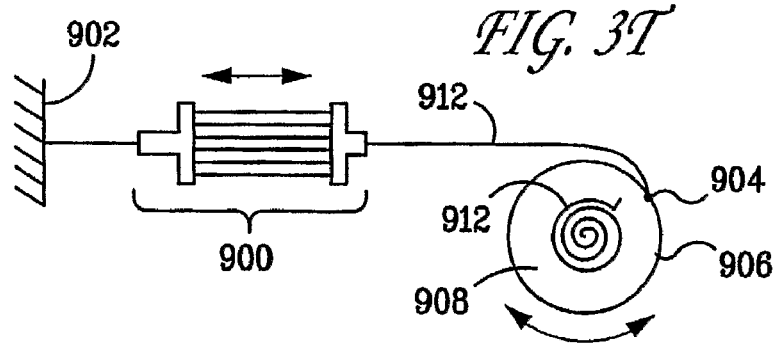

FIG. 3T illustrates another method for achieving rotary motion. In this figure, one BEPFT 900 is all that is needed to rotate a rotary device or shaft 908. In this method, one end 902 of the BEPFT is anchored while the other end 904 it attached to the perimeter 906 of the rotating shaft 908. Also attached to the shaft is a coil spring 910 that can apply a constant force (and store energy) to maintain tension in the link 912 between the BEPFT and the shaft 908.

EXAMPLES AND OTHER ILLUSTRATIVE EMBODIMENTS

An electroactive fiber actuator can be composed of one or a plurality of electroactive fibers. Each electroactive fiber can contribute to the force production of the entire device in response to one or more electrical fields across each fiber. This configuration, along with the choice of materials, enables the electroactive fiber actuators of the present invention to be more efficient, power-dense, lightweight, scalable, and cost-effective than any other present form of actuation. In one example, described below, a functional prototype essentially matched the performance of biological muscles.

FIG. 1H illustrates experimental data acquired by operating a transducer 152 as an actuator. The top panel and middle panes show the results of such fiber transducers, in accordance with the present invention, lifting a weight when stimulated by applying a voltage in the shape of a 1 Hz DC offset sinusoidal ranging from zero volts to a peak voltage labeled as the maximum voltage in the figure. Maximum percentile strain, as plotted in the figure, was measured indirectly at the peak of each oscillation cycle by non-contact means achieved through analysis of calibrated video recordings captured during the experiment. Specifically, the top pane graphs comparative results of one such transducer 152 when stimulated while lifting three different weights, one of 3.8 g (o), one of 7.4 g (+) and one of 10.6 g (*). Overlaid with these data points are best-fit curves in accordance with the mathematical model previously described for the actuator modality.

The middle pane of FIG. 1H illustrates the results of another EPFT 152 being tested while lifting a weight of 3.8 g and stimulated under the same electrical protocol to its ultimate point of dielectric breakdown, at which this particular EPFT had achieved a linear strain of 8.4% of its initial length.

The bottom pane of FIG. 1H represents two frames of the video recording captured while testing the previously described EPFT and is included to illustrate to the skilled person how tests were conducted. For both the top and middle pane, the EPFTs were part of the same batch and fabricated, as will be described ahead, by coextrusion of a sheath of polymer 116 made of a hydrogenated isoprene block copolymer, and core 138 of conductive grease Nyogel 755g from Nye Lubricants (Fairhaven, Mass.). During the tests the EPFTs were submerged in a bath of tap water which acted as the outer compliant electrode 120 and was connected to ground. Both EPFTs tested had an initial outer polymer 116 radius of approximately 0.4 mm and an inner radius 144 of approximately 0.3 mm.

Electroactive fibers having diameters of a few micrometers have been successfully fabricated and tested. Functional tests, as illustrated in FIG. 1H, have revealed electroactive fibers capable of approximately 9% actuation strains while producing a force of 16 N/cm$^2$ while cycling at one oscillation per second. This is a spectacular result in the context of biological muscle, which on average produces a physiological strain of 10% and a force of 15.4 N/cm$^2$. [Brown, I. E., et al., *J Muscle Res Cell Motil.* 1999 October; 20(7): 627-43; Brown, I. E., et al., *J Muscle Res Cell Motil.* 1999 August; 20(5-6): 443-56; Brown I. E., et al., *Exp Brain Res.* 1998 July; 121 (1): 76-91. Tests have achieved fibers oscillating at 10 cycles per second and above under similar loads and strain amplitudes. Biological muscles are rarely capable of activating faster than 10 times per second. In summary, experimental results with actual physical fibers show that electroactive fibers are capable of exceeding the strength, strain, and speed of biological muscle.

Electroactive fibers have been shown in these examples to match the performance of biological muscle. These results make the electroactive polymer fibers disclosed herein an ideal choice of actuation technology, especially for use in the fields of prosthetics and robotics. Many additional applications can be envisioned by those of skill in the art of the disclosed electroactive fiber actuators. Actuation applications can incorporate one or more of the functionalities provided by the disclosed electroactive fiber actuators, including quiet operation, multifunctionality, capacity to generate electricity from motion, and scalability.

In addition to each of the specific embodiments and drawings described hereinabove, other specific and illustrative embodiments of the invention are described hereinbelow as follows:

The electroactive polymer fibers can include an incompressibly compliant inner electrode, an electroactive polymer disposed exterior to the incompressibly compliant inner electrode, and an outer compliant electrode disposed exterior to the electroactive polymer, wherein the incompressibly compliant inner electrode is fluidically sealed within the electroactive polymer fiber. A suitable electroactive polymer fiber can be provided wherein the incompressibly compliant inner electrode is fluidically sealed within the electroactive polymer.

Electroactive polymer fibers can be provided wherein the incompressibly compliant inner electrode is fluidically sealed within the electroactive polymer fiber, wherein the volume of the incompressibly compliant inner electrode remains essentially constant upon application of an electric potential between the inner and outer electrodes. A suitable electroactive polymer fiber can be provided wherein the incompressibly compliant inner electrode is fluidically sealed within the electroactive polymer fiber, wherein the volume of the incompressibly compliant inner electrode remains essentially constant upon axial lengthening or stretching of the fiber. A suitable electroactive polymer fiber can be provided wherein the incompressibly compliant inner electrode is fluidically sealed within the electroactive polymer fiber, wherein the volume of the incompressibly compliant inner electrode remains essentially constant upon axial lengthening causing the fiber to constrain in cross section.

Electroactive polymer fibers can be provided wherein the electroactive polymer fiber axially lengthens upon application of an electric potential between the inner and outer electrodes. suitable electroactive polymer fiber can be provided wherein the inner and outer compliant electrodes generate essentially no elastic force on the electroactive polymer. A suitable electroactive polymer fiber can be provided wherein the inner and outer compliant electrodes generate essentially no equilibrium elastic force on the electroactive polymer. A suitable electroactive polymer fiber can be provided wherein the inner and outer compliant electrodes generate essentially no viscous/dampening force on the electroactive polymer. A suitable electroactive polymer fiber can be provided wherein the inner and outer compliant electrodes generate a desired viscous/dampening force on the electroactive polymer. A suitable electroactive polymer fiber can be provided wherein the incompressibly compliant inner electrode is characterized as being a fluid, a liquid, a paste, a gel, a powder, a viscoelastic liquid, an elastomer, a flexible coating, or any combination thereof.

Electroactive polymer fibers can further include a fluidically sealed fluid-filled region within the inner electrode. A suitable electroactive polymer fiber can be provided wherein the fluidically sealed fluid-filled region is capable of maintaining a pressure greater than ambient pressure external to the electroactive polymer fiber. A suitable electroactive polymer fiber can be provided wherein the fluidically sealed fluid-filled region is capable of decreasing in volume while increasing in pressure. A suitable electroactive polymer fiber can be provided wherein the fluidically sealed fluid-filled region encompasses a volume, at ambient pressure, that is about less than the volume encompassed by the inner electrode. A suitable electroactive polymer fiber can be provided wherein the fluidically-sealed fluid-filled region comprises a fluid in the gas state, the liquid state, the supercritical state, or any combination thereof. A suitable electroactive polymer fiber can be provided wherein the volume of the incompressibly compliant inner electrode remains essentially constant upon application of an electric potential between the inner and outer electrodes.

Electroactive polymer fibers can be provided further comprising at least one fiber end cap fluidically sealed to a distal end of the electroactive polymer fiber, the fiber end cap capable of transporting fluid into the fluidically sealed fluid-filled region. Electroactive polymer fibers can be provided wherein the incompressibly compliant inner electrode comprises electrically conductive particles dispersed in a matrix. Electroactive polymer fibers can be provided wherein the incompressibly compliant inner electrode is characterized as having an electrical conductivity greater than the electrical conductivity of the electroactive polymer. The electroactive polymer fiber can be provided wherein the incompressibly compliant inner electrode is characterized as having an electrical conductivity greater than about twice the electrical conductivity of the electroactive polymer. The electroactive polymer fiber can be provided wherein the incompressibly compliant inner electrode is characterized as having an electrical conductivity greater than the about three orders of magnitude greater than electrical conductivity of the electroactive polymer. The electroactive polymer fiber can be provided wherein the incompressibly compliant inner electrode is characterized as having an electrical conductivity greater than the about six orders of magnitude greater than electrical conductivity of the electroactive polymer.

Electroactive polymer fibers can be provided wherein the incompressibly compliant inner electrode is characterized as having an electrical resistance per unit length lower than the electrical resistance per unit length of the electroactive polymer. The electroactive polymer fiber can be provided wherein the incompressibly compliant inner electrode is characterized as having an electrical resistance per unit length about two times lower than the electrical resistance per unit length of the electroactive polymer. The electroactive polymer fiber can be provided wherein the incompressibly compliant inner electrode is characterized as having an electrical resistance per unit length about a thousand times lower than the electrical resistance per unit length of the electroactive polymer. The electroactive polymer fiber can be provided wherein the incompressibly compliant inner electrode is characterized as having an electrical resistance per unit length about a million times lower than the electrical resistance per unit length of the electroactive polymer. Electroactive polymer fibers can be provided wherein the incompressibly compliant inner electrode is characterized as having an electrical conductivity greater than about $10^{-17}$ S/cm, greater than about $10^{-12}$ S/cm, greater than about $10^{-7}$ S/cm, or greater than about $10^{-2}$ S/cm Electroactive polymer fibers can be provided wherein the volume of the compliant outer electrode remains essentially constant upon application of an electric potential between the inner and outer electrodes. A suitable electroactive polymer fiber can be provided wherein the compliant outer electrode comprises electrically conductive particles dispersed in a matrix. A suitable electroactive polymer fiber can be provided wherein the compliant outer electrode is characterized as having an electrical conductivity greater than the electrical conductivity of the electroactive polymer. Electroactive polymer fibers can be provided wherein the compliant outer electrode is characterized as having an electrical conductivity greater than about twice the electrical conductivity of the electroactive polymer. The electroactive polymer fiber can be provided wherein the compliant outer electrode is characterized as having an electrical conductivity greater than the about three orders of magnitude greater than electrical conductivity of the electroactive polymer. The electroactive polymer fiber can be provided wherein the compliant outer electrode is characterized as having an electrical conductivity greater than the about six orders of magnitude greater than electrical conductivity of the electroactive polymer. The electroactive polymer fiber can be provided wherein the compliant outer electrode is characterized as having an electrical resistance per unit length lower than the electrical resistance per unit length of the electroactive polymer.

Electroactive polymer fibers can be provided wherein the compliant outer electrode is characterized as having an electrical resistance per unit length about two times lower, about a thousand times lower, or about a million times lower than the electrical resistance per unit length of the electroactive polymer.

Suitable electroactive polymer fiber can be provided wherein the compliant outer electrode is characterized as having an electrical conductivity greater than about $10^{-17}$ S/cm, greater than about $10^{-12}$ S/cm, greater than about $10^{-7}$ S/cm, or greater than about $10^{-2}$ S/cm.

Electroactive polymer fibers can be provided wherein the electroactive polymer comprises a dielectric elastomer, a ferroelectric polymer, an electrostrictive graft elastomer, a piezoelectric polymer, a conductive polymer or any combination thereof. A suitable electroactive polymer fiber can be provided wherein the dielectric elastomer comprises a block copolymer. A suitable electroactive polymer fiber can be provided wherein the dielectric elastomer is a thermoplastic. A suitable electroactive polymer fiber can be provided wherein the block copolymer, comprises at least two covalently bonded polymer blocks. A suitable electroactive polymer fiber can be provided wherein the block copolymer comprises an A-B diblock copolymer, and A-B-A triblock copolymer, and A-B-A-B quadblock copolymer, an A-B-A-B-A pentablock copolymer, or any combination thereof. A suitable electroactive polymer fiber can be provided wherein at least one of the covalently bonded polymer blocks comprises a plurality of repeat units comprising an aromatic group, a saturated hydrocarbon, or any combination thereof. A suitable electroactive polymer fiber can be provided wherein the aromatic group includes styrene. A suitable electroactive polymer fiber can be provided wherein the saturated hydrocarbon includes ethylene, 1-butene, propylene, hydrogenated butadiene, hydrogenated isoprene, hydrogenated styrene, or any combination thereof.

Electroactive polymer fibers can be provided wherein the dielectric elastomer is characterized as having an elasticity modulus smaller than about 10 MPa. For example, A suitable electroactive polymer fiber can be an electroactive polymer comprises a saturated hydrocarbon polymer, an unsaturated hydrocarbon polymer, a silicone polymer, an acrylic polymer, a urethane polymer, an alkyl glycol polymer, or any combination thereof. A suitable electroactive polymer fiber can be a acrylic polymer comprises a thermoplastic polymer comprising from about 50 to about 99.99 weight percent, based on thermoplastic polymer weight, of polymerized units of a $C_1$-$C_{18}$ alkyl acrylate or mixtures thereof, up to about 50 weight percent, based on thermoplastic polymer weight, of polymerized units of an ethylenically unsaturated monomer, and from 0.01 to 10 weight percent, based on thermoplastic polymer weight, of a reacted crosslinker. A suitable electroactive polymer fiber can be an electroactive polymer further comprises a plasticizer.

Electroactive polymer fiber can further include an outer electrical lead in electrical communication with the outer electrode and a voltage source, a charge source, or both. The electroactive polymer fiber can further include an outer electrical lead in electrical communication with the outer electrode and a sensing electronic circuit, a voltage source or sink, a charge source or sink, or any combination thereof. A suitable electroactive polymer fiber can further include an inner electrical lead in electrical communication with the outer electrode and a voltage source, a charge source, or both. A suitable electroactive polymer fiber can further include an inner electrical lead in electrical communication with the outer electrode wherein the electrical lead serves as a fluidic seal for the outer electrode. A suitable electroactive polymer fiber can further include an inner electrical lead in electrical communication with the outer electrode and a sensing electronic circuit, a voltage source or sink, a charge source or sink or a combination. A suitable electroactive polymer fiber can further include an inner electrical lead in electrical communication with the outer electrode and an electrical lead in electrical communication with the outer electrode, wherein the electroactive polymer fiber is capable of forming a circuit component.

Electroactive polymer fibers can be provided wherein the electroactive polymer is radially disposed exterior to the incompressibly compliant outer electrode. A suitable electroactive polymer fiber can be provided comprising a plurality of incompressibly compliant outer electrodes. Electroactive polymer fiber can further include a protective outer layer disposed exterior to the outer electrode. A suitable electroactive polymer fiber can be provided wherein the outer electrode is characterized as being a fluid, liquid, paste, gel, gas, powder, elastomer, or any combination thereof, and the outer electrode is fluidically sealed using at least the protective outer layer. A suitable electroactive polymer fiber can be provided further comprising an outer electrical lead in electrical communication with the outer electrode and optionally at least one of a sensing electronic circuit, a voltage source or sink, a charge source or sink, or any combination thereof. A suitable electroactive polymer fiber can be provided further comprising an outer electrical lead in electrical communication with the outer electrode, and optionally with at least one of the sensing electronic circuit, voltage source or sink, charge source or sink, or any combination thereof.

Electroactive polymer fibers can further include one or more electroactive polymers disposed exterior to the outer electrode. A suitable electroactive polymer fiber can further include a compliant electrode disposed exterior to each of the one or more electroactive polymer disposed exterior to the outer electrode. Electroactive polymer fibers can be provided wherein the incompressibly compliant outer electrode is characterized as having a regular cross sectional shape, an irregular cross sectional shape, or any segment or combination thereof. The electroactive polymer fiber can be provided wherein the regular shape comprises a circle, a triangle, a square, a rectangle, a rhombus, any polygon have five or more sides, or any segment or combination thereof. A suitable electroactive polymer fiber can be provided wherein the irregular shape comprises an ellipse or one or more curved segments or line segments that differ in length.

Electroactive polymer fibers can be provided wherein the electroactive polymer is characterized as having a regular cross sectional shape, an irregular cross sectional shape, or any segment or combination thereof. A suitable electroactive polymer fiber can be provided wherein the regular shape comprises a circular annulus, a triangular annulus, a square annulus, a rectangular annulus, a rhomboid annulus, any polygonal annulus have five or more sides, or any segment or combination thereof. A suitable electroactive polymer fiber can be provided wherein the irregular shape comprises an ellipsoidal annulus, an annulus comprising one or more curved segments or line segments that differ in length, or any combination thereof. The electroactive polymer fiber can be provided wherein the electroactive polymer is characterized as having an annulus comprising the incompressibly compliant outer electrode disposed therein.

Electroactive polymer fibers can be provided wherein the electroactive polymer is characterized as having flights. A suitable electroactive polymer fiber can be provided wherein the flights may be intermittent, variable or both, along the length of the fiber. A suitable electroactive polymer fiber can be provided wherein the flights form a helical profile.

Electroactive polymer fibers can be provided wherein the electroactive polymer comprises a polymer and at least one additional material. The electroactive polymer fiber can be provided wherein the additional material is capable of being sealed within the electroactive polymer, and the additional material comprises a fluid, liquid, paste, gel, gas, powder, polymer, elastomer, or any combination thereof. The electroactive polymer fiber can be provided wherein the composition of the additional material varies along the axis of the fiber. Electroactive polymer fibers can be non-hollow or hollow.

Electroactive polymer fibers can be an incompressibly compliant outer electrode is characterized as having a cross sectional area normal to the axial direction of the electroactive polymer fiber in the range of from about 10 square nanometers to about 400 square centimeters, in the range of from about 1000 square nanometers to about 0.1 square centimeters, in the range of from about 0.01 square micrometers to about 1000 square micrometers, in the range of from about 10 square nanometers to about 1 square micrometer, in the range of from about 1 square micrometer to about 1 square millimeter, in the range of from about 1 square millimeter to about 1 square centimeter, in the range of from about 1 square centimeter to about 400 square centimeters.

Electroactive polymer fibers can be provided wherein the cross sectional area normal to the axial direction of the electroactive polymer fiber is a circle. A suitable electroactive polymer fiber can be an incompressibly compliant outer electrode is concentric with the axis of the electroactive polymer fiber. A suitable electroactive polymer fiber can be an incompressibly compliant outer electrode which is not necessarily concentric with the axis of the electroactive polymer fiber. A suitable electroactive polymer fiber can be provided comprising a plurality of incompressibly compliant outer electrodes. The electroactive polymer fiber can be provided wherein one of the incompressibly compliant outer electrodes is concentric with the axis of the electroactive polymer fiber.

Electroactive polymer fibers can be an incompressibly compliant outer electrode is characterized as having a cross sectional dimension normal to the axial direction of the electroactive polymer fiber in the range of from about 1 nanometer to about 10 centimeters, from about 10 nanometers to about 1 centimeters, from about 100 nanometers to about 1000 micrometers, or from about 1 micrometer to about 100 micrometers. A suitable electroactive polymer fiber can be provided wherein the cross sectional dimension is the diameter of the incompressibly compliant outer electrode.

Electroactive polymer fibers can be an electroactive polymer is characterized as having an inner surface in contact with the incompressibly compliant outer electrode, and an outer surface in contact with the outer compliant electrode, wherein the distance between the outer electrode and the outer compliant electrode normal to the axial direction of the electroactive polymer fiber ranges between about 10 nm and about 10 cm, between about 100 nm and about 1 cm, between about 1 micrometer and about 1000 micrometers, between about 10 micrometers and about 100 micrometers, between about 10 nanometer and about 1 micrometer, between about 1 micrometer and about 1 millimeter, or between about 1 millimeter and about 10 centimeters.

Electroactive polymer fibers can be an electroactive polymer has a diameter normal to the axial direction of the electroactive polymer fiber in the range of from about 10 nm to about 40 cm, from about 100 nm to about 1 cm, from about 1 micrometer to about 1 millimeter, from about 10 micrometers to about 100 micrometers, from about 5 nanometers to about 500 nanometers, from about 500 nanometers to about 500 micrometers, from about 5 micrometers to about 1 millimeter, from about 1 millimeter to about 1 centimeter, or from about 1 centimeter to about 40 centimeters.

Electroactive polymer fibers can be an electroactive polymer is characterized as being prestrained or not being prestrained.

Electroactive polymer fibers can be an electroactive polymer fiber is capable of self-healing an opening formed in the electroactive polymer. For example, a suitable electroactive polymer fiber can be provided wherein self healing materials are incorporated in the electroactive polymer, the outer electrode, the outer electrode, or any combination thereof. Suitable transducers can include at least two electrodes, and an electroactive polymer, wherein the electroactive polymer is capable of self-healing an opening formed in the electroactive polymer. A suitable electroactive polymer transducer can be provided wherein self healing materials are incorporated in the electroactive polymer, the outer electrode, the outer electrode, or any combination thereof. A suitable electroactive polymer transducer can be provided wherein the self healing materials comprise a polymerization initiator, a polymerization activator, a polymerization catalyst, a monomer, an oligomer, a functionalized monomer, a functionalized oligomer, a functionalized polymer, or any combination thereof.

Transducers comprising the electroactive polymer fibers are also provided. Suitable transducers can comprise an electroactive polymer fiber wherein the transducer is capable of being used as a sensor. A sensor comprising the transducer can be provided wherein the sensor is capable of sensing the axial length, the strain, the strain velocity, the strain acceleration, or any combination thereof, of the electroactive polymer fiber. A sensor comprising the transducer can be provided wherein the sensor is capable of sensing the pressure, humidity, temperature, light intensity, light wavelength, chemical composition, presence of chemicals or olfactants, or any combination thereof, surrounding within the surrounding environment or within the electroactive polymer fiber. A transducer comprising the electroactive polymer fiber can be provided wherein the transducer is capable of being used as an actuator. A transducer comprising the electroactive polymer fiber can be provided wherein the transducer is capable of being used as an electrical generator. A transducer comprising the electroactive polymer fiber can be provided wherein the transducer is capable of being used simultaneously by at least two of a sensor, an actuator, or an electrical generator.

Bundles of one or more electroactive polymer fibers is also within the scope of the invention. A suitable bundle can be provided wherein at least one of the electroactive polymer fibers is prestrained. A suitable bundle can be provided wherein at least one of the electroactive polymer fibers is characterized as being strained a different amount compared to at least one other electroactive polymer fiber in the bundle.

Prosthetic devices comprising an actuator, the actuator comprising the electroactive polymer fiber are also within the scope of the invention. Robots comprising an actuator, the actuator comprising the electroactive polymer fiber are also within the scope of the invention. Actuators comprising one or more electroactive polymer fibers is also within the scope of the invention. Sensors comprising one or more electroactive polymer fibers is also within the scope of the invention. Electric generator comprising one or more electroactive polymer fibers is also within the scope of the invention.

Multifunctional transducers comprising one or more electroactive polymer fibers are also provided, wherein at least one of the electroactive polymer fibers capable of lengthening upon application of a voltage across the outer electrode and the outer electrode, at least one of the electroactive polymer fibers capable of use as a sensor of physical properties, chemical properties, or both, by measuring the resistivity, current, capacitance, impedance or voltage within the outer electrode, within the outer electrode, between the outer electrode and the outer electrode, or any combination thereof. A chemical sensor comprising one or more of the electroactive polymer fibers can be provided wherein at least one of the electroactive polymer fibers is capable of sensing an olfactan. A suitable chemical sensor can be provided wherein at least two or more electroactive polymer fibers are capable of sensing different olfactans.

Methods of preparing an electroactive polymer fiber is also within the scope of the invention. Such methods include extruding an electroactive polymer fiber comprising an electroactive polymer and an inner region disposed within the electroactive polymer, willing the inner region with an incompressibly compliant electrically conductive material, the incompressibly compliant electrically conductive material filling the inner region. A suitable method can further include the step of applying a compliant electrically conductive material to the exterior surface of the electroactive polymer fiber to provide an outer compliant electrode disposed exterior to the electroactive polymer.

Fluid delivery devices are also provided, which can include an electroactive polymer conduit comprising an inner core, an electrically conductive fluid disposed within the inner core, the electrically conductive fluid being in electrical communication with an inner electrical lead and a first voltage source, one or more outer electrodes disposed exterior to the electroactive polymer, at least one of the outer electrodes being charged relative to that of the electrically conductive fluid, whereupon a reduction in the charge between the outer electrode and the outer electrode gives rise to fluid transport in the axial direction of the electroactive polymer conduit.

Electroactive polymer fiber transducers can include at least one electroactive polymer fibers can include an incompressibly compliant outer electrode, an electroactive polymer disposed exterior to the incompressibly compliant outer electrode, and an outer compliant electrode disposed exterior to the electroactive polymer, wherein the incompressibly compliant outer electrode is fluidically sealed within the electroactive polymer fiber, and a voltage source, a charging source, a current sink, sensing electronics, or any combination thereof, connected to the incompressibly compliant outer electrode and the outer compliant electrode. A suitable electroactive polymer fiber transducer can be provided wherein application of a voltage across the polymer through the incompressibly compliant outer electrode and the outer compliant electrode gives rise to an attractive electrostatic force or pressure in the radially direction relative to the axis of the electroactive polymer fiber transducer. A suitable electroactive polymer fiber transducer can be provided wherein the attractive electrostatic forces gives rise to a radially decrease in the thickness of the electroactive polymer (in cross section) and gives rise to an axially lengthening of the electroactive polymer fiber transducer. A suitable electroactive polymer fiber transducer can be provided, comprising a plurality of electroactive polymer fiber transducers. A suitable electroactive polymer fiber transducer can be provided wherein each of the outer compliant electrodes of the plurality of electroactive polymer fibers are in electrical communication with each other. A suitable electroactive polymer fiber transducer can be provided wherein one outer compliant electrode common to each of the electroactive polymer fibers is disposed exterior to each of the plurality of electroactive polymer fibers. A suitable electroactive polymer fiber transducer can be provided wherein each of the incompressibly compliant outer electrodes of the electroactive polymer fibers are in electrical communication with each other.

Electroactive polymer fiber transducers can be provided wherein the plurality of electroactive polymer fibers are arranged in a regularly-shaped bundle, in an irregularly-shaped bundle, in a plane, in an array, in a circle, in series, in parallel, or any combination thereof. A suitable electroactive polymer fiber transducer can be provided wherein the regularly-shaped bundle is circular, rectangle, triangular, or any combination thereof. A suitable electroactive polymer fiber transducer can be provided wherein at least one of the electroactive polymer fibers is prestrained. A suitable electroactive polymer fiber transducer can be provided wherein at least one of the electroactive polymer fibers is characterized as being strained in the axial direction a different amount compared to at least one other electroactive polymer fiber in the bundle. A suitable electroactive polymer fiber transducer can be provided wherein at least one of the electroactive polymer fibers is prestrained in the axial direction, at least one of the electroactive polymer fibers is at approximately zero strain, and at least one of the electroactive polymer fibers is loosely held below zero strain.

Electroactive polymer fiber transducers can further include one or more fiber end caps affixedly sealed to the electroactive polymer of each of the electroactive polymer fibers, at least one of the fiber end caps comprising an electrode capable of being in electrical communication with each of the at least one incompressibly compliant electrodes. A suitable electroactive polymer fiber transducer can be provided comprising a bundle of a plurality of electroactive fibers and two fiber end caps, each affixedly sealed to the electroactive polymer at opposite ends of the bundle, wherein the density of electroactive polymer fibers in the two fiber end caps is about the same. A suitable electroactive polymer fiber transducer can be provided comprising a bundle of a plurality of electroactive fibers and two fiber end caps, each affixedly sealed to the electroactive polymer at opposite ends of the bundle, wherein the density of electroactive polymer fibers in the two fiber end caps is different. A suitable electroactive polymer fiber transducer can be provided wherein the shape of the bundle of electroactive polymer fibers in the two fiber end caps is about the same. A suitable electroactive polymer fiber transducer can be provided wherein the shape of the bundle of electroactive polymer fibers in the two fiber end caps is different. A suitable electroactive polymer fiber transducer can be provided wherein the capped ends further comprise mechanical couplings. A suitable electroactive polymer fiber transducer can further include one or more electroactive polymer fiber sensors electrically connected through at least one of the fiber end caps to a sensor circuit.

Electroactive polymer fiber transducers can be provided wherein the plurality of electroactive polymer fibers are looped, knotted, braided, woven, twisted or any combination thereof. A suitable electroactive polymer fiber transducer can be provided wherein each of the electroactive polymer fibers are capped together at one end and the other end of each of the electroactive polymer fibers are capped in two or more separate ends. suitable electroactive polymer fiber transducer can be provided wherein each of the electroactive polymer fibers are capped together at both ends using two separate fiber end caps. A suitable electroactive polymer fiber transducer can be provided wherein each of the electroactive polymer fibers are capped together at both ends using one single fiber end cap.

Electroactive polymer fiber transducer can be an electroactive polymer fiber in the shape of a helix. A suitable electroactive polymer fiber transducer can be an electroactive polymer fiber is looped to form a bundle, the bundle capable of being mechanically coupled.

Electroactive polymer fiber transducers can further include one or more electroactive polymer fiber sensors. Electroactive polymer fiber transducers can be provided wherein application of a voltage of about +/−7000 V gives rise to an axial strain of at least about 8 percent relative to the length of the electroactive polymer fiber transducer at zero voltage. A suitable electroactive polymer fiber transducer can be provided wherein application of a maximum voltage having an absolute value less than about 10000 V gives rise to an axial strain of at most about 50 percent relative to the length of the electroactive polymer fiber transducer at zero voltage. A suitable electroactive polymer fiber transducer can be provided wherein application of a maximum voltage of having an absolute value less than about 1000 V gives rise to an axial strain of at most about 50 percent relative to the length of the electroactive polymer fiber transducer at zero voltage. A suitable electroactive polymer fiber transducer can be provided wherein application of a voltage of having an absolute value of at most about 100 V gives rise to an axial strain of up to about 50 percent relative to the length of the electroactive polymer fiber transducer at zero voltage. A suitable electroactive polymer fiber transducer can be provided wherein application of a voltage having an absolute value of at most about 10 V gives rise to an axial strain of up to about 50 percent relative to the length of the electroactive polymer fiber transducer at zero voltage. A suitable electroactive polymer fiber transducer can be provided wherein application of a voltage having an absolute value of at most about 5000 V gives rise to an axial strain of up to about 20 percent relative to the length of the electroactive polymer fiber transducer at zero voltage. A suitable electroactive polymer fiber transducer can be provided wherein application of a voltage gives rise to an axial strain, wherein such strain is achieved in the presence of an external load. A suitable electroactive polymer fiber transducer can be provided wherein application of a voltage gives rise to an axial strain, wherein such strain does mechanical work on an external load. A suitable electroactive polymer fiber transducer can be provided wherein application of a voltage gives rise to an axial strain, wherein such strain is achieved in less than 10 seconds, less than 1 second, less than 100 milliseconds, less than 10 milliseconds, or less than 1 millisecond. A suitable electroactive polymer fiber transducer can be provided wherein removal of a voltage gives rise to an elastic return from an axial strain, wherein such return is achieved in less than 10 seconds. Electroactive polymer fiber transducers can also be provided wherein application of a voltage having an absolute value of about 5000 V gives rise to an axial strain of at least about 3 percent relative to the length of the electroactive polymer fiber transducer at zero voltage.

A mechanical joint comprising the electroactive polymer fiber transducer is also within the scope of the invention. A humanoid robotic simulator for medical training using the electroactive polymer fiber transducer is also within the scope of the invention. An articulated endoscope actuated by using the electroactive polymer fiber transducer is also within the scope of the invention. A fluidic pump actuated by the electroactive polymer fiber transducer is also within the scope of the invention.

Electroactive polymer fiber transducers can include an electroactive polymer fiber capable of self-healing an opening formed in the electroactive polymer. A suitable electroactive polymer fiber transducer can be provided wherein self healing materials are incorporated in the electroactive polymer, the outer electrode, the outer electrode, or any combination thereof.

Methods of preparing an electroactive polymer fiber transducer are also within the scope of the envision. These methods include forming an electroactive polymer fiber comprising an electroactive polymer and an inner region disposed within the electroactive polymer, filling the inner region with an incompressibly compliant electrically conductive material to provide an incompressibly compliant inner electrode, and applying a compliant electrically conductive material to the exterior surface of the electroactive polymer fiber to provide an outer compliant electrode disposed exterior to the electroactive polymer. The electroactive polymer fiber can be formed by extrusion, coextrusion, injection molding, blow molding, compression molding, vacuum molding, liquid deposition, vapor deposition, self assembly, or any combination thereof. The electroactive polymer fiber is preferably formed by extrusion or coextrusion. The electroactive polymer fiber can be filled with an incompressibly electrically conductive material by coextrusion, capillary action, pressure injection, vacuum drawing, diffusion across the electroactive polymer fiber, vapor condensation, vapor deposition, self assembly, or any combination thereof. A suitable method can further include the step of fluidically sealing the incompressibly compliant inner electrode within the transducer. A suitable method can further include cutting a portion of the extruded and filled electroactive polymer fiber to provide two distal ends, and capping at least one of the distal ends with a fiber end cap comprising an inner electrical lead in electrical communication with the inner electrode.

Methods of preparing an electroactive polymer fiber transducer can further include capping both distal ends each with a fiber end cap comprising an inner electrical lead to be in electrical communication with the inner electrode. A suitable method can further include further comprising capping both distal ends each with a fiber end cap comprising an outer electrical lead to be in electrical communication with the outer conductive fluid in the inner electrode. A suitable method can further include capping each distal end with a fiber end cap comprising an inner electrical lead to be in electrical communication with the inner electrode. A suitable method can further include capping each distal end with a fiber end cap, each fiber end cap comprising a plurality of inner electrical leads each in independent electrical communication with each inner electrode.

Methods of preparing an electroactive polymer fiber transducer can further include the step of bundling one or more electroactive polymer fibers. A suitable method can be provided wherein a single extruded electroactive polymer fiber is bundled by winding the extruded electroactive polymer fiber about an axis.

Electroactive polymer fiber sensors are also within the scope of the invention. Such sensors comprise an electroactive polymer fiber, comprising an incompressibly compliant inner electrode, an electroactive polymer disposed exterior to the incompressibly compliant inner electrode, and an outer compliant electrode disposed exterior to the electroactive polymer, a first fiber end cap comprising an inner electrical lead in electrical communication with the incompressibly compliant inner electrode, and a second fiber end cap disposed opposite to the first fiber end cap, the second fiber end cap capable of being in electrical communication with the incompressibly compliant inner electrode, wherein the first and second fiber end caps and the electroactive polymer are disposed to fluidically seal the incompressibly compliant inner electrode therebetween, whereupon changing the physical state or chemical environment of the electroactive polymer fiber gives rise to a detectable electrical signal communicated through the first and second fiber end caps. The electroactive polymer fiber sensor can be a physical state of the electroactive polymer fiber that can be changed and detected as an electrical signal communicated through the first and second fiber end caps comprises stress, strain, temperature, humidity, pH, ionic conductivity, light intensity, light wavelength, chemical composition of environment, presence of selected chemical compound, magnetic field intensity, magnetic field direction, pressure, humidity, vibration, sound, or any combination thereof.

Electroactive polymer fiber sensors can be provided wherein the detectable change may be sensed by a change in an electrical property at the first cap, the second cap, the external electrode, or any combination thereof. The electroactive polymer fiber sensor can be a detectable electrical signal is detected using a sensor circuit. The electroactive polymer fiber sensor can be a sensor is capable of simultaneously operating as an actuator, a generator, or both. The electroactive polymer fiber sensor can be a sensor is a component in an electronic circuit, wherein a change in the electrical properties of the sensor affects the behavior of the circuit. The circuit component can be provided wherein the sensor affects the circuit through a change in resistance across two of its leads in response to a change in a physical or chemical parameter of the electroactive polymer sensor. The circuit component can be provided wherein the sensor affects the circuit through a change in capacitance across two of its leads in response to a change in a physical or chemical parameter of the electroactive polymer sensor. The circuit component can be provided wherein the sensor affects the circuit through a change in impedance across two of its leads in response to a change in a physical or chemical parameter of the electroactive polymer sensor. The circuit component can be provided wherein the sensor affects the circuit through a combination of a change in resistance, capacitance or impedance across two of its leads in response to a change in a physical or chemical parameter of the electroactive polymer sensor.

Methods of actuating an electroactive polymer fiber transducer is also with in the scope of the invention. This methods comprise providing an electroactive polymer fiber transducer, comprising at least one electroactive polymer fiber, comprising an incompressibly compliant inner electrode, an electroactive polymer disposed exterior to the incompressibly compliant inner electrode, and an outer compliant electrode disposed exterior to the electroactive polymer, wherein the incompressibly compliant inner electrode is fluidically sealed within the electroactive polymer fiber, and a voltage source, a charge source, or both connected to the incompressibly compliant inner electrode and the outer compliant electrode, and applying a voltage to the incompressibly compliant inner electrode and the outer compliant electrode to give rise to an axial strain. A suitable method can be provided wherein the voltage is applied by establishing and maintaining an electrical charge difference between the inner and outer electrodes. A suitable method can be provided wherein the voltage changes the stiffness of the electroactive polymer actuator.

Prosthetic devices are also within the scope of the invention, which comprise an artificial limb comprising one or more joints, two or more jointed limb segments, and one or more electroactive polymer fiber transducers comprising two or more ends mechanically coupled to the jointed limb segments, the one or more electroactive polymer fiber transducers comprising at least one electroactive polymer fiber, comprising an incompressibly compliant inner electrode, an electroactive polymer disposed exterior to the incompressibly compliant inner electrode, and an outer compliant electrode disposed exterior to the electroactive polymer, wherein the incompressibly compliant inner electrode is fluidically sealed within the electroactive polymer fiber, and a voltage source, a charge source, or both, connected to the incompressibly compliant inner electrode and the outer compliant electrode, whereby application of a voltage to the electroactive polymer fiber transducer gives rise to motion or tensioning of the prosthetic device. The prosthetic device can be provided, wherein the voltage is applied by establishing and maintaining an electrical charge difference between the inner and outer electrodes. The prosthetic device can be provided wherein application of the voltage is controlled by an onboard controller. The prosthetic device can be provided wherein the controller is capable of using the electroactive polymer fibers as sensors, wherein the sensing capabilities permit closed-loop operation. The prosthetic device can be provided wherein the controller is in unidirectional or bidirectional communication with the wearer of the device though a human-machine interface. Suitable human-machine interfaces include an electromiographic electrode, neurophysiologic recording electrode, mechanical switch button or knob, joystick, sound activated methods, LEDs, neurostimulation, vibration. The prosthetic device can be provided wherein the controller is capable of using additional sensors, wherein the sensing capabilities permit control of the prosthesis.

Methods of actuating an electroactive polymer fiber transducer are also provided. The methods comprise providing an electroactive polymer fiber transducer comprising at least one electroactive polymer fiber, comprising an incompressibly compliant inner electrode, an electroactive polymer disposed exterior to the incompressibly compliant inner electrode, and an outer compliant electrode disposed exterior to the electroactive polymer, wherein the incompressibly compliant inner electrode is fluidically sealed within the electroactive polymer fiber, and a voltage source, a charge source, or both connected to the incompressibly compliant inner electrode and the outer compliant electrode, and axially elongating the electroactive polymer fiber transducer to give rise to an electric current between the incompressibly compliant inner electrode and the outer compliant electrode.

Also within the scope of the invention are electroactive fibers, comprising an incompressibly compliant inner electrode, an electroactive elastically compliant material disposed exterior to the incompressibly compliant inner electrode, and an outer compliant electrode disposed exterior to the electroactive compliant material, wherein the incompressibly compliant inner electrode is fluidically sealed within the electroactive fiber. The electroactive fiber can be an electroactive compliant material comprises an electroactive polymer, a nonpolymeric incompressibly compliant material, or any combination thereof. The electroactive fiber can be provided wherein the nonpolymeric incompressibly compliant material comprises particles dispersed in a liquid matrix. A transducer comprising the electroactive fiber is also within the scope of the invention.

Systems for controlling an electroactive transducer are also provided. Such systems comprise a driver circuit comprising an input signal and an output voltage, the driver circuit comprising a DC to DC converter capable of raising a voltage level received from the input signal source to the output voltage, the output voltage being capable of actuating the electroactive transducer. The system can be a output voltage is a constant high voltage source serially connected a high-voltage switching component and a high voltage resistor. The system can be provided, comprising two or more serially connected high-voltage switching components capable of selectively controlling the conductivity between two or more nodes capable of establishing a voltage across the electroactive actuator. The system can be provided wherein the high-voltage switching component allows the electroactive polymer transducer to remain in a charged state without consuming electrical power. The system can be provided wherein the high-voltage switching components are controlled in closed loop to compensate for charge leakage.

Suitable systems of the present invention for controlling an electroactive transducer can further include a sensing circuit, the sensing circuit capable of sensing voltage across the electroactive actuator, a current through an electrode of the electroactive transducer, or both, the system capable of controlling the output voltage to the electroactive actuator while measuring the resistance within the electrode. The system can further include a sensing circuit, a closed loop, and a controller, wherein the sensing circuit is capable of detecting control signals and generating the output voltage in the closed loop through the controller. A high level robotic controller capable of processing and integrating visual, auditory somatosensory inputs, comprising the system is also within the scope of the invention. A prosthetic interface comprising the system is also within the scope of the invention. The system can comprise a charge removed from the electroactive polymer transducer, which may be directed to a primary source or battery for recharging.

Systems of the present invention for controlling an electroactive transducer can be provided wherein a single DC-DC converter drives a plurality of electroactive polymer transducers, wherein each transducer is independently controlled by the high voltage switching components. The system can be provided wherein the high-voltage switching components allow application of arbitrary and fast-changing voltage waveforms to the electroactive polymer transducers.

Jointed transducers are also within the scope of the present invention, which comprise two links united by a joint and transduced by one or more electroactive fiber transducers. The jointed transducer can be provided wherein at least one of the electroactive fiber transducers comprises an incompressibly compliant inner electrode, an electroactive elastically compliant material disposed exterior to the incompressibly compliant inner electrode, and an outer compliant electrode disposed exterior to the electroactive compliant material, wherein the incompressibly compliant inner electrode is fluidically sealed within the electroactive fiber. The jointed transducer can be provided wherein at least one of the electroactive fiber transducers is capable of serving both as an actuator and as a sensor of the position of the joint. The jointed transducer can be a joint comprises a revolute joint, a ball joint, a hinge joint, a prismatic joint, a crankshaft, a spherical joint, a planar joint, a spatial joint, or any combination thereof. The jointed transducer can be a two links are capable of slidable rotation, or slidable translation, or both, at the joint. The jointed transducer can be a two links are fixed at the joint by a compliant material. The jointed transducer can be provided wherein at least one of the links is mechanically flexible, wherein transduction occurs by flexure.

Mechanical arms, legs, fingers, hands, foots, spines, jaws, eyes, ears, pinnas, necks, shoulders, hips, wings, beaks, tails, fins, flippers, trunks, tongues, torsos, proboscises, or antennae, comprising a plurality of jointed transducers are also within the scope of the invention. A suitable prosthetic limb can be provided wherein at least one of the electroactive fiber transducers is backdriven to generate electrical energy. The prosthetic limb can be provided wherein the electrical energy is capable of recharging a power source used to actuate the jointed transducer. The prosthetic device can be provided wherein the device provides the wearer assisted mobility. The prosthetic device can be provided wherein the a device is one or a combination of a foot, ankle, knee or hip. The prosthetic device can be provided wherein the a device is one or a combination of a finger, hand, wrist, elbow or shoulder. The prosthetic device can be provided wherein the a device is a jaw. The prosthetic device can be provided wherein the a device is a head.

Orthotic devices comprising the jointed transducer is also within the scope of the invention. A suitable orthotic device can be provided, wherein at least one of the electroactive fiber transducers is backdriven to generate electrical energy. A suitable orthotic device can be provided wherein the electrical energy is capable of recharging a power source used to actuate the jointed transducer. A suitable orthotic device can be provided wherein the device provides the wearer with assisted mobility. A suitable orthotic device can be provided wherein assistance is provided around one or a combination of an ankle, knee, hip, finger, wrist, elbow, shoulder, neck, jaw, spine.

Wearable exoskeleton devices comprising one or more jointed transducers are also within the scope of the invention. The exoskeleton device can be provided wherein at least one of the electroactive fiber transducers is backdriven to generate electrical energy. The exoskeleton device can be provided wherein the electrical energy is capable of recharging a power source used to actuate the jointed transducer. The exoskeleton device can be provided wherein the device provides the wearer with assisted mobility.

Transducers of the present invention can also be provided wherein activation of the electroactive polymer transducer changes the stiffness of the joint.

What is claimed:

1. An electroactive polymer fiber, comprising:
an incompressibly compliant inner electrode;
an electroactive polymer disposed exterior to said incompressibly compliant inner electrode; and
an outer compliant electrode disposed exterior to said electroactive polymer, wherein said incompressibly compliant inner electrode is fluidically sealed within said electroactive polymer fiber.

2. The electroactive polymer fiber of claim 1, wherein said incompressibly compliant inner electrode is fluidically sealed within said electroactive polymer fiber, wherein the volume of the incompressibly compliant inner electrode remains essentially constant upon application of an electric potential between the inner and outer electrodes.

3. The electroactive polymer fiber of claim 1, wherein said incompressibly compliant inner electrode is fluidically sealed within said electroactive polymer fiber, wherein the volume of the incompressibly compliant inner electrode remains essentially constant upon axial lengthening or stretching of said fiber.

4. The electroactive polymer fiber of claim 1, wherein said electroactive polymer fiber axially lengthens upon application of an electric potential between the inner and outer electrodes.

5. The electroactive polymer fiber of claim 4, wherein said inner and outer compliant electrodes generate essentially no elastic force on said electroactive polymer.

6. The electroactive polymer fiber of claim 4, wherein said inner and outer compliant electrodes generate essentially no viscous/dampening force on said electroactive polymer.

7. The electroactive polymer fiber of claim 1, further comprising a fluidically sealed fluid-filled region within the inner electrode.

8. The electroactive polymer fiber of claim 7, wherein said fluidically sealed fluid-filled region is capable of maintaining a pressure greater than ambient pressure external to the electroactive polymer fiber.

9. The electroactive polymer fiber of claim 7, further comprising at least one fiber end cap fluidically sealed to a distal end of said electroactive polymer fiber, said fiber end cap capable of transporting fluid into said fluidically sealed fluid-filled region.

10. The electroactive polymer fiber of claim 1, wherein said incompressibly compliant inner electrode comprises electrically conductive particles dispersed in a matrix.

11. The electroactive polymer fiber of claim 1, wherein said incompressibly compliant inner electrode is characterized as having an electrical conductivity greater than the electrical conductivity of the electroactive polymer.

12. The electroactive polymer fiber of claim 1, wherein said compliant outer electrode comprises electrically conductive particles dispersed in a matrix.

13. The electroactive polymer fiber of claim 1, wherein said electroactive polymer comprises a dielectric elastomer, a ferroelectric polymer, an electrostrictive graft elastomer, a piezoelectric polymer, a conductive polymer or any combination thereof.

14. The electroactive polymer fiber of claim 13, wherein said dielectric elastomer comprises a block copolymer.

15. The electroactive polymer fiber of claim 13, wherein said dielectric elastomer is a thermoplastic.

16. The electroactive polymer fiber of claim 1, further comprising an outer electrical lead in electrical communication with the outer electrode and a sensing electronic circuit, a voltage source or sink, a charge source or sink, or any combination thereof.

17. A transducer comprising the electroactive polymer fiber of claim 1.

18. A transducer comprising the electroactive polymer fiber of claim 17, wherein said transducer is capable of being used as an actuator.

19. A bundle of one or more electroactive polymer fibers of claim 1.

20. An electric generator comprising one or more electroactive polymer fibers of claim 1.

* * * * *